United States Patent [19]

Schippers

[11] 4,152,582
[45] May 1, 1979

[54] COMPACTION/EXPANSION LOGIC

[75] Inventor: Steven J. Schippers, Bellevue, Nebr.

[73] Assignee: Sperry Rand Corporation, New York, N.Y.

[21] Appl. No.: 814,802

[22] Filed: Jul. 11, 1977

Related U.S. Application Data

[62] Division of Ser. No. 469,265, May 13, 1974, Pat. No. 4,038,652.

[51] Int. Cl.² ............................................. H03K 13/00
[52] U.S. Cl. ................................... 235/310; 178/26 A
[58] Field of Search ........... 235/310; 178/26 R, 26 A; 340/347 DD; 364/200

[56] References Cited

U.S. PATENT DOCUMENTS

| | | | |
|---|---|---|---|
| 3,008,127 | 11/1961 | Bloch | 340/347 DD |
| 3,016,527 | 1/1962 | Gilbert | 340/347 DD |
| 3,271,517 | 9/1966 | De Rosa | 178/26 R |

Primary Examiner—Charles D. Miller
Attorney, Agent, or Firm—Kenneth T. Grace; William E. Cleaver; Marshall M. Truex

[57] ABSTRACT

A system of encoding a fixed-level character format for transmission in a format of variable or multi-level character lengths is disclosed. A fixed-level character format, e.g., an 8-bit character length of high to low ordered bits $2^7-2^0$, received by a transmitting communications line terminal from an associated processor at a transmitting site is examined, a "Short" bit $2^S$ is generated, and depending upon the number of higher order bits that are 0 bits and whether the remaining bits are an odd or an even number of 1 bits, a new variable or multi-level character is generated and transmitted on the communications line along with the associated "Short" bit. The reverse procedure is utilized at the receiving communications line terminal to regenerate the fixed-level character format utilized by the associated processor at the receiving site. Through a statistical analysis of the frequency of transmission of individual characters of the fixed-level character format that is used by the processors the most frequently used characters are transmitted in a shortened form such that total message block transmission time is substantially reduced.

4 Claims, 51 Drawing Figures

PRIOR ART

Fig. 3

| MSB | | | | | | | LSB |
|---|---|---|---|---|---|---|---|
| $2^7$ | $2^6$ | $2^5$ | $2^4$ | $2^3$ | $2^2$ | $2^1$ | $2^0$ |
| 7 | 6 | 5 | 4 | 3 | 2 | 1 | 0 |

8-BIT BYTE
8 DATA BITS 7-0

FIXED-LEVEL

Fig. 4a

| MSB | | | | | LSB |
|---|---|---|---|---|---|
| $2^4$ | $2^3$ | $2^2$ | $2^1$ | $2^0$ | $2^S$ |
| 4 | 3 | 2 | 1 | 0 | S |

6-BIT BYTE
5 DATA BITS 4-0
1 SHORT BIT S

Fig. 4b

| MSB | | | | | | LSB |
|---|---|---|---|---|---|---|
| $2^5$ | $2^4$ | $2^3$ | $2^2$ | $2^1$ | $2^0$ | $2^S$ |
| 5 | 4 | 3 | 2 | 1 | 0 | S |

7-BIT BYTE
6 DATA BITS 5-0
1 SHORT BIT S

Fig. 4c

| MSB | | | | | | | | LSB |
|---|---|---|---|---|---|---|---|---|
| $2^7$ | $2^6$ | $2^5$ | $2^4$ | $2^3$ | $2^2$ | $2^1$ | $2^0$ | $2^S$ |
| 7 | 6 | 5 | 4 | 3 | 2 | 1 | 0 | S |

9-BIT BYTE
8 DATA BITS 7-0
1 SHORT BIT S

MULTI-LEVEL

EFW WORD

| 3 OUT OF 7 CODE | EXTERNAL FUNCTION | | |
|---|---|---|---|
| $2^9$ --- CT IDENTIFIER --- $2^3$ | $2^2$ | $2^1$ | $2^0$ |

EXTERNAL FUNCTION WORD FORMAT

1 = SEND DATA ($1_8$)
1 = REMOTE RELEASE ($2_8$)
1 = LOOK FOR SYNC ($4_8$)

Fig. 7

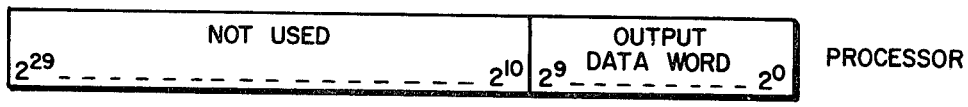
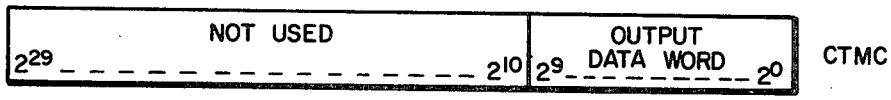
Fig. 5a    PROCESSOR OUTPUT DATA WORD
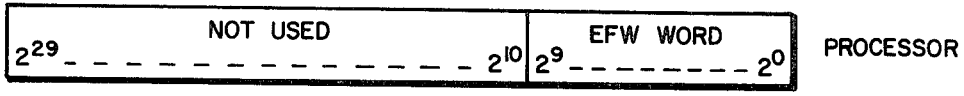
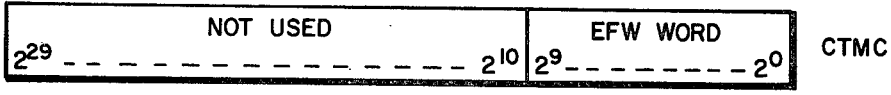
Fig. 5b    PROCESSOR EXTERNAL FUNCTION WORD
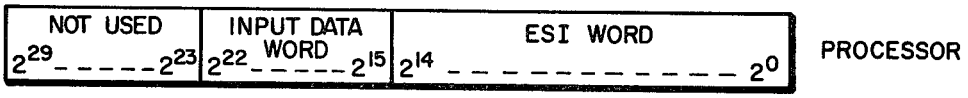
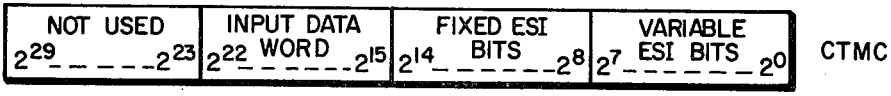
Fig. 5c    PROCESSOR INPUT DATA WORD
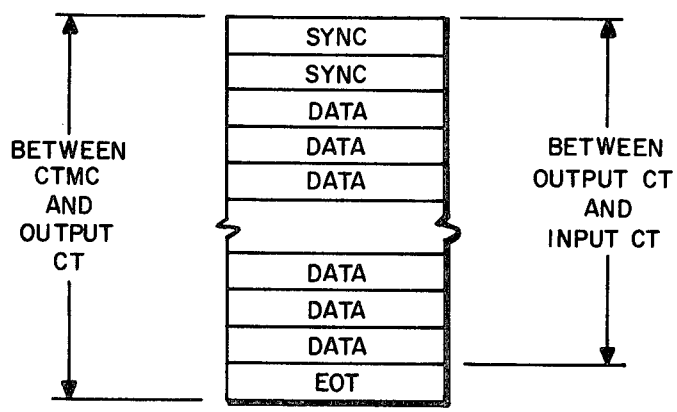
Fig. 6

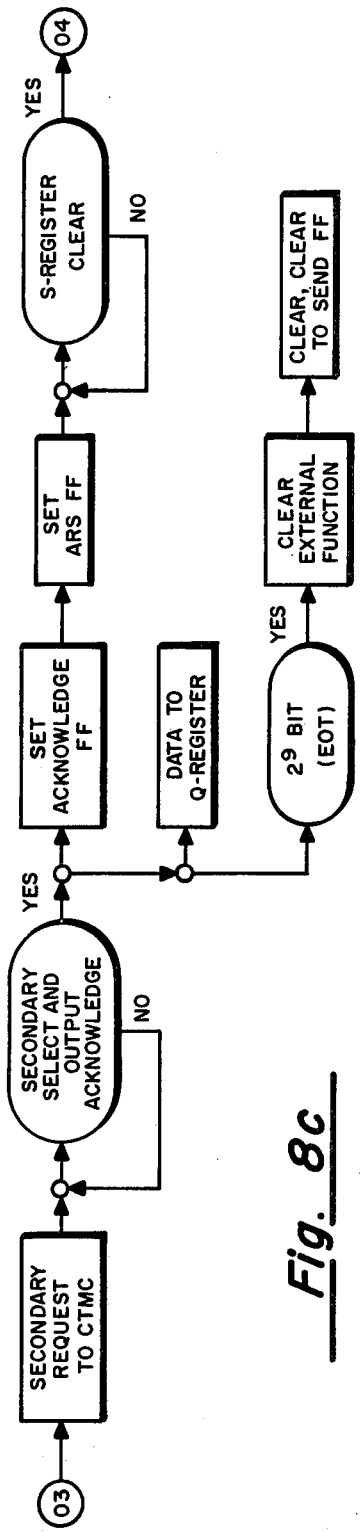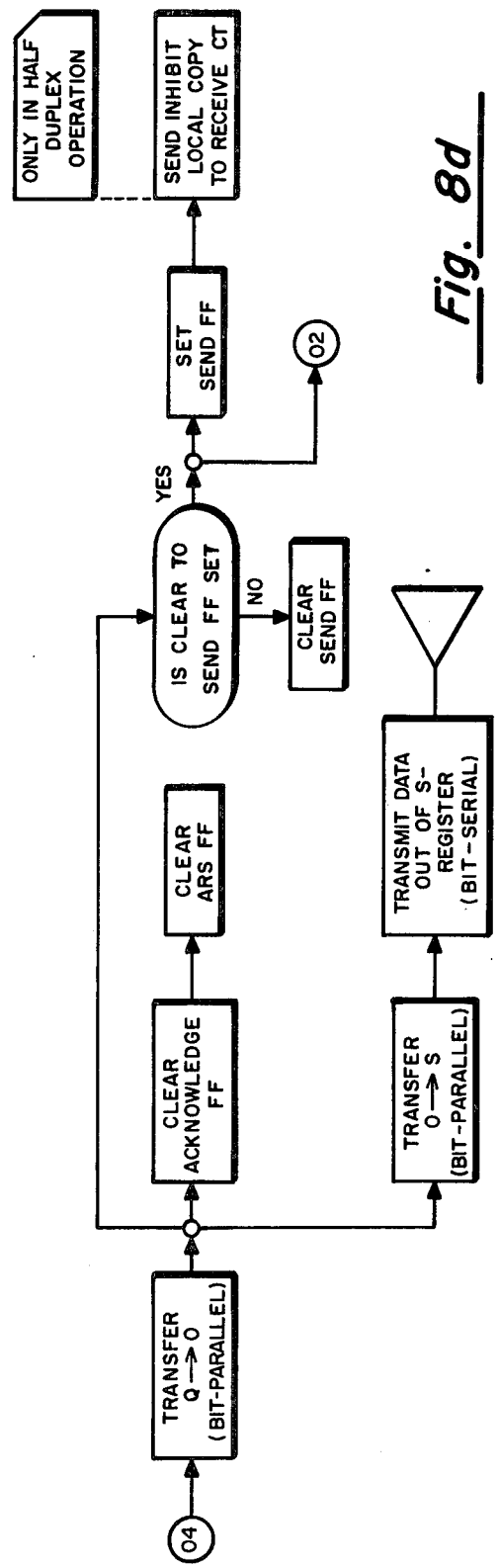
Fig. 8c
Fig. 8d

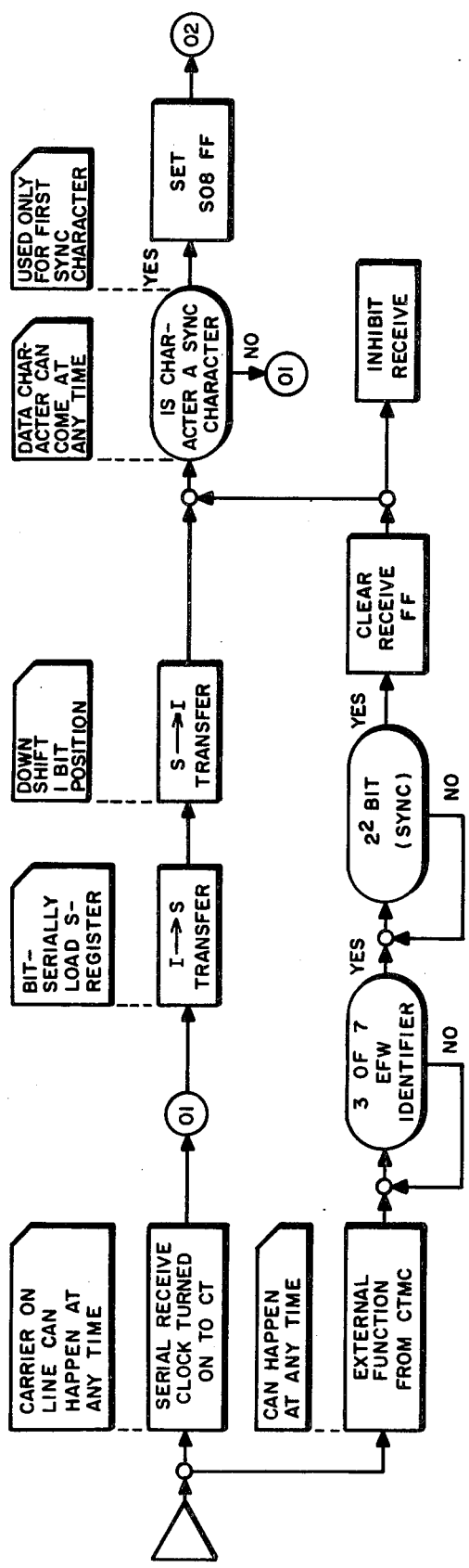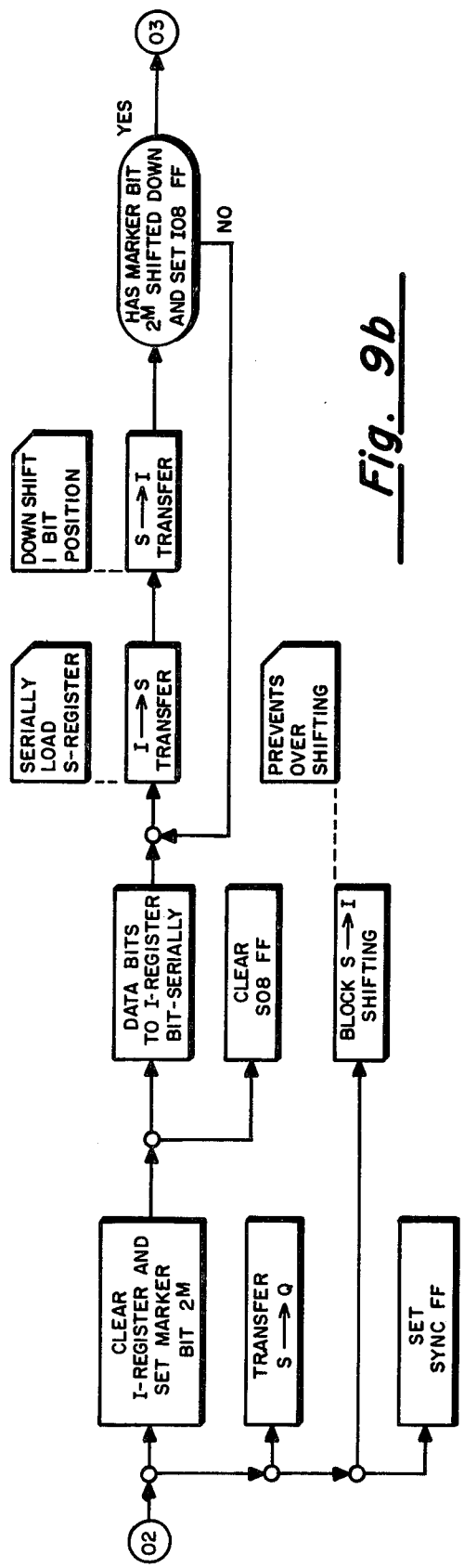
Fig. 9a
Fig. 9b

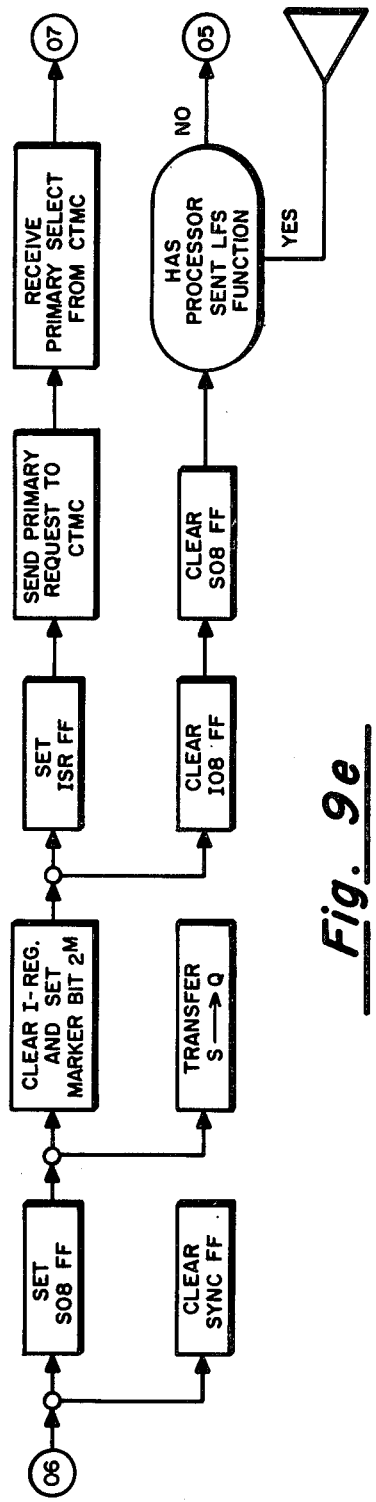
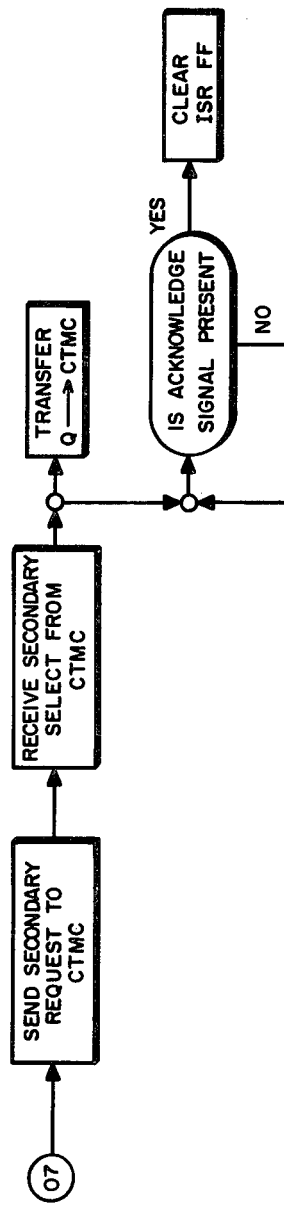
Fig. 9e
Fig. 9f

PRIOR ART

Fig. 15

| | MSB | | | | | | | LSB |
|---|---|---|---|---|---|---|---|---|
| $2^M$ | $2^7$ | $2^6$ | $2^5$ | $2^4$ | $2^3$ | $2^2$ | $2^1$ | $2^0$ |
| M | 7 | 6 | 5 | 4 | 3 | 2 | 1 | 0 |

M = MARKER BIT
7-0 = DATA BITS

FIXED LEVEL

Fig. 16a

| | MSB | | | | | LSB | |
|---|---|---|---|---|---|---|---|
| $2^M$ | $2^4$ | $2^3$ | $2^2$ | $2^1$ | $2^0$ | $2^S$ | |
| M | 4 | 3 | 2 | 1 | 0 | S | |

M = MARKER BIT
S = SHORT BIT
4-0 = DATA BITS

Fig. 16b

| | MSB | | | | | | LSB |
|---|---|---|---|---|---|---|---|
| $2^M$ | $2^5$ | $2^4$ | $2^3$ | $2^2$ | $2^1$ | $2^0$ | $2^S$ |
| M | 5 | 4 | 3 | 2 | 1 | 0 | S |

M = MARKER BIT
S = SHORT BIT
5-0 = DATA BITS

Fig. 16c

| | MSB | | | | | | | | LSB |
|---|---|---|---|---|---|---|---|---|---|
| $2^M$ | $2^7$ | $2^6$ | $2^5$ | $2^4$ | $2^3$ | $2^2$ | $2^1$ | $2^0$ | $2^S$ |
| M | 7 | 6 | 5 | 4 | 3 | 2 | 1 | 0 | S |

M = MARKER BIT
S = SHORT BIT
7-0 = DATA BITS

MULTI-LEVEL

| Fig. 10a | Fig. 10b | Fig. 10c |
|---|---|---|

Fig. 10

| Fig. 12a | Fig. 12b |
|---|---|

Fig. 12

| Fig. 17a | Fig. 17b | Fig. 17c | Fig. 17d |
|---|---|---|---|

Fig. 17

| Fig. 19a | Fig. 19b |
|---|---|

COMPACTION/EXPANSION LOGIC

This is a division of application Ser. No. 469,265 filed May, 13, 1974 now U.S. Pat. No. 4,038,652.

BACKGROUND OF THE INVENTION

In any system of digital data communications between data processing sites a few words or characters make up the majority of the transmitted message. Using a remote processor display panel as an example, alphabetic and numeric characters are most often displayed. The alphabet and numbers 0–9 represent only 36 of the possible 128 total bit pattern combinations or character format in a seven-level system. The remaining bit pattern combinations make up control characters and various punctuation characters.

Communications line terminals typically operate in a fixed-level; that is, the transmitted characters are all composed of a fixed number of bits: in describing a word or character the term "level" is synonymous with the term "bit". For example, an eight-level communications line terminal is one in which the character length will always be 8 bits. Accordingly, irrespective of frequency of use all characters are of a fixed-level format requiring greater than necessary message block transmission times. The present invention utilizes a variable character format that is modified for each application such that the most frequently used characters are transmitted in a shortened character format for minimizing total message block transmission time.

SUMMARY OF THE INVENTION

In the present invention, a fixed-level character format as utilized by the processors at the remote and central sites of a data processing system is converted to a multi-level character format at the transmitting site for transmission over the transmission line to the receiving site where it is reconverted back to the fixed-level character format. Three levels are utilized in the illustrated preferred embodiment of the conversion of the prior art fixed 8-bit or eight-level character format; the original or full character length of 8 bits and two short character lengths of 6 bits and 5 bits; plus an additional "Short" bit $2^S$ that precedes the multi-level characters. The lengths of the multi-level characters that are to be transmitted are determined by examining the fixed-level character, of most significant bit (MSB) $2^7$ through the least significant bit (LSB) $2^0$ as received from the transmitting processor. If the output data lower order bits $2^4$–$2^0$ contain an odd number of 1 bits and the output data upper order bits $2^7$, $2^6$ and $2^5$ are 0 bits, then only the output data lower order bits $2^4$–$2^0$ are transmitted (5-bit character) and the Short bit $2^S$ is transmitted as a 0 bit. If the output data lower order bits $2^4$–$2^0$ contain an even number of 1 bits and the output data upper order bits $2^7$ and $2^6$ are 0 bits then only the output data lower order bits $2^5$–$2^0$ are transmitted (6-bit character) and the Short bit $2^S$ is transmitted as a 0 bit. For all other bit configurations, all bits $2^7$–$2^0$ are transmitted (8-bit character) and the Short bit $2^S$ is transmitted as a 1 bit. Input data received from the transmitting site at the receiving site is examined and is reconstructed back to the eight-level character format. If the Short bit $2^S$ is a 0 bit and the input data lower order bits $2^4$–$2^0$ contain an odd number of 1 bits, the input data upper order bits $2^7$, $2^6$ and $2^5$ are set to a 0 bit and the reconstructed 8-bit character is transferred to the receiving processor; the Short bit $2^S$ is stripped off prior to transferring the reconstructed 8-bit character to the computer. If the Short bit $2^S$ is a 0 bit and the input data lower order bits $2^4$–$2^0$ contain an even number of 1 bits, the input data upper order bits $2^7$ and $2^6$ are set to 0 bits and the 8-bit character is transmitted to the receiving computer. If the Short bit $2^S$ is a 1 bit all 8 input data bits $2^7$–$2^0$ are transmitted to the receiving processor.

BRIEF DESCRIPTION OF THE DRAWINGS

FIG. 2 is a block diagram of the prior-art Communications Terminal Module of FIG. 1 in which the present invention is incorporated; while

FIG. 3 is an illustration of the prior-art fixed-level DATA Character format utilized to transmit DATA Characters over the Communications Line System of FIG. 1.

FIGS. 4a, 4b, 4c are illustrations of the novel multi-level DATA Character format of the present invention that replaces the prior-art fixed-level DATA Character format of FIG. 3.

FIGS. 5a, 5b, 5c are illustrations of the word formats utilized to transmit information between the Processors and the Communications Terminal Module Controllers of FIG. 1.

FIG. 6 is an illustration of the prior-art message block format utilized to transmit information in the system of FIG. 1.

FIG. 7 is an illustration of the prior-art coding employed by the External Function Word format of FIG. 5b.

FIGS. 8a, 8b, 8c, 8d are detailed flow-charts of the output sequence employed by the output Communications Terminal of FIG. 2.

FIGS. 9a, 9b, 9c, 9d, 9e, 9f are detailed flow-charts of the input sequence employed by the input Communications Terminal of FIG. 2.

FIG. 15 is an illustration of the prior-art fixed-level DATA Character byte format utilized by the prior-art O-Register of the system of FIG. 1.

FIGS. 16a, 16b, 16c are illustrations of the novel multi-level DATA Character byte format utilized by the novel O-Register of the present invention.

FIGS. 21a, 21b, 21c are illustrations of the DATA Character byte format for a particular group of DATA Characters received from the output Communications Terminal per FIGS. 14a, 14b, 14c and staticized by the novel input Communications Terminal of the present invention.

DESCRIPTION OF THE PREFERRED EMBODIMENT

Figure 1:
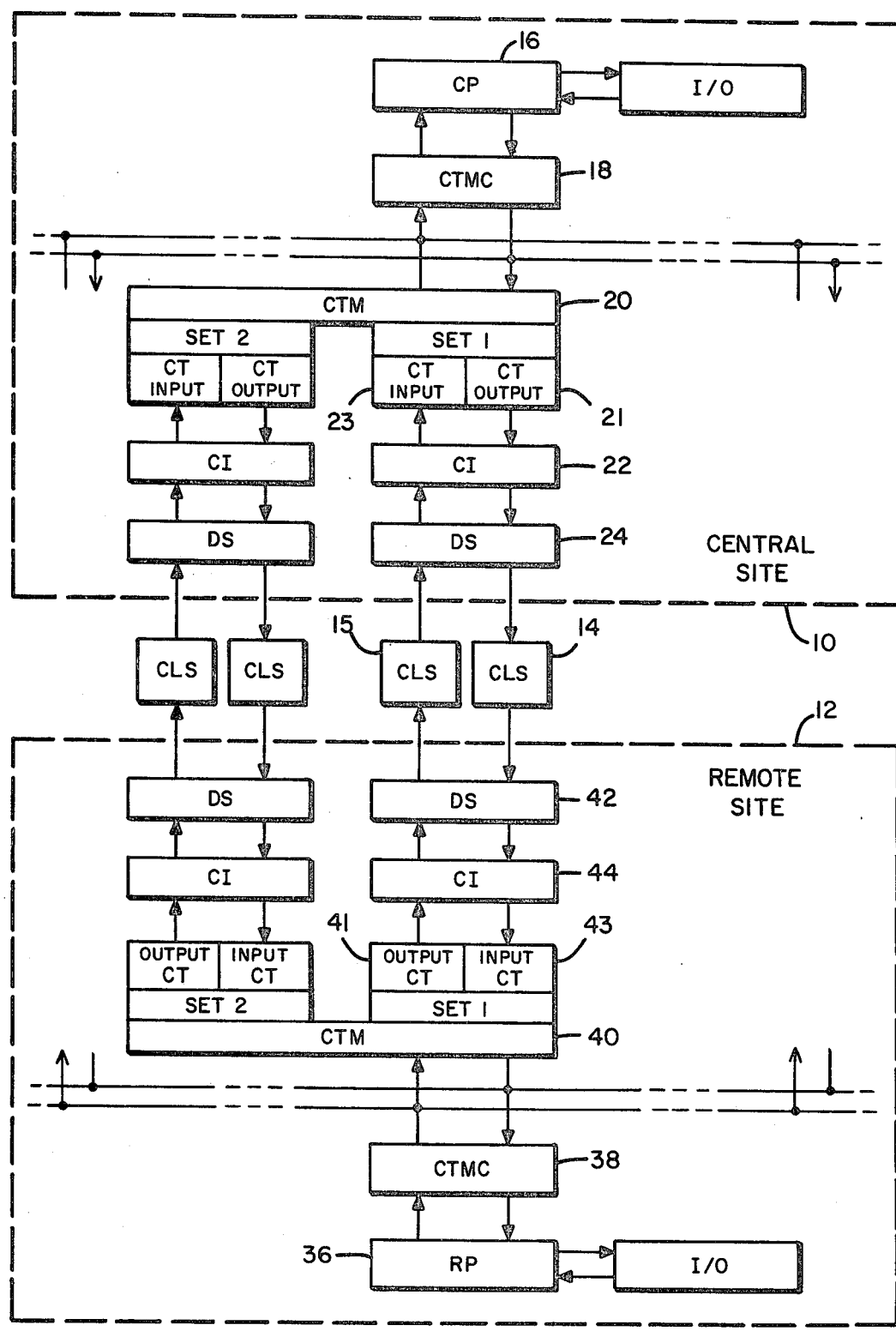
FIG. 1 is a block diagram of a prior-art data processing system into which the present invention is incorporated.

With particular reference to FIG. 1 there is presented a block diagram of a data processing system whereby a Remote Processor (RP), at a Remote Site, communicates with a Central Processor (CP), at a Central Site, over a respectively associated communications link comprised of any one of a variety of transmission line types. This data processing system may be similar to that of the D. G. Streif U.S. Pat. No. 3,528,060. Such data processing system may be considered to be, in the preferred embodiment, a two-duplex synchronous real-time communications link transmitting data between Central Site 10 and Remote Site 12 at a synchronous data rate of up to 50,000 bits per second (simplex) over Communications Line System (CLS) 14.

Information, in the illustrated embodiment is transmitted in a multi-bit character format: character serial, character bit-parallel between Central Processor (CP) 16, Communications Terminal Module Controller (CTMC) 18 and Communications Terminal Module (CTM) 20 and between Remote Processor (RP) 36, Communications Terminal Module Controller (CTMC) 38 and Communications Terminal Module (CTM) 40; while it is transmitted character serial, character bit-serial between Communications Terminal Module (CTM) 20 and Communications Terminal Module (CTM) 40. The data processing system of FIG. 1 is of a well-known prior-art configuration and is an existing system into which the present invention is incorporated. Up to 16 CTM's, each CTM including a Set 1 of one output CT and one input CT and a Set 2 of one output CT and one input CT, are multiplexed by the one CTMC allowing transmission over up to 64 Communications Line Systems (CLS). The present invention relates to the operation of the circuitry of the Communications Terminal Module 20 and the associated output Communications Terminal (CT) 21 and input Communications Terminal (CT) 23 and, in a like manner, Communications Terminal Module 40 and its associated output Communications Terminal (CT) 41 and input Communications Terminal (CT) 43. Accordingly, discussion hereinafter shall be primarily directed to the operation of Central Site 10 with particular reference to Communications Terminal Module 20 and its associated output Communications Terminal 21 and to the operation of Remote Site 12 with particular reference to Communications Terminal Module 40 and its associated input Communications Terminal 43: it is to be understood that Communications Terminal Modules 20 and 40 are like devices performing like functions within the data processing system of FIG. 1.

Communications Terminal Module Controller 18 is a two-duplex communications line terminal which provides a real-time communications link between Central Processor (CP) 16 and Communications Line Systems (CLS) 14, 15 by way of Communications Terminal Module (CTM) 20, Communications Interface (CI) 22 and Date Set (DS) 24 whereby information is transmitted to Remote Processor (RP) 36 over leased Communications Line System (CLS) 14. Data Set 24 is a standard item of a Bell Telephone Company Data Communications System and, consequently no detail discussion of the operation of Data Set 24 shall be given herein. For purposes of the present invention it is sufficient to state that Data Set 24 emits a frequency modulated Mark/Space signal on Communications Line System 14 as a function of a binary digital input.

As discussed in the above reference Streif patent, transmission of information over Communications Line System 14 is, in the prior art, in a fixed-level; that is, the transmitted characters are all composed of a fixed number of bits. For example, in the Streif patent information is transmitted in a fixed-level, i.e., eight-level, character format of 8 data bits $2^7$–$2^0$. In the data processing system of the present invention, a fixed-level character format of 8 data bits $2^7$–$2^0$ as utilized by Central Processor 16 and Remote Processor 36 is converted to a multi-level character format in Communications Terminal Module 20 for transmission over Communications Line System 14 and is reconstructed into the fixed-level character format in Communications Terminal Module 40 for use by Remote Processor 36. As the present invention resides in the Communications Terminal Modules 20 and 40, both such communications terminal modules being substantially identical, detail discussion hereinafter shall be limited to such components of the data processing system of FIG. 1 it being admitted that all other components thereof are well-known in the art.

Figure 2:
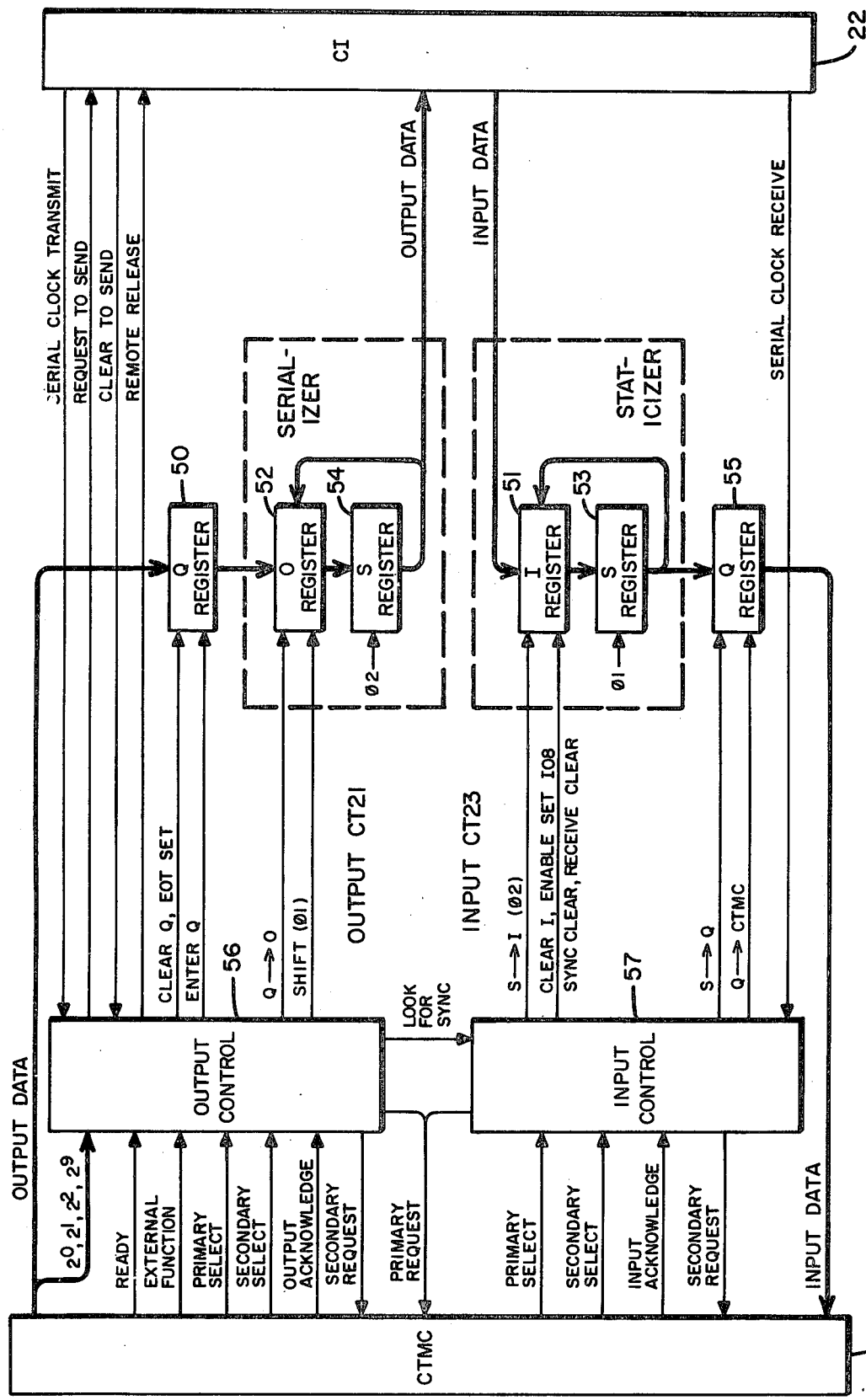
Figure 2A:
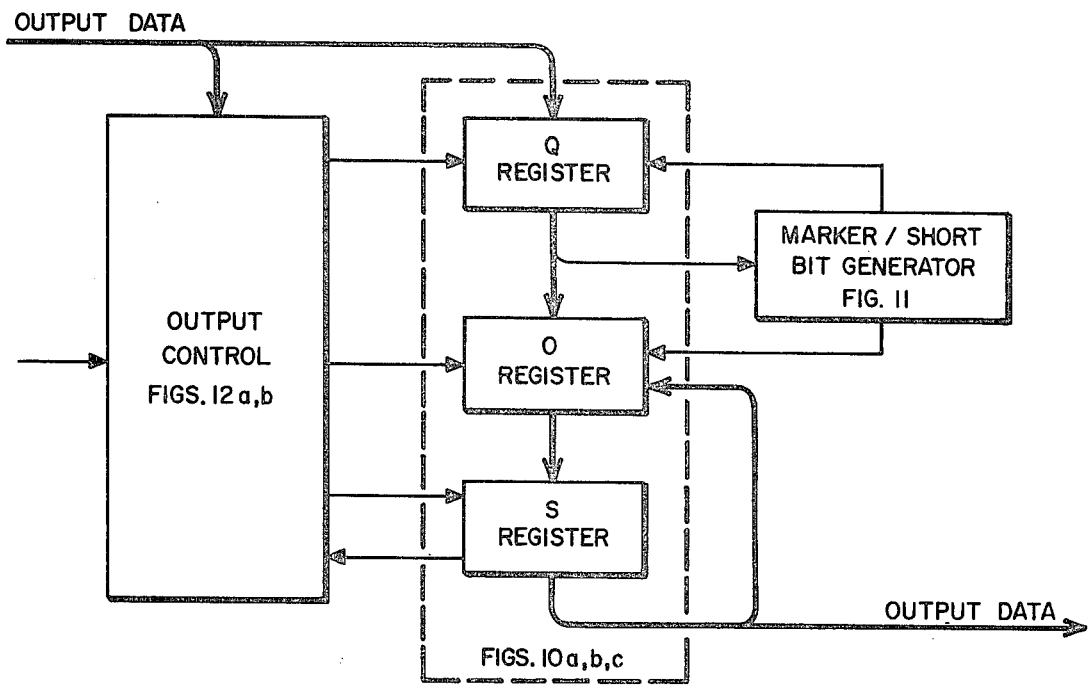
FIGS. 2a and 2b are block diagrams illustrating the modifications to the output and input Communications Terminals, respectively, of FIG. 2 as provided by the present invention.
Figure 2B:
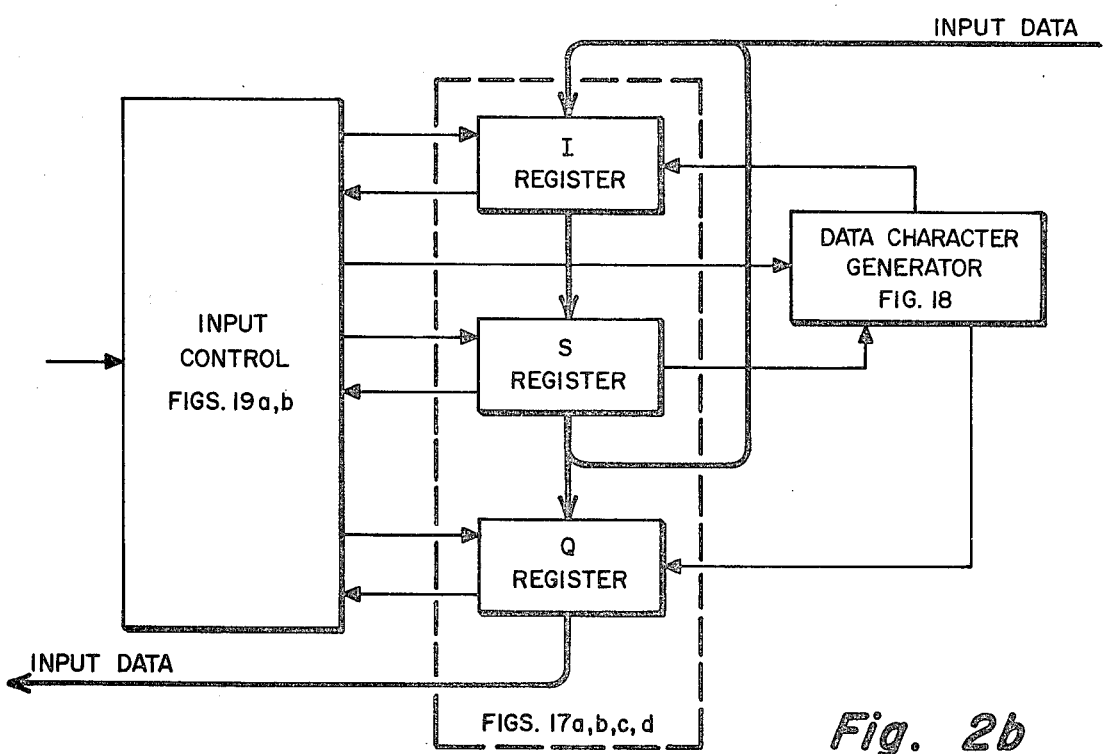
Figure 8A:
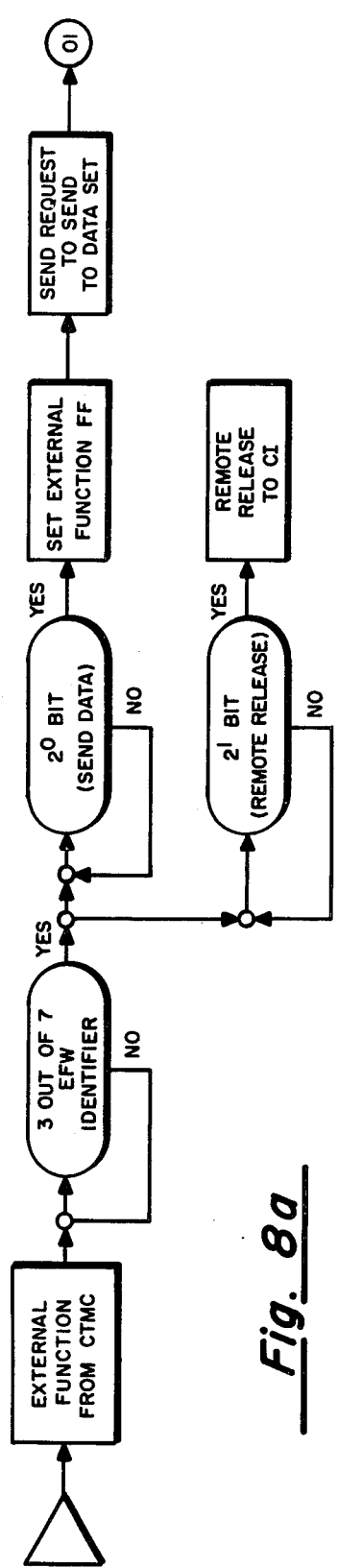
Figure 8B:
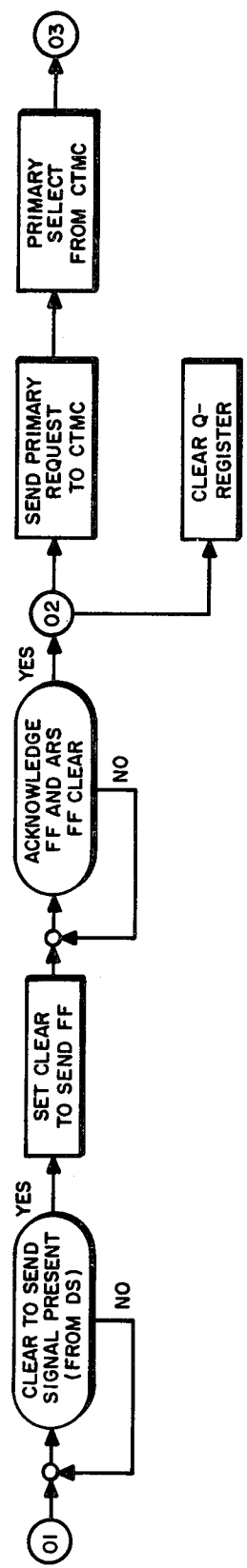
Figure 9C:
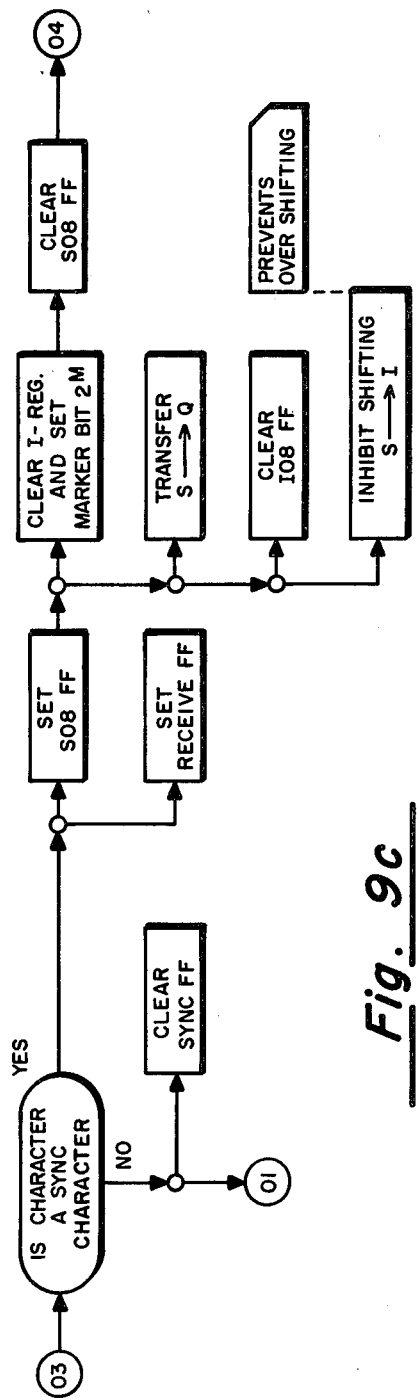
Figure 9D:
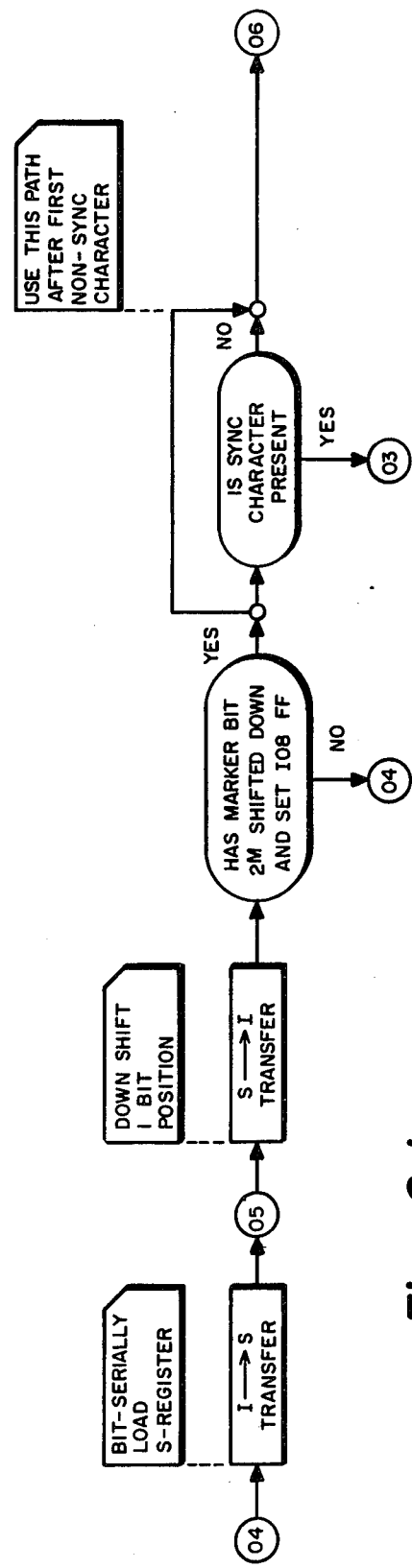

With particular reference to FIG. 2 there is illustrated a block diagram of a prior art data processing system while FIGS. 2a and 2b are block diagrams illustrating the modifications to the output and input Communications Terminals 21 and 23, respectively, thereof as provided by the present invention. FIG. 2 illustrates only the pertinent portions of Communications Terminal Module 20 including output Communications Terminal 21, functionally described as a serializer, and input Communications Terminal 23, functionally described as a staticizer. In the prior-art operation of CT 21, CT 21 receives the output data from CTMC 18 and Central Processor 16 in a fixed-level character format illustrated in FIG. 3. The DATA Character (DATA) of FIG. 3 is illustrated as being a fixed 8-bit or eight-level character format of an 8-bit byte of data bits $2^7$–$2^0$. Note: because prior-art bits of the character format utilized by the pesent invention other than data bits, e.g., control bits, parity bits, play no part in the present invention such prior-art bits shall not always be included in the subsequent discussion of the present invention, such discussion generally including only the "Short" bit of the present invention and the prior-art "Marker" bit. This 8-bit character is received from the transmitting Central Processor 16 in a character serial, character bit-parallel manner. The output data bits $2^7$–$2^0$ are entered bit-parallel into Q-Register 50, and are then transferred bit-parallel into O-Register 52. The 8-bit character is then shifted down one bit position from O-Register 52 to S-Register 54 on successive two clock phase $\phi1$ and $\phi2$ cycles to be emitted from S-Register 54 in a character serial, character bit-serial manner to be coupled to transmitting Communications Interface 22. This output sequence is under control of Output Control 56.

In the prior-art operation of CT 23, CT 23 performs the reverse function of CT 21, receiving the 8-bit character of input data bits $2^7$–$2^0$ in a character serial, character bit-serial manner at I-Register 51 from the receiving Communications Interface 22. Data bit $2^0$ (the initial bit of the 8-bit character) is coupled to the highest ordered stage of I-Register 51 at a two clock phase $\phi 2$ cycle and is then transferred into S-Register 53 at the next subsequent phase $\phi 1$ cycle and then re-entered into I-Register 51 at the next $\phi 2$ cycle at the next lower ordered stage thereof while concurrently the next subsequent data bit $2^1$ is entered into the highest ordered stage of I-Register 51. This procedure is followed until the 8-bit character of input data bits $2^7$–$2^0$ has been entered into S-Register 53 at which time input data bits $2^7$–$2^0$ are transferred bit-parallel into Q-Register 55 from which the 8-bit character of input data bits $2^7$–$2^0$ is then coupled to CTMC 18 in a character serial, character bit-parallel manner. This input sequence is under control of Input Control 57.

In the present invention, the prior-art operation of CTM 20 (40) of FIG. 2 is modified, see FIGS. 1a and 2b, by having additional circuitry incorporated within output CT 21 (41) and input CT 23 (43) whereby the output CT 21 (41) converts the fixed-level character format as utilized by the transmitting processor at the transmitting site to a multi-level character format for transmission over the communications line system to the receiving site where the multi-level character format is then recoverted back to the fixed-level character format by the input CT 43 (23) for utilization by the receiving processor at the receiving site.

With particular reference to FIGS. 4a, 4b, 4c there are presented the three levels of the multi-level character format utilized by the illustrated preferred embodiment of the present invention in which the prior art fixed-level character format of FIG. 3 is still utilized by the associated processors.

This multi-level character format consists of the original or full length character of 8 bits (of FIG. 3) and two shortened length characters of 6 bits and 5 bits; plus an additional "Short" bit $2^S$ that precedes the multi-level characters. The output CT 21 (41) of the present invention examines the fixed-level output DATA Character, the 8-bit character of output data bits $2^7$–$2^0$ of FIG. 3 as received from the transmitting processor: if output data bits $2^4$–$2^0$ contain an odd number of 1 bits and output data bits $2^7$, $2^6$ and $2^5$ are 0 bits then only output data bits $2^4$–$2^0$ are transmitted (5-bit character) to the communications interface and the Short bit $2^S$ is transmitted (6-bit byte) as a 0 bit—see FIG. 4a. If output data bits $2^4$–$2^0$ contain an even number of 1 bits and output data bits $2^7$ and $2^6$ are 0 bits then only output data bits $2^5$–$2^0$ are transmitted (6-bit character) and the Short bit $2^S$ is transmitted (7-bit byte) as a 0 bit—see FIG. 4b. For all other bit configurations output data bits, $2^7$–$2^0$ are transmitted (8-bit character) and the Short bit $2^S$ is transmitted (9-bit byte) as a 1 bit—see FIG. 4c. Input data received at the receiving site by input CT 43 (23) are reconstructed back to the eight-level character format of FIG. 3 utilized by the receiving processor. If the Short bit $2^S$ is a 0 bit and input data bits $2^4$–$2^0$ contain an odd number of 1 bits, input data bits $2^7$, $2^6$ and $2^5$ are set to a 0 bit and the reconstructed 8-bit character is transferred to the receiving processor; the Short bit $2^S$ is always stripped off prior to transferring the reconstructed 8-bit character to the receiving processor. If the Short bit $2^S$ is a 0 bit and input data bits $2^4$–$2^0$ contain an even number of 1 bits, input data bits $2^7$ and $2^6$ are set to a 0 bit, and the reconstructed 8-bit character is transmitted to the receiving processor. If the Short bit $2^S$ is a 1 bit, all input data bits $2^7$–$2^0$ are transmitted to the receiving processor.

Communications Terminal Module (CTM)

As stated above, the present invention relates to the modification of an existing CTM 20 (40) in which the logic of the output CT 21 (41) and of the input CT 23 (43) is modified to convert the prior art fixed-level transmission of data between CTM 20 and CTM 40 to a novel multi-level data transmission. As such multi-level transmission is only between the transmitting or output CT 21 (41) and the receiving or input CT 43 (23) the prior art operation of the transmitting or output processor to the transmitting or output CT and of the receiving or input CT to the receiving or input processor remains unaffected by the present invention; such prior art system requiring no modification to accommodate the present invention, all such modifications being limited to the existing CTM 20 (and 40). Accordingly, a general description of the prior art CTM 20, including output CT 21 and input CT 23, and its functional relationship to the rest of the data processing system of FIG. 1 shall initially be given. Following this general discussion, detailed discussion of the present invention shall be had.

With particular reference back to FIGS. 1, 2 there is presented a block diagram of CTM 20 which is a Univac Standard Synchronous CTM coupled at its left-hand side to CTMC 18 and at its right-hand side to CI 22. Communications between CP 16 and CTMC 18 is in the character format of FIGS. 5a, 5b and 5c while communication between CI 22, DS 24 and CLS 14 is in the message block format of FIG. 6. As illustrated in FIG. 6, this message block format consists of the serial transmission of a plurality of Synchronizing Characters (SYNC), a plurality of DATA Characters (DATA), and an End of Transmission Character (EOT), all such characters, in the prior art message format, being transmitted in the fixed-level format. In the present invention, as will be discussed hereinafter, the DATA Characters may be modified to be transmitted in a shortened form of the multi-level character format of the present invention as a function of their bit configurations.

As stated hereinabove, CTM 20 is a synchronous CTM that provides the terminal connections between a communications line system and a processor via a CTMC. The CTM input CT receives input data from the CI in a character serial, character bit-serial format and transmits the received input data to the CP via the CTMC in a character serial, character bit-parallel format. The CTM output CT receives output data from the CP via the CTMC in a character serial, character bit-parallel format and transmits the output data to the CI in a character serial, character bit-serial form. A synchronous mode of operation is used.

The CTM as modified by the present invention may utilize a DATA Character size of 5, 6 or 8 L bits as described above (plus an additional Short bit). Bit and character synchronization are accomplished at the beginning of a message block with the SYNC Characters—see FIG. 6.—and synchronization is then maintained through the transmission sequence without the use of START and STOP pulses. Data is transmitted least-significant-bit (LSB) ($2^0$ bit positions of the DATA Character) first at the data transmission rates of 2 K to 50 K bits per second as determined by the DATA Set clock. The CTM modularity is two-duplex having two input CT's and two output CT's.

The CTM will go into a Look-For-Sync mode upon demand from the CP with an EF control signal plus a 1 bit in the $2^2$ bit position (and a 0 bit in the $2^1$, $2^0$ bit positions) of the EFW—see FIG. 7. An EF control signal plus a 1 bit in the $2^1$ bit position (and a 0 bit in the $2^2$, $2^0$ bit positions) of the EFW will select the Remote Release (RR) function; an EF control signal plus a 1 bit in the $2^1$ and $2^2$ positions (and a 0 bit in the $2^0$ bit position) of the EFW will initiate the Look-For-Sync mode and the Remote Release function. Remote Release controls either Data Set Ready, Remote Release or New Sync in the CI.

CTM Output CT

The CTM output CT receives output data from the transmitting processor in the character serial, character bit-parallel mode via the CTMC. The parallel bits of data are stored in a buffer or holding register (Q-Register) for transfer to the Serializer comprised of two shifting registers (O-Register, S-Register). The bit-parallel data is serialized by the shifting registers and then transmitted to the Communications Line System (CLS) in a bit-serial form.

Basic Transmit or Output Sequence—Listed below are the series of events that occur when the transmitting processor sends information out on the CLS via the CTMC and the CTM. This sequence holds true if the communications subsystem and the DS are ready to operate. A more detailed flow-chart output sequence is presented in FIGS. 8a, 8b, 8c, 8d.

1. The transmitting processor initiates a Send Data External Function Word (EFW) transfer. A Send Data ($2^0$) EFW accompanied by an EF control signal is sent to the CT via the CTMC.
2. The EFW and the EF control signal are decoded by the CT.
3. A Request To Send (RTS) signal is sent to the DS by the CT; the DS returns a Clear to Send (CTS) signal.
4. The CTMC determines which 8 CT's of the up to 64 CT's in the up to 16 CTM's that are multiplexed to the CTMC has the highest priority PR (out of a possible 8 PR's) and sends a Primary Select (PS) signal to the CT's having the highest priority.
5. When the PS signal is received, the CT generates a Secondary Request (SR) signal and sends it to the CTMC.
6. The CTMC determines which CT has the highest secondary priority SR (out of a possible 8 SR's) and returns a Secondary Select (SS) signal. This selects the one specified CT out of up to 64 CT's multiplexed by the CTMC.
7. After the one selected CT has been selected, the CTMC presents an Output Data Request (ODR) word and an Externally Specified Index (ESI) word to the transmitting processor. After the transmitting processor receives the ODR, it returns an Output Acknowledge (OA) and a DATA Character to the CT via the CTMC.
8. After receiving the OA, the CT sends an Enter Q signal to the Q-Register. This signal loads the Q-Register with the DATA Character. The PR and SR sent to the CTMC from the CT for service are then dropped.
9. The contents of the Q-Register are transferred to the Serializer when the present DATA Character in the Serializer has been shifted (bit-serial) out to the CI and thence to the CLS. The CT detects when the transfer from the Q-Register to the Serializer has taken place and the CT then clears the Q-Register.
10. Steps 3 through 9 are repeated. On the initial DATA Character transfer there is no DATA Character in the Serializer and the transfer to the Serializer takes place immediately. The serializing process repeats until an EOT Character appears.
11. Upon receipt of the EOT Character, the CT stops requesting data from the CTMC until another EFW and EF control signal appear. At the same time the Request to Send (RTS) signal is dropped.

Output Control—The Output Control recognizes three External Function Words (EFW) in the format shown in FIG. 7. The three-out-of-seven CTM identification code selects the one selected CT. The Output Control circuitry generates Primary and Secondary Request signals, detects Primary and Secondary Select signals and drops the Primary and Secondary Request signals upon receipt of an OA from the CTMC. The Output Control interface signals from CTM output CT 21 (41) are listed in Table A. The Output Control generates two timing signals (phase $\phi 1$ and phase $\phi 2$) for each Serial-Clock-Transmit signal provided by the Data Set at a frequency of one timing cycle per data bit. The CTM output CT operates on rates ranging from 2 K to 50 K bits per second. The Serial-Clock-Transmit (SCT) timing signal from the Data Set starts with the receipt of the Request To Send (RTS) signal. The following additional functions are also performed by the Output Control:

1. Gating DATA Characters into the Q-Register.
2. Enabling the Data Set for data transmission out to the Communications Line System.
3. Disabling the PR and SR signals upon receipt of an EOT character.

Q-Register—The Q-Register holds the SYNC and DATA Characters. This buffer register receives and stores data (bit-parallel) from the CTMC and transfers this to the Serializer. When the Q-Register is filled with data and the Serializer is clear of data, a Q→O signal transfers the contents of the Q-Register to the O-Register of the Serializer.

Serializer—The Serializer consists of the O-Register and the S-Register. The contents of the Q-Register are transferred to the O-Register by a Q→O signal from the CT. At the same time a Marker 1 bit is set into the O-Register. When this Marker bit is cleared from the $2^1$ bit position, the DATA Character has been fully shifted out to the Communications Line System via the CI. A phase $\phi 2$ signal from Output Control transfers the contents of the O-Register to the S-Register. The O-Register and S-Register now function as shift registers. On each phase $\phi 2$ signal the contents of the O-Register (lower rank) are transferred to the S-Register (upper rank). On each phase $\phi 1$ (Shift) signal the contents of the upper rank are shifted one bit position and transferred to the next lower rank. On each shift, one bit of the DATA Character is shifted out bit-serially to the Data Set interface CI. Thus, the bit configuration of the DATA Character is bit-serialized and timed by the CT.

CTM Input CT

TABLE A

Output Control Interface Signals, Standard Synchronous CTM

| Signal | Description |
|---|---|
| *Between CTM Output CT and CTMC* | |
| READY | Indicates that a Master Clear has been performed and the Communications Subsystem is now ready to operate. |
| EXTERNAL FUNCTION (EF) | Activates the Output CT, indicates that an EFW Word is on the line. |
| PRIMARY REQUEST (PR) | From the CTM to the CTMC requesting service. A priority is assigned to each CTM multiplexed by the CTMC. |
| PRIMARY SELECT (PS) | From the CTMC to the Output CT of the CTM Having the highest priority. |
| SECONDARY REQUEST (SR) | To the CTMC from the CTM that had received a PS. |
| SECONDARY SELECT (SS) | From the CTMC to the Output CT of the CTM having the highest secondary priority as determined by the CTMC. |
| OUTPUT ACKNOWLEDGE (OA) | From the transmitting processor to the CTM, for each DATA character transmission; the signal stops requests to the CTMC from the CTM. |
| *Between CTM Output CT and CI* | |
| REQUEST TO SEND (RTS) | Informs the DS that the CTM has received a Send Data EFW Word. |
| CLEAR TO SEND (CTS) | From the DS indicating that it is ready to transmit data. |
| REMOTE RELEASE (RR) | Controls the DATA TERMINAL READY signal in the CI that starts the "hang up" sequence in the DS; used with Data-Phone service. Used by the CI to generate the NEW SYNC signal to the DS. |
| SERIAL CLOCK TRANSMIT (SCT) | Timing signal generated in the DS and transmitted to the Output CT. |

The CTM input CT receives input data from the Communications Line System (CLS) in a bit-serial form and the input data bits are then serially staticized by shifting registers (I-Register, S-Register) into bit-parallel form. When a complete DATA Character has been assembled and transferred to a buffer register (Q-Register), the CT signals the CTMC to transfer the DATA Character to the receiving processor in bit-parallel form.

Basic Receive or Input Sequence—Listed below are the series of events that occur when the CTM receives information from the Communications Line System via the Data Set interface CI. This sequence holds true when the communications subsystem and the Data Set are ready to operate. A more detailed flowchart input sequence is presented in FIGS. 9a, 9b, 9c, 9d, 9e, 9f.

1. The CT is in the Look-For-Sync mode. The Serial Clock Receive (SCR) timing pulses from the DS to the CT are continuous.
2. The CT detects a minimum of two contiguous SYNC Characters as the preamble to the first DATA Character coming in on the CLS; phase $\phi 1$ and $\phi 2$ signals are generated by the CT.
3. The first two SYNC Characters set the RCV FF. The first DATA Character (non-SYNC Character) sets the ISR FF.
4. The first DATA Character follows the last two SYNC Characters (bit-serial) via the input data line from the CTMC. The input data are gated through the I-Register and S-Register by alternate phase $\phi 1$ and $\phi 2$ signals.
5. The I-Register and S-Register, acting as shifting registers in the Staticizer, assemble the DATA Character into bit-parallel form in the S-Register setting the SO8 FF of the S-Register. This generates an S→Q signal and sets the ISR FF.
6. Setting of the ISR FF generates an Input Service Request which is sent to the CTMC by the CT with an exchange of the following signals:

Primary Request to the CTMC, answered with a Primary Select to CT, a Secondary Request to the CTMC, answered with a Secondary Select to the CT.

7. An S→Q signal from the CT transfers the DATA Character from the S-Register (bit-parallel) to the Q-Register for storage.
8. A Q→CTMC signal from the CT activates the line drivers; the DATA Character is placed on the input data lines to the receiving processor via the CTMC.
9. The receiving processor sends an Input Acknowledge (IA) signal to the CT when receiving each DATA Character.
10. Steps 4 through 9 are repeated until the last DATA Character of a message block is received, followed by an EOT Character.
11. The CP recognizes the end of the complete message upon receipt of the EOT Character.
12. The CTM is put in the Look-For-Sync mode ready to receive the two SYNC Characters of the next message block. While it is in this mode, other message characters will be disregarded.

Input Control—The Input Control generates Primary Request (PR) and Secondary Request (SR) signals, detects Primary Select (PS) and Secondary Select (SS) signals, and drops the PR and SR requests when the receiving processor has accepted the DATA Character. The Input Control interface signals are listed in Table B. The Input Control provides phase $\phi 1$ and $\phi 2$ signals for the input CT. The timing is provided by the DS via the CI; the input CT produces a phase $\phi 1$ and a phase $\phi 2$ signal pulse for each Serial Clock Receive (SCR) signal pulse. The CT will operate on a bit rate ranging from 2 K to 50 K bits per second. The Input Control performs the following additional functions:

1. Gating the DATA Character into the I-Register.
2. Providing phase $\phi 1$ and phase $\phi 2$ signals for the Staticizer.
3. Providing S→Q, S→I, CLR→I and Q→CTMC signals for the Q-Register.
4. Disabling Primary and Secondary Requests after receiving an Input Acknowledge (IA) from the receiving processor via the CTMC.

Staticizer—The Staticizer consists of the I-Register and the S-Register. The first bit of the DATA Character enters the $2^7$ bit position of the I-Register. On successive phase $\phi1$ and phase $\phi2$ signals from the CT a complete DATA Character is shifted into the I-Register, bit-by-bit, and then assembled in a bit-parallel pattern in the S-Register. When the S-Register is filled, an S→Q signal from the CT transfers the contents of the S-Register to the Q-Register (bit-parallel). The first bit of the next DATA Character then enters the I-Register.

CTM's at its MHZ clock rate while maintaining a continuous bit-serial stream of DATA Characters out of the 64 Data Sets at a 50 KHZ clock rate.

Figures 14A, 14B, 14C:
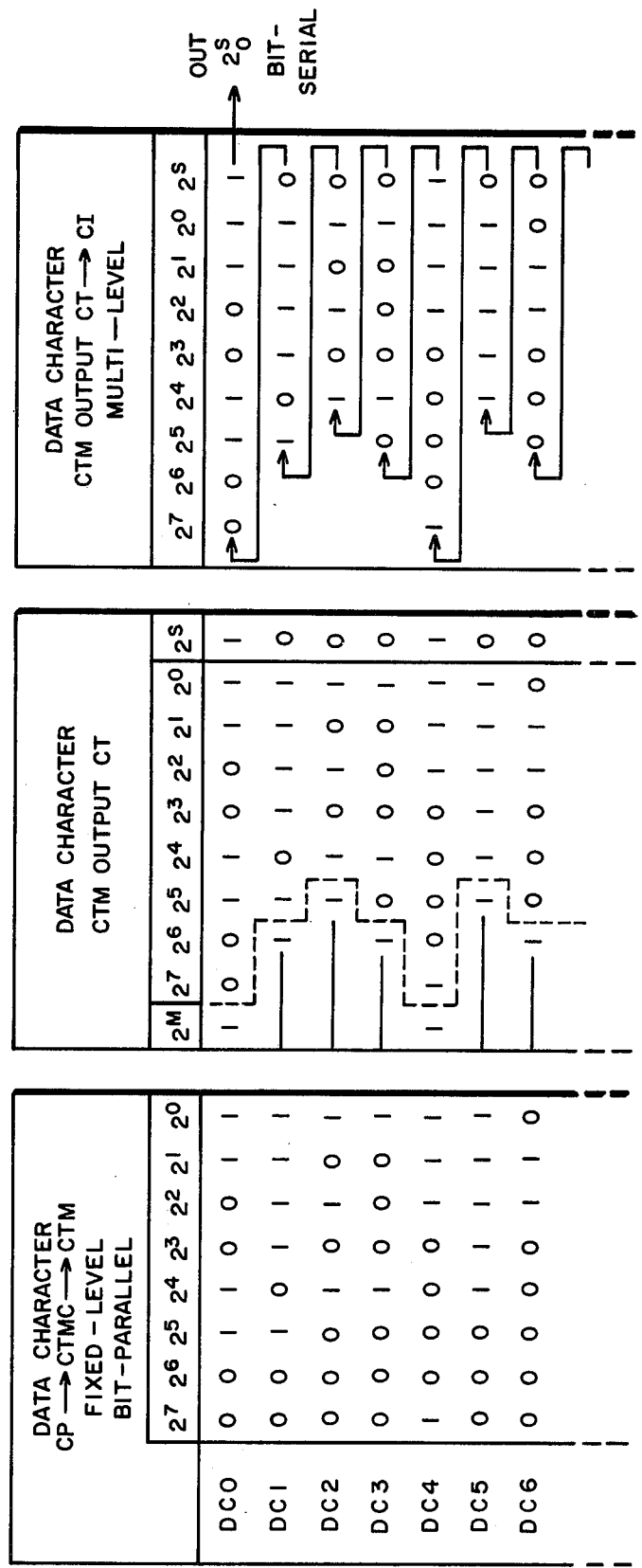
FIGS. 14a, 14b, 14c are illustrations of the DATA Character byte format for a particular group of DATA Characters received from the Central Processor and serialized by the novel output Communications Terminal of the present invention.
Figure 17A:
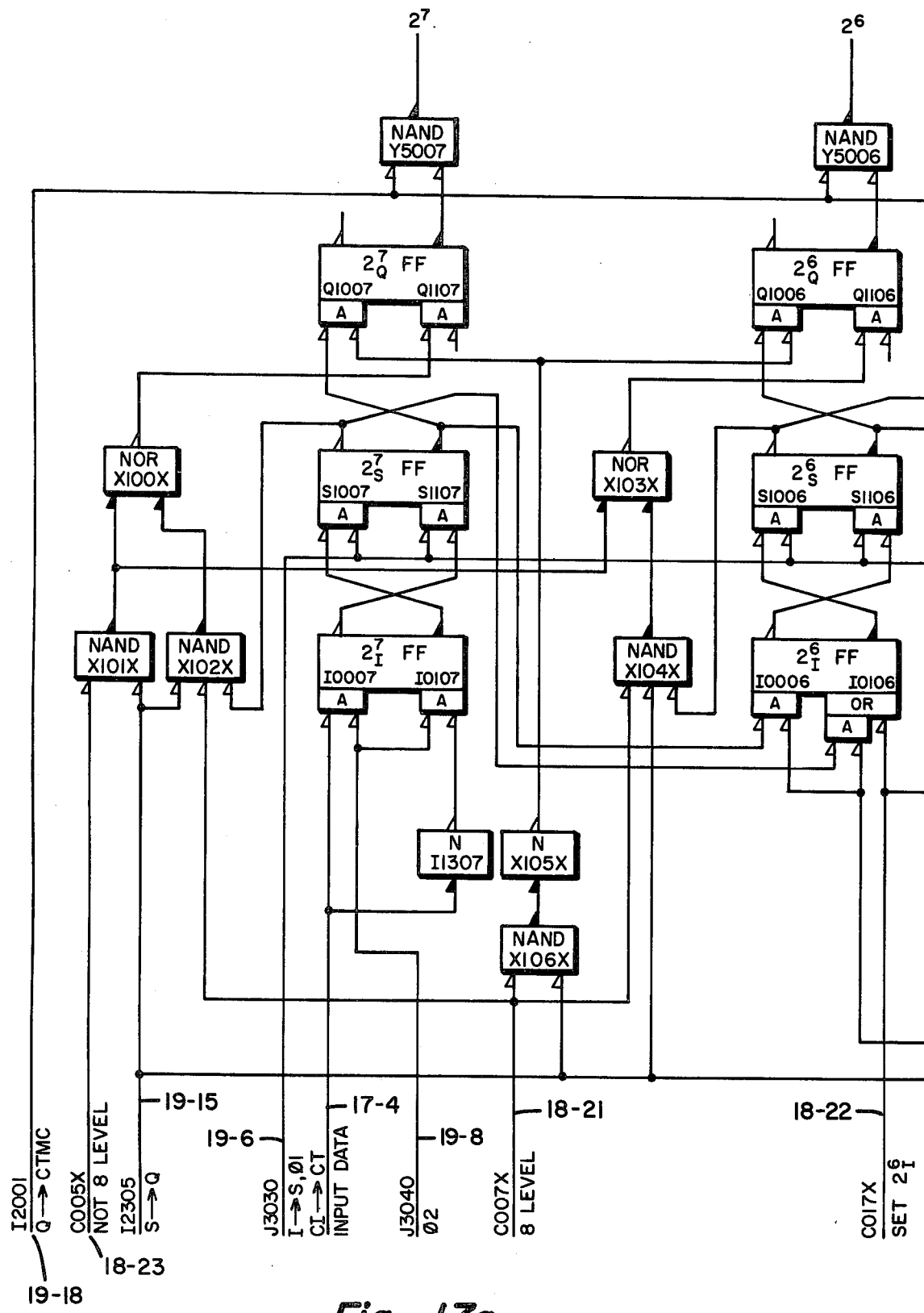
FIG. 17, comprised of FIGS. 17a, 17b, 17c, 17d, is a logic diagram of the I-Register, S-Register and Q-Register of the novel input Communications Terminal of the present invention.
Figure 17B:
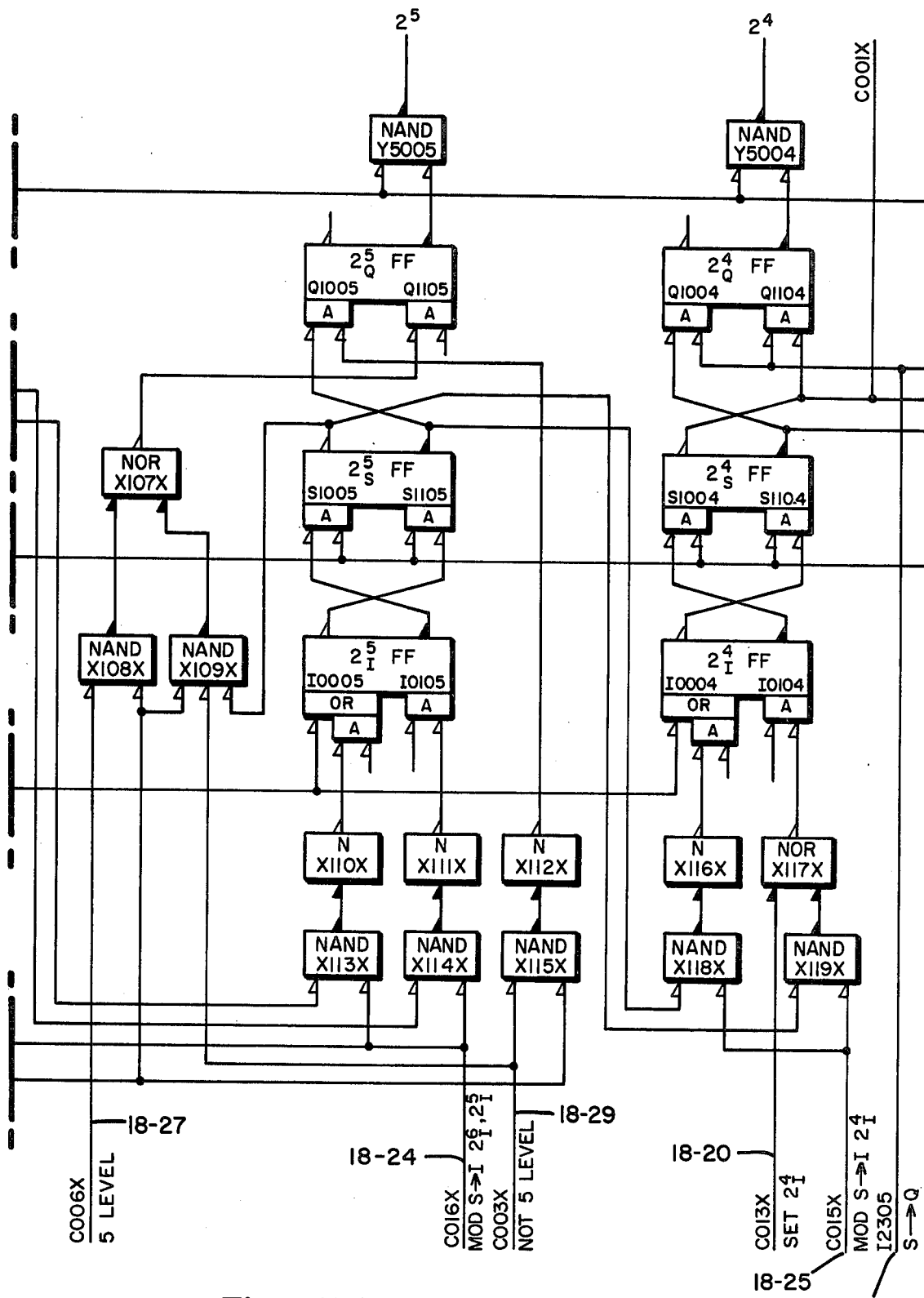
Figure 17C:
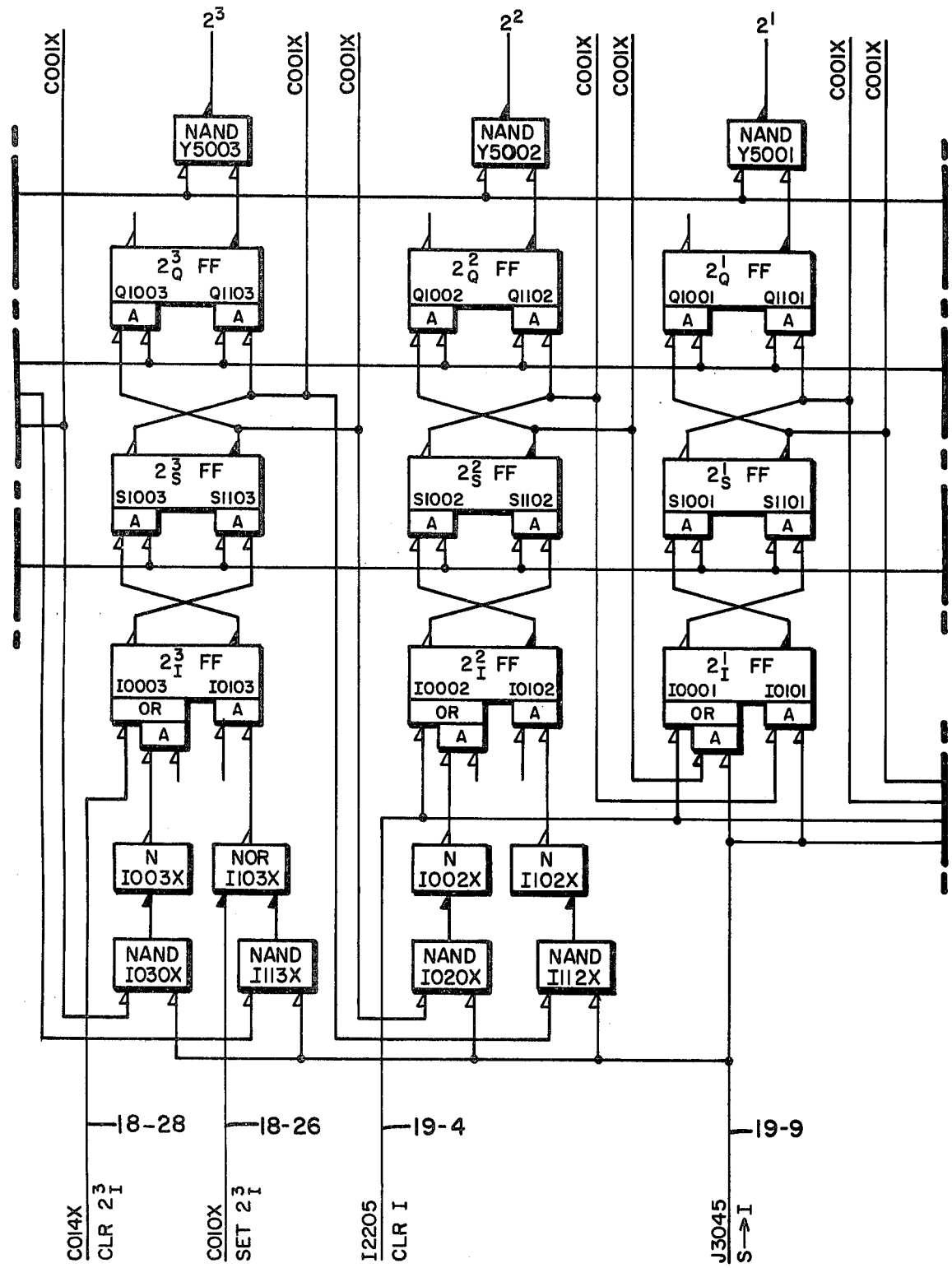
Figure 17D:
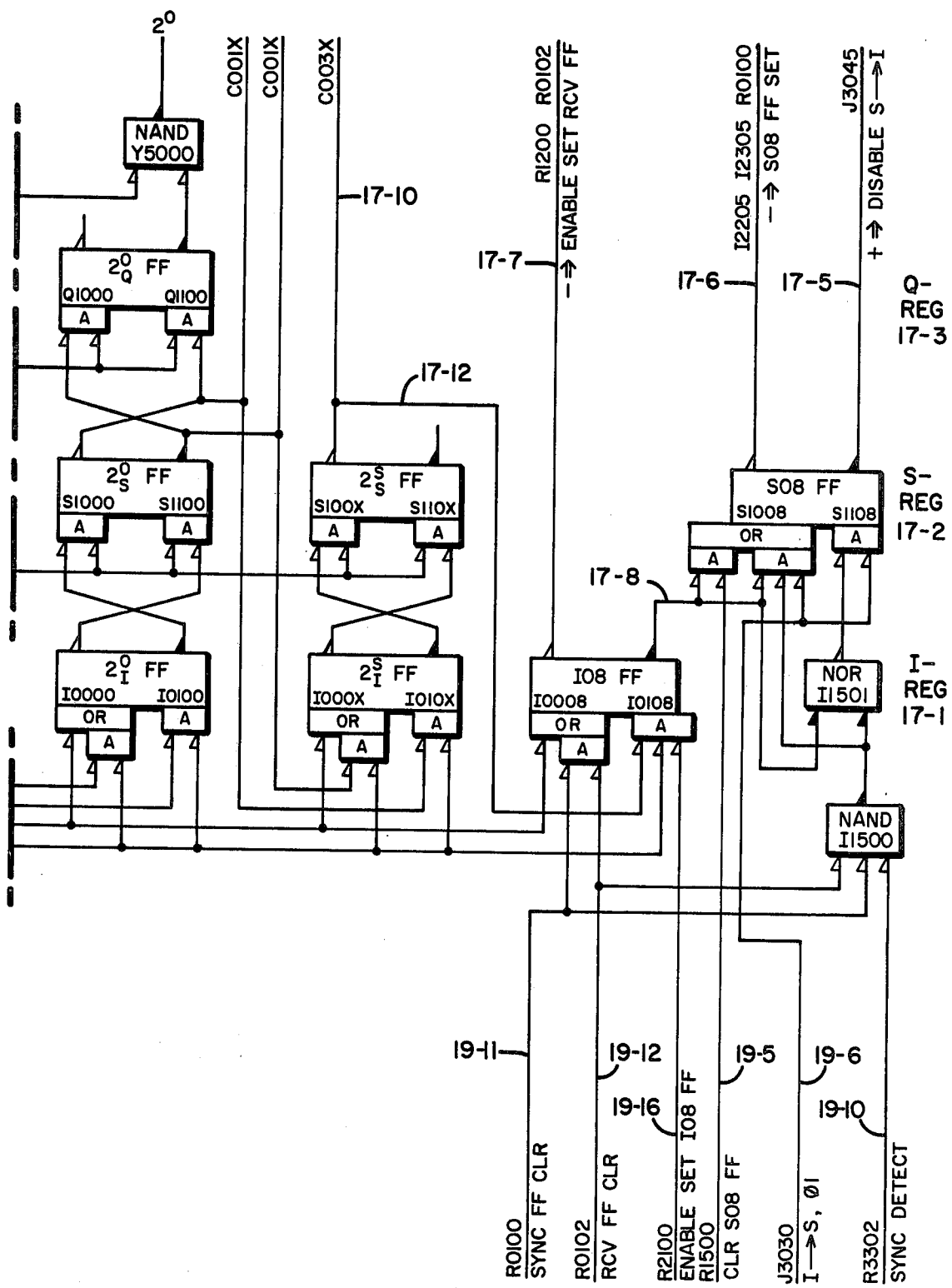

To describe the operation of output CT 21, it will be assumed that the communications subsystem of FIG. 1 is ready to operate and that the Q-Register 10-1 of CT 21 is Cleared and ready to receive the prior art fixed-level DATA Characters DC of FIG. 14a in a character

TABLE B

| Signal | Description |
|---|---|
| | Input Control Interface Signals, Standard Synchronous CTM |
| | Between CTM Input CT and CI |
| SERIAL CLOCK RECEIVE (SCR) | Timing signal generated in the DS and transmitted to the Input CT. |
| | Between CTM Input CT and CTMC |
| PRIMARY REQUEST (PR) | From the CTM to the CTMC requesting service. Priority is assigned to the CTM quadrant by the CTMC. |
| PRIMARY SELECT (PS) | From the CTMC to the Input CT of the CTM quadrant having the highest priority. |
| SECONDARY REQUEST (SR) | To the CTMC from the CTM quadrant that had received a PS. |
| SECONDARY SELECT (SS) | From the CTMC to the Input CT of the selected CTM. This CTM has the highest secondary priority as determined by the CTMC. |
| INPUT ACKNOWLEDGE (IA) | From the receiving processor to the Input CT via the CTMC to acknowledge a message. This signal disables the PR and SR signals to the CTMC. |

Q-Register (Buffer)—The Q-Register is a buffer register that holds one DATA Character in storage while the next DATA Character is being shifted through the Staticizer. A Q→CTMC signal from the CT transfers the contents of the Q-Register to the receiving processor via gated line drivers. After the receiving processor has returned an Input Acknowledge (IA) to the CT, the Q-Register is reloaded.

Synchronizing (SYNC) and End-of-Transmission (EOT) Characters—Output SYNC and EOT Characters from the transmitting processor must include a 1 bit in bit position $2^8$ with all codes. This coding identifies SYNC and EOT Characters in the CT.

External Function (EF)—External Function codes in the EFW words used in the CTM are as follows:

$001_8$-Send Data
$004_8$-Look-For-Sync
$002_8$-Remote Release
$006_8$-Look-For-Sync and Remote Release
$003_8$ and $007_8$ are illegal function codes.

End of Transmission (EOT)—The EOT Character must have a 1 bit in bit position $2^9$.

Figure 10A:
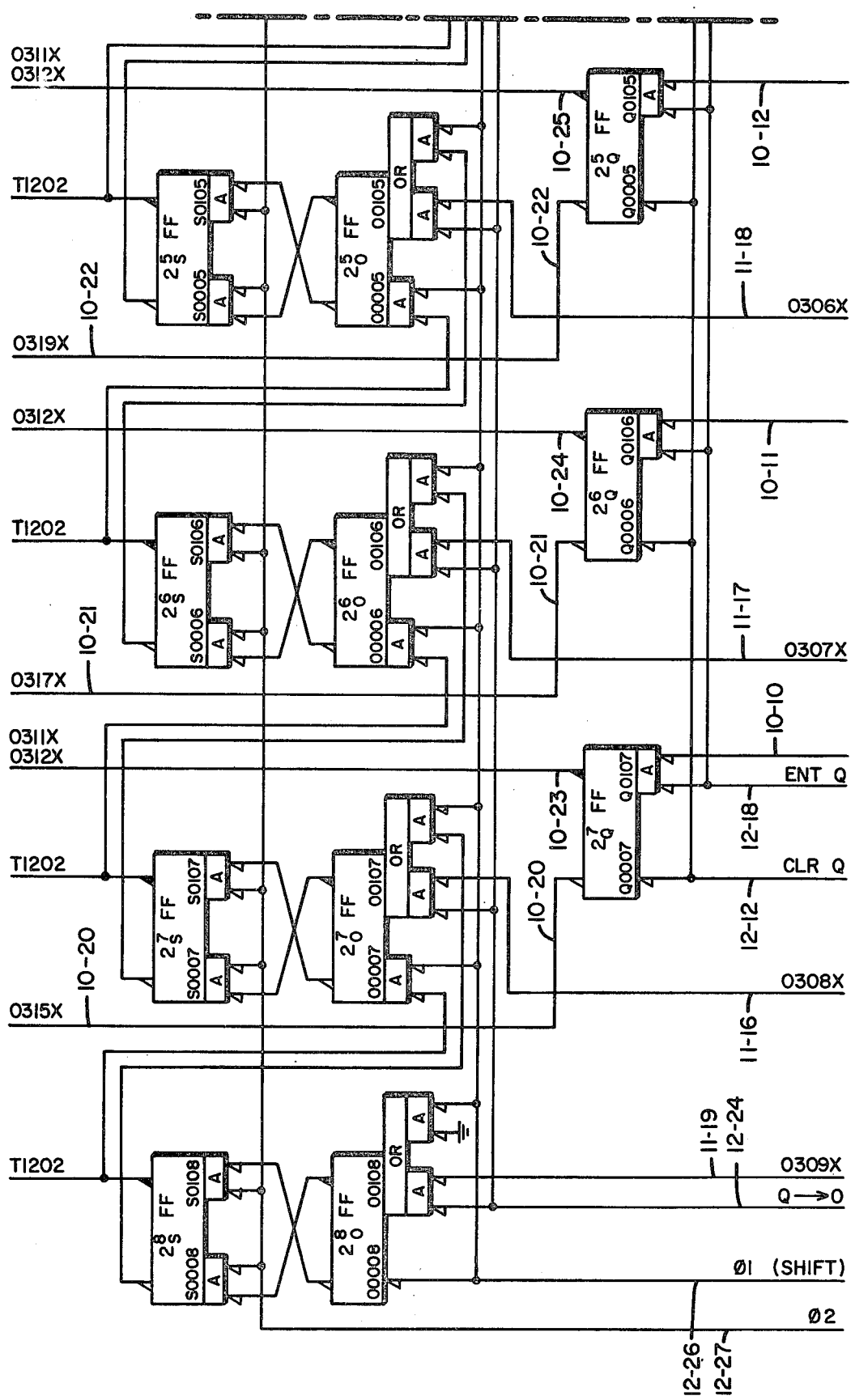
FIG. 10, comprised of FIGS. 10a, 10b, 10c, is a logic diagram of the Q-Register, O-Register and S-Register of the novel output Communications Terminal of the present invention.
Figure 10B:
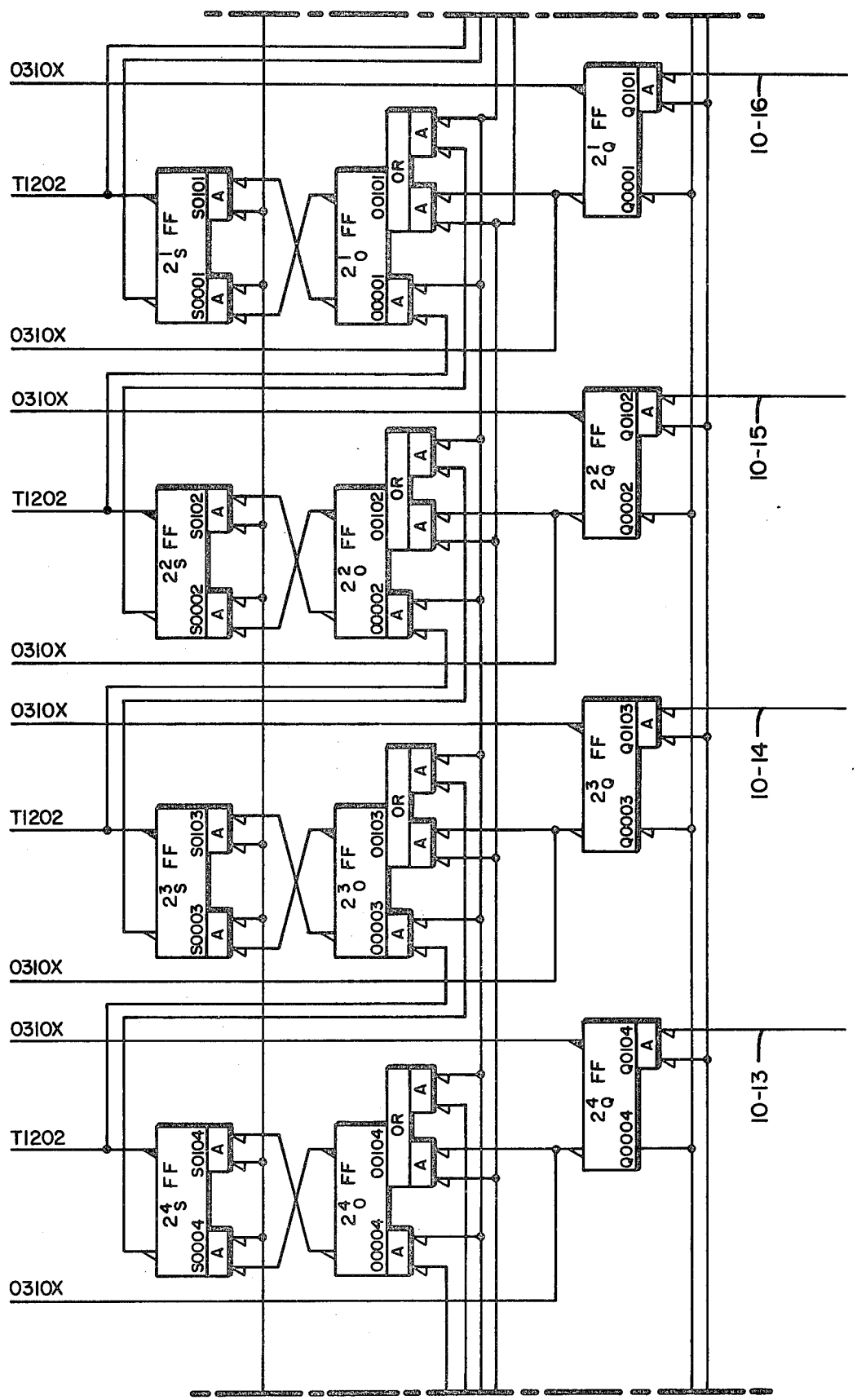
Figure 10C:
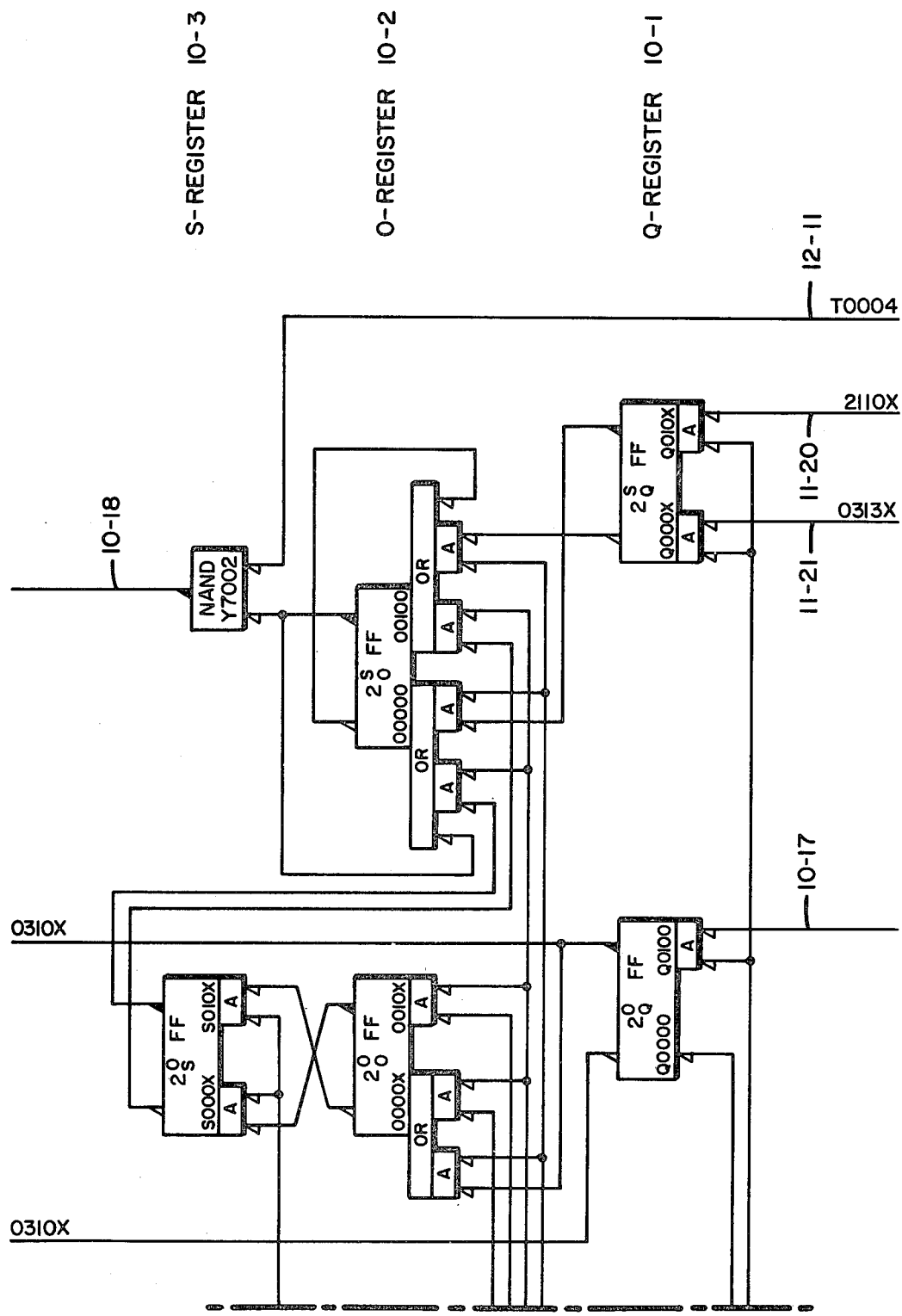
Figure 12A:
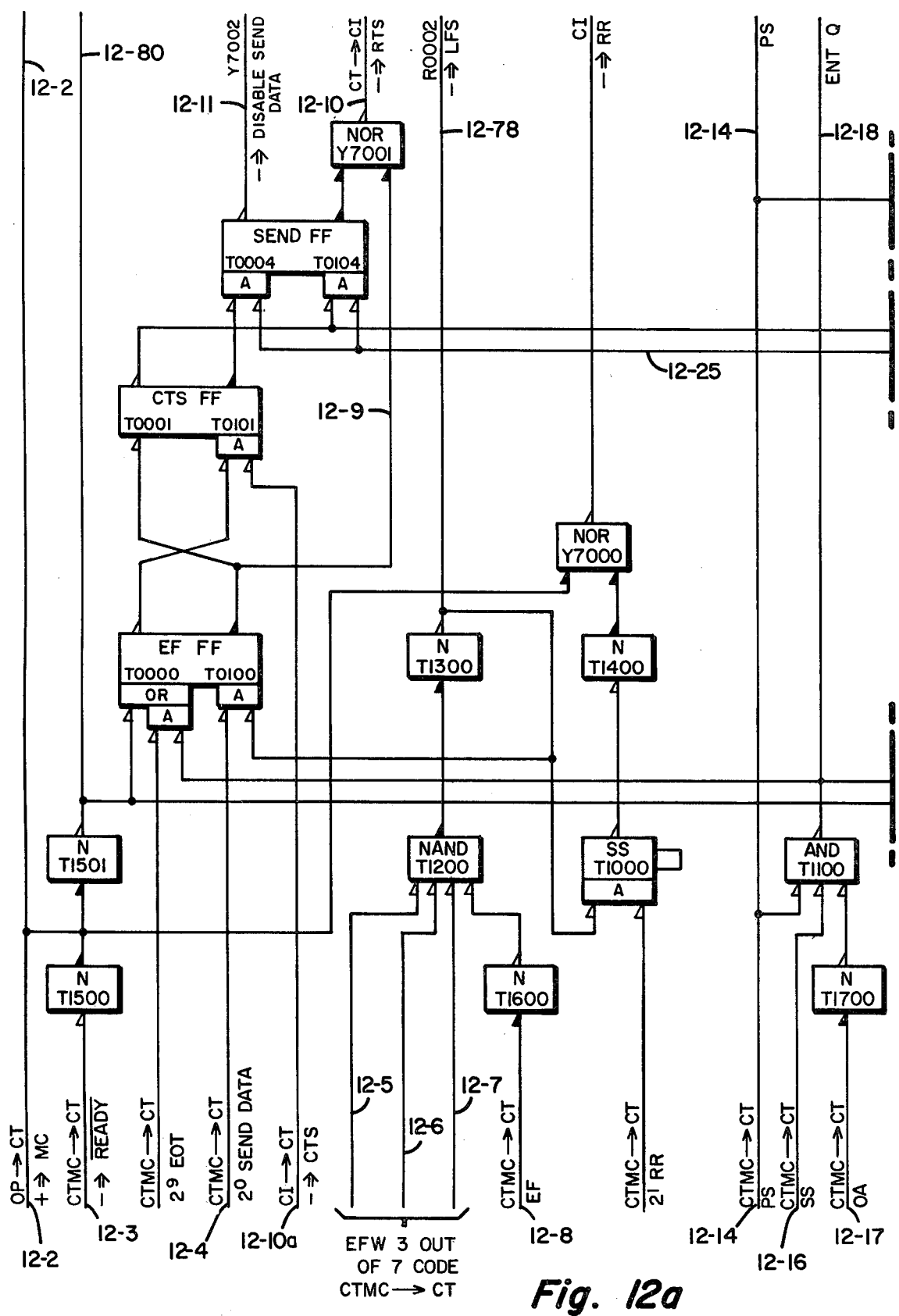
FIG. 12, comprised of FIGS. 12a, 12b, is a logic diagram of the Output Control utilized to control the novel apparatus of FIGS. 10, 11.
Figure 12B:
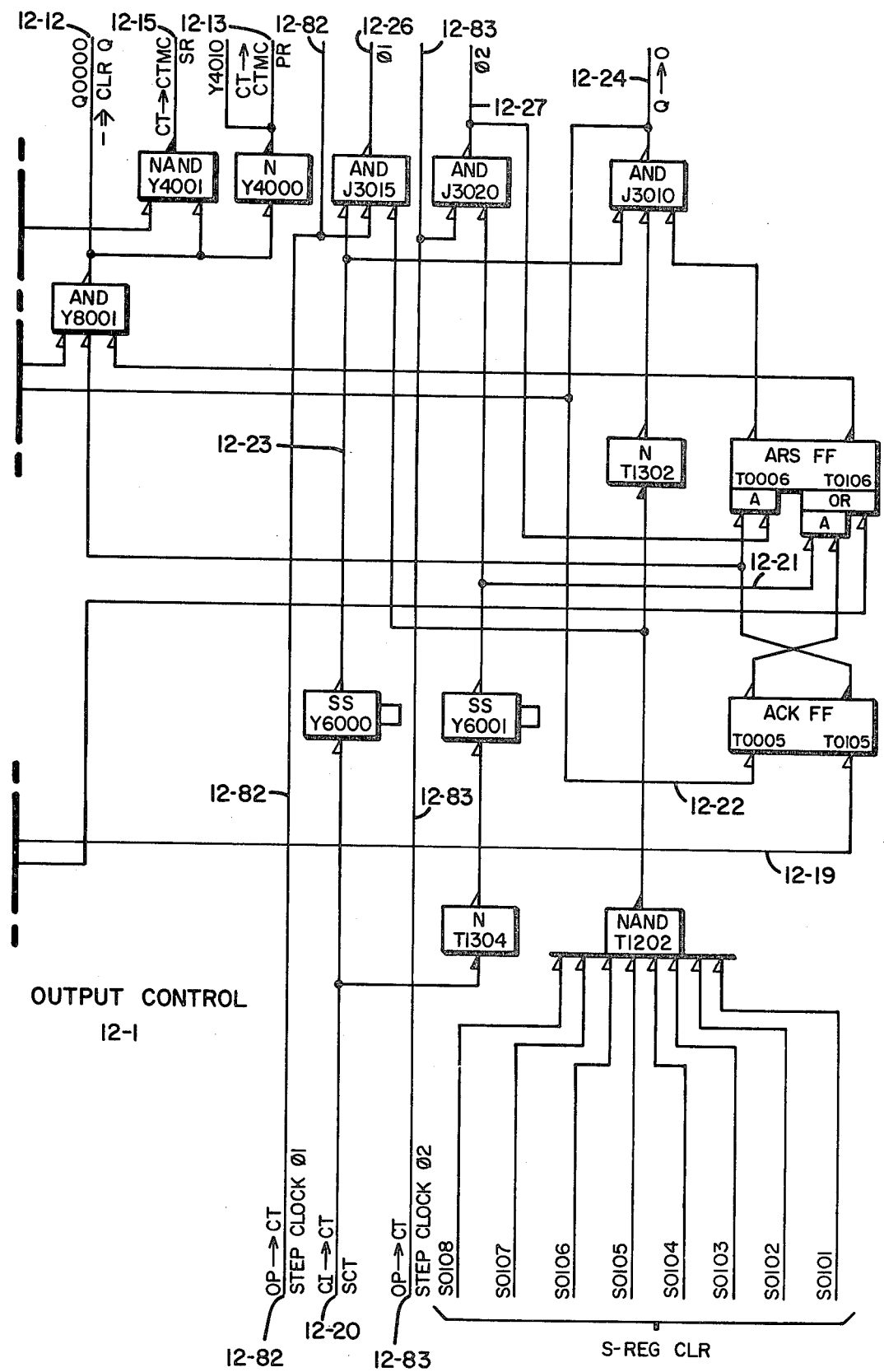
Figure 13:
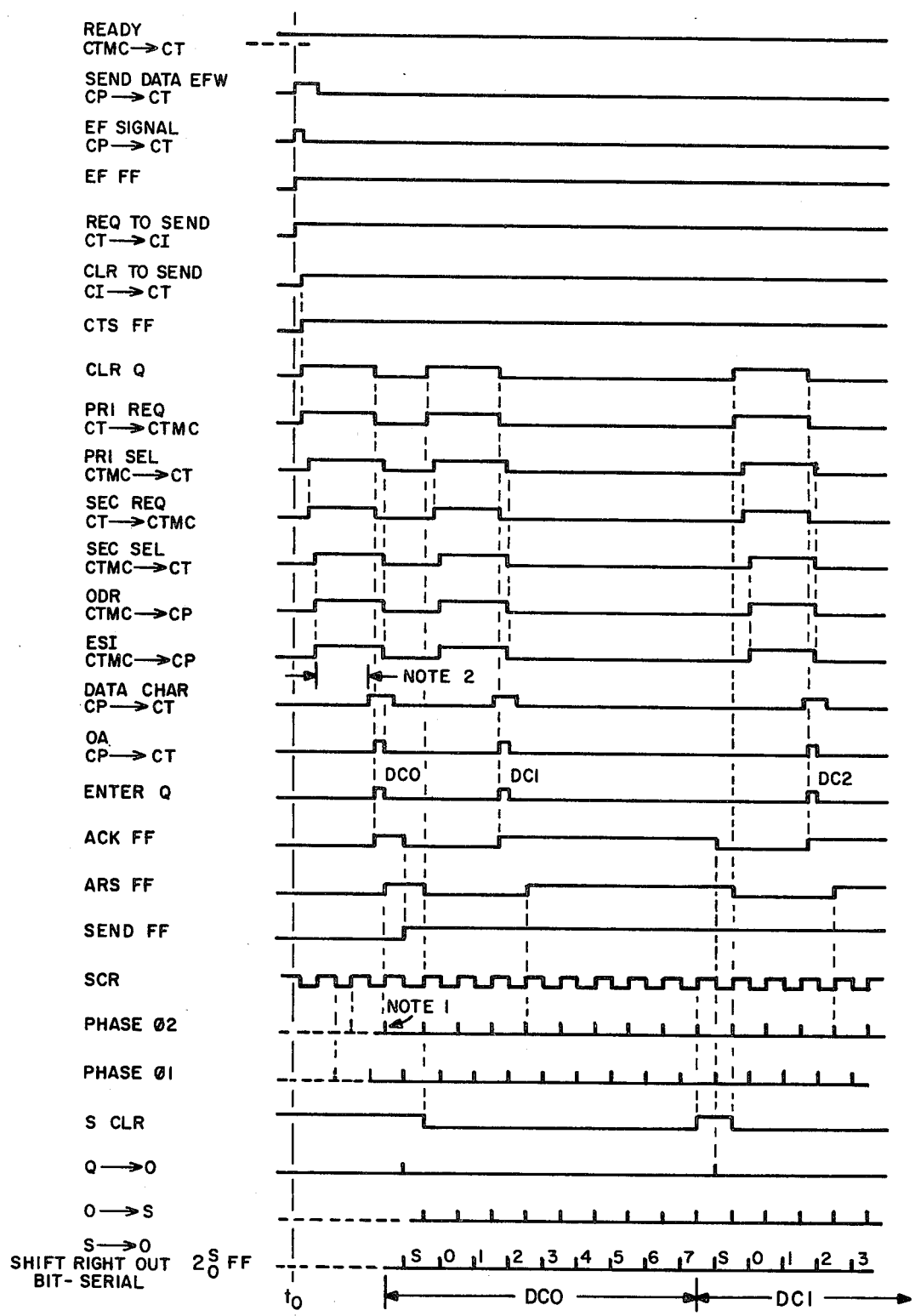
FIG. 13 is a timing diagram of a basic transmit or output sequence utilized by the apparatus of FIG. 12.

With particular reference to FIG. 10, comprised of FIGS. 10a, 10b, 10c, and FIG. 11 there are illustrated the logic diagrams of the Q-Register 10-1, O-Register 10-2 and S-Register 10-3 and of the Marker/Short Bit Generator 11-1 that substantially disclose the novel implementation of the present invention as incorporated in output CT 21 (41) of FIG. 1. FIG. 12, comprised of FIGS. 12a, 12b, illustrates the logic diagram of the Output Control 12-1 that controls the logic of FIGS. 10, 11. FIG. 13 is an illustration of the basic transmit or output sequence timing diagram showing the timing relationship of the signals utilized by CTMC 18 and CP 16 to effect the transfer of the output DATA Characters DC0, DC1 from CP 16, CTMC 18 to CI 22, DS 24 via output CT 21. As stated above, CTMC 18 functions as a multiplexer to couple CP 16 to one of, e.g., 16 CTM's. As such, CTMC 18 operates at a relatively high clock rate, e.g., 1 MHZ, compatible with a nanosecond (ns) memory cycle of CP 16 while the eight CTM's operate at the relatively low clock rate of, e.g., 50 KHZ, determined by the associated Data Set. Accordingly, CP 16 can multiplex output data through the associated 16 serial, character bit-parallel manner. These fixed-level DATA Characters are in O-Register 10-2 converted to the multi-level DATA Characters of FIG. 14b having a Short bit $2^S$ added preceding the lowest order bit $2^0$ and a Marker bit $2^M$ added following the highest ordered data bit $2^7$, $2^5$ or $2^4$ of the multi-level DATA Characters; these DATA Characters are then successively shifted right-wise through O-Register 10-2 and S-Register 10-3 to be transmitted, less the Marker bit $2^M$, from stage $2_0{}^S$ of O-Register 10-2 in the character serial, character bit-serial manner of FIG. 14c.

To best understand this mode of operation reference should be had to FIGS. 16a, 16b, 16c. In the prior art operation of an output CT, the fixed-level character format of FIG. 3 was loaded into the Q-Register and a Marker bit $2^M$ was unconditionally loaded into stage $2_0{}^8$ of the O-Register to form the fixed-level byte format of FIG. 15. This byte format of FIG. 15 was then shifted through the Serializer of the S-Register, O-Register and then emitted from stage $2_0{}^0$ of the O-Register. An S-Register Clear (S CLR) signal was generated to load the next DATA Character into the O-Register and to repeat the serialization process. Thus, the Marker bit $2^M$ is utilized by the Serializer to determine when the DATA Character has been shifted out of the S-Register. Accordingly, in using the multi-level DATA Character format of the present invention, the Marker bit $2^M$ must be loaded into that stage of the O-Register that is next higher than and next-adjacent to the most significant bit of the multi-level DATA Character. This multi-level byte format, as loaded in the O-Register, is illustrated in FIGS. 16a, 16b, 16c in which the Marker bit $2^M$ has been loaded in:

stage $2_0{}^5$ of the O-Register if the output data lower order bits $2^4$–$2^0$ contain an odd number of 1 bits and the output data upper order bits $2^7$, $2^6$ and $2^5$ are 0 bits—see FIG. 16a;

stage $2_0{}^6$ of the O-Register if the output data lower order bits $2^4$–$2^0$ contain an even number of 1 bits and the output data upper order bits $2^7$ and $2^6$ are 0 bits—FIG. 16b;

stage $2_0{}^8$ of the O-Register if neither one of the above two conditions exists—FIG. 16c.

Referring back now to FIGS. 10, 11, 12 and 13 and the previous discussion of the basic transmit or output sequence and with the communications subsystem and the Data Set ready to operate, assume that a READY→+→4=Hi signal from CTMC 18 has been coupled to line 12-3 and that all Output Control 12-1 FF's and S-Register 10-3 are Cleared via a Master Clear MC→+→4→Hi signal on line 12-2 from the Operator's Panel of CP 16. At this time the following output sequence occurs:

CP 16 initiates the output sequence by coupling a Send Data EFW—see FIG. 7—and an EF signal to CT 21 via CTMC 18. The 3-out-of-7 code signal portion of the Send Data EFW is coupled to lines 12-5, 12-6, 12-7 and the EF signal is coupled to line 12-8 while the $2^0$ Send Data signal is coupled to line 12-4. These signals, through NAND T1200, Inverter (N) T1300 and Inverter (N) T1600, Set the EF FF. The Setting of the EF FF, via line 12-9 and NOR Y7001, couples a Request to Send→—→4→Lo signal via line 12-10 to CI 22. CI 22 responds with the CTS→—→4→Lo signal on line 12-10a and Sets the CTS FF.

With the CTS FF Set, the ACK FF Clear and the ARS FF Clear, AND Y8001 couples a Lo Clear Q-Register (CLR Q) signal on line 12-12 to the clear sides of the stages $2_Q^7$-$2_Q^0$ of Q-Register 10-1 (of FIG. 10). This Clears the stages $2_Q^7$-$2_Q^0$ of Q Register 10-1 in preparation for the loading of DATA Character DC 0 (of FIG. 14a) therein. Additionally, Inverter Y4000 couples a Hi Primary Request (PR) signal to CTMC 18 via line 12-13.

Next, CTMC 18 responds with the Lo Primary Select (PS) signal on line 12-14 while NAND 4001 couples a Hi Secondary Request (SR) signal to CTMC 18 via line 12-15.

Next, CTMC 18 responds with the Lo Secondary Select (SS) signal on line 12-16 and then sends the Output Data Request (ODR) signal and the Externally Specified Index (ESI) signal to CP 16. CP 16 responds with the DATA Character DC 0 on lines 10-10-10-17 at the Set sides of stages $2_Q^7$-$2_Q^0$ of Q-Register 10-1 and then the Hi Output Acknowledge (OA) signal on line 12-17 which through Inverter T1700 and AND T1100 couples a Lo Enter Q-Register (ENT Q) signal to the stages $2_Q^7$-$2_Q^S$ of Q-Register 10-1 (of FIG. 10) via line 12-18 loading the DATA Character DC 0 into Q-Register 10-1 and Sets the ACK FF via line 12-19 terminating the Lo CLR Q signal on line 12-12.

During this time DS 24, via CI 22, has been coupling a continuously running Serial Clock Transmit (SCT) signal to line 12-20. The SCT signal at Single Shot (SS) Y6000 generates the phase $\phi1$ signal and at Single Shot (SS) Y6001, via Inverter T1304, generates the phase $\phi2$ signal. The Step Clock $\phi1$ signal on line 12-82 and the Step Clock $\phi2$ signal on line 12-83, which signals are operator controlled from an external Maintenance Panel which may be connected to CTM 20, are at this time "open circuited" and float following the signal level determined by the other input signals at AND J3015 and AND J3020. Under normal system operation, then, the Step Clock $\phi1$ signal and the Step Clock $\phi2$ signal do not effect the output of their respective AND J3015 and AND J3020, respectively; only when such Step Clock signals are operator controlled to be of a Hi→+ signal level are such AND J3015 and AND J3020 disabled.

Next, with Serial Clock Transmit (SCT) signal (a continuously running clock signal of, e.g., 50 KHZ) coupled to line 12-20 by CI 22 the next phase $\phi2$ signal (next after the Setting of the ACK FF by the ENT Q signal on line 12-18) from Inverter T1304 and Single Shot Y6001 via line 12-21 and line 12-22 Sets the ARS FF.

Figure 11:
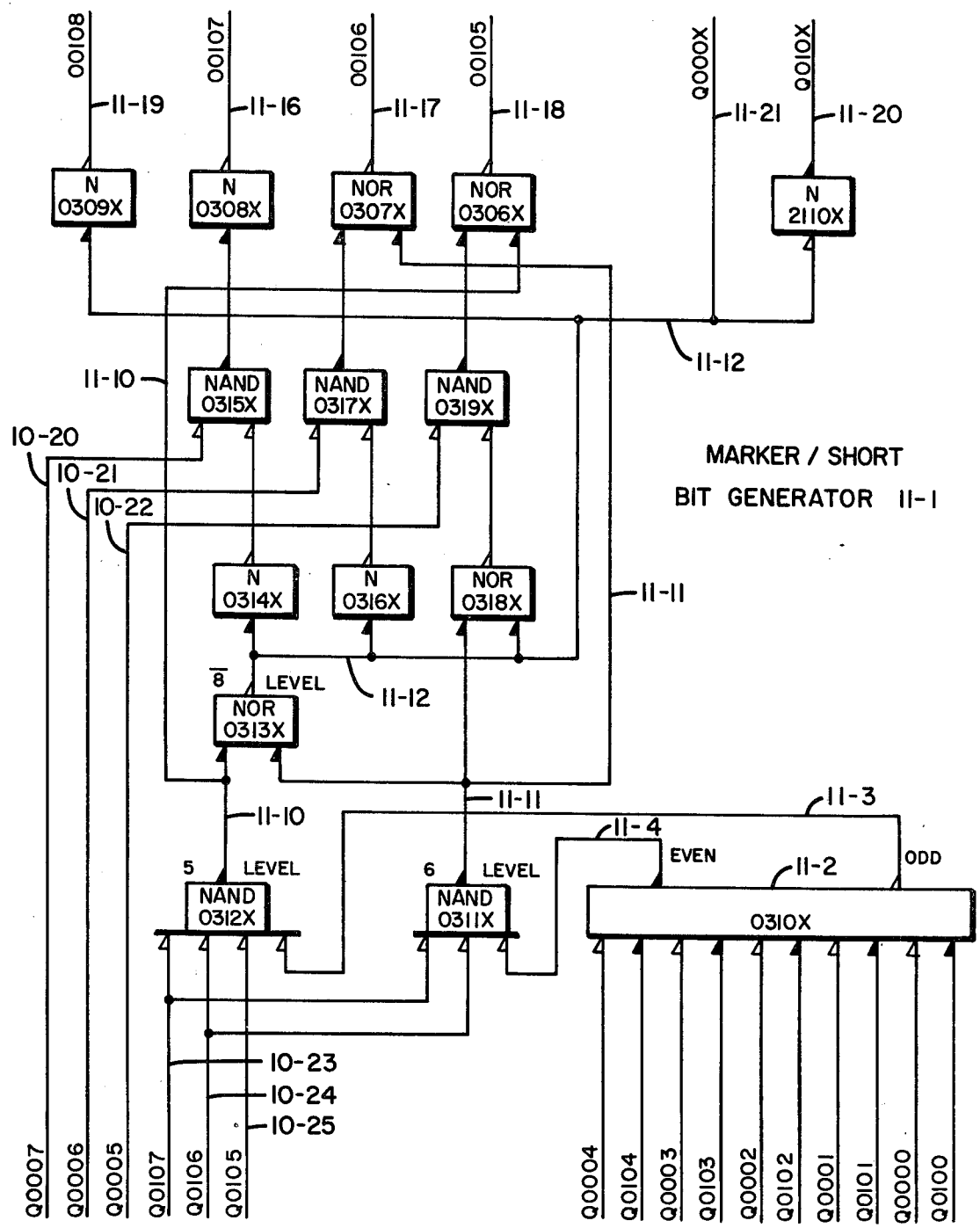
FIG. 11 is a logic diagram of the novel Marker/Short Bit Generator of the present invention.

On the next subsequent phase $\phi1$ signal from Single Shot Y6000 and line 12-23, after the ARS FF has been Set and with the S-Register Cleared as assumed above, NAND T1202 and Inverter T1302 enable AND J3010 to couple a Lo Q-Register to O-Register (Q→O) signal via line 12-24 to the stages $2_O^7$-$2_O^S$ of O-Register 10-2 (of FIG. 10) transferring DATA Character DC 0 from Q-Register 10-1 into O-Register 10-2, loading the Marker 1 bit into stage $2_O^8$, $2_O^6$ or $2_O^5$ and the Short bit into stage $2_O^7$, $2_O^5$ or $2_O^4$ as determined by the Marker/Short Bit Generator 11-1 of FIG. 11, and to Clear the ACK FF via line 12-22. The Q→O→—→4→Lo via line 12-25 Sets the Send FF and through NOR Y7001 continues to couple a Request to Send (RTS) signal to CI 22 via line 12-10, and via line 12-11 couples an Enable Send Data→—→4→Lo signal to NAND Y7002 (of FIG. 10). On the next $\phi2$, via AND J3020, the ARS FF is cleared and the data in the O-Register 10-2 is transferred into the corresponding S-Register 10-3. With ARS FF and ACK FF now Clear, a CLR Q signal clears the Q-Register 10-1 and a Primary Request signal is generated, and the sequence for loading a data character into the Q-Register 10-1 is repeated. AND J3015 then couples a Lo Shift (phase $\phi1$) signal via line 12-26 to the stages $2_S^8$-$2_S^0$ of S-Register 10-3 shifting the contents of S-Register 10-3 into the next lower ordered stages of O-Register 10-2. Note: With S-Register 10-3 initially Clear the contents of Q-Register 10-1 are on phase $\phi1$ immediately loaded into O-Register 10-2 and then on phase $\phi2$ into S-Register 10-3. This disables NAND T1202 and terminates the S CLR signal to Inverter T1302 and AND J3010 generating a CLR Q signal, as above. This enables the second DATA Character DC 1 to be loaded into the Q-Register 10-1 as illustrated in FIG. 13.

On the next successive Lo Transfer (phase $\phi2$) signal via line 12-27, the contents of the stages of O-Register 10-2 are transferred into the corresponding or like-ordered stages of S-Register 10-3.

The successive phase $\phi1$ and phase $\phi2$ signals bit-serially shift the contents of the Serializer (O-Register 10-2, S-Register 10-3) out of stage $2_O^S$ of O-Register 10-2. When the Marker bit $2^M$ originally set into the proper stage $2_O^8$, $2_O^6$ or $2_O^5$ of O-Register 10-2 by the Marker/Short Bit Generator 11-1 of FIG. 11, the operation of which will be described below, has Cleared the $2_S^1$ stage of S-Register 10-3 from the Clear side output lines via the corresponding input lines of NAND T1202 (of FIG. 12) generate a Hi S-Register Clear (S CLR) signal and then a Lo Q→O signal. With particular reference to FIG. 11 there is presented a logic block diagram of the Marker/Short Bit Generator 11-1 of the present invention. Generator 11-1 performs the function of sampling the bits $2^7$-$2^0$ of the fixed-length output DATA Character as loaded in the respective stages $2_Q^7$-$2_Q^0$ of Q-Register 10-1 of output CT 21 from CTMC 18 to determine:

if the output data lower order bits $2^4$-$2^0$ contain an odd number of 1 bits and if the output data upper order bits $2^7$, $2^6$ and $2^5$ are 0 bits then to load the Marker ($2^M$) 1 bit into stage $2_Q^5$ of Q-Register 10-1 and to load the Short ($2^S$) 0 bit into stage $2_Q^S$ of Q-Register 10-1;

if the output data lower order bits $2^4$-$2^0$ contain an even number of 1 bits and if the output data upper order bits $2^7$ and $2^6$ are 0 bits then to load the Marker 1 bit into stage $2_Q^6$ of Q-Register 10-1 and to load the short 0 bit into stage $2_Q^S$ of Q-Register 10-1;

if neither of the above two conditions exist then to load the Marker 1 bit into stage $2_Q^8$ of Q-Register 10-1 and to load the Short 1 bit into stage $2_Q^S$ of Q-Register 10-1.

This above described operation of Generator 11-1 is schematically illustrated in FIGS. 14a and 14b in which the fixed-level DATA Characters having the format of FIG. 15 are loaded in CTM output CT 21 Q-Register 10-1 from CTMC 18 and CP 16 and are converted to multi-level DATA Characters having the format of FIGS. 16a, 16b, 16c.

Referring now to FIGS. 10 and 12 the operation of Generator 11-1 of FIG. 11 will be described using the DATA Character byte format of FIGS. 14a, 14b, 14c. Firstly, assume that a Lo ENT Q signal from line 12-18 (of FIG. 12) has been coupled to the Set sides of stages $2_Q^7$-$2_Q^0$ of Q-register 10-1 (of FIG. 10). This signal loads a fixed-length DATA Character of FIG. 14a from CTMC 18 into stages $2_Q^7$-$2_Q^0$ of Q-Register 10-1 of output CT 21. The Clear side outputs of stages $2_Q^4$-$2_Q^0$ of Q-Register 10-1 via the corresponding output lines couple the Complement of bits $2^4$-$2^0$ to ODD/EVEN Generator 11-2 while the Set side outputs of stages $2_Q^4$-$2_Q^0$ of Q-Register 10-1 via the corresponding output lines couple the True of bits $2^4$-$2^0$ to ODD/EVEN Generator 11-2. Additionally, the Clear side outputs of stages $2_Q^7$, $2_Q^6$, $2_Q^5$ of Q-Register 10-1 via the corresponding output lines 10-23, 10-24, 10-25 couple the Complement of bits $2^7$-$2^5$ to a 5 Level NAND 0312X while the corresponding output lines 10-23, 10-24 couple the Complement of bits $2^7$, $2^6$ to a 6 Level NAND 0311X. With the ODD output of Generator 11-2 coupled to 5 Level NAND 0312X via line 11-3 and the EVEN output of Generator 11-2 coupled to 6 Level NAND 0311X via line 11-4:

if in Q-Register 10-1 the lower order bits $2^4$-$2^0$ contain an odd number of 1 bits and the upper order bits $2^7$, $2^6$ and $2^5$ are 0 bits, 5 Level NAND 0312X emits a Hi→4 signal on line 11-10;

if in Q-Register 10-1 the lower order bits $2^4$-$2^0$ contain an even number of 1 bits and the upper order bits $2^7$ and $2^6$ are 0 bits, 6 Level NAND 0311X emits a Hi→4 signal on line 11-11;

if either 5 Level NAND 0312X or 6 Level NAND 0311X couple a Hi→4 signal to $\overline{8}$ Level NOR 0313X it emits a Lo→4 signal on line 11-12.

With DATA Character DC 0 of FIG. 14a loaded in Q-Register 10-1 by a Lo ENT Q signal on line 12-18, Generator 11-1 determines that the conditions of 5 Level NAND 0312X and 6 Level NAND 0311X are not met, i.e., are disabled, and, accordingly, both lines 11-10 and 11-11 are held Lo→4. This causes line 11-12 from $\overline{8}$ Level NOR 0313X to couple a Hi→4 signal to Inverter 0314X, Inverter 0316X, NOR 0318X, enabling bits $2^7$, $2^6$, $2^5$ from stages $2_Q^7$, $2_Q^6$, $2_Q^5$ of Q-Register 10-1 on lines 10-20, 10-21, 10-22 to be coupled to Inverter 0308X, NOR 0307X, NOR 0306X via NAND 0315X, NAND 0317X, NAND 0319X, respectively, and thence via lines 11-16, 11-17, 11-18 to the Set inputs of stages $2_O^7$, $2_O^6$, $2_O^5$ of O-Register 10-2. Concurrently, line 11-12 from $\overline{8}$ Level NOR 0313X couples a Hi signal to Inverter 0309X and thence via line 11-19 a Lo signal to the Set input of stage $2_O^8$ of O-Register 10-2 coupling a Marker bit $2^M=1$ thereto while line 11-12 couples a Hi signal to Inverter 2110X and thence via line 11-20 a Lo signal to the Set input of stage $2_Q^S$ of Q-Register 10-1 and via line 11-21 a Hi signal to the Clear side of stage $2_Q^S$ of Q-Register 10-1 coupling a Short bit $2_Q^S=1$ thereto. Accordingly, on the next subsequent phase $\phi 1$ Q→O signal on line 12-24 (from AND J3010 of FIG. 12 to stages $2_O^8$-$2_O^S$ of O-Register 10-2 of FIG. 10) the DATA Character byte of DC 0 of FIG. 14b is entered into the respective stages of O-Register 10-2. Upon receipt of the following alternating phase $\phi 2$ signals on line 12-27 at stages $2_S^8$-$2_S^0$ of S-Register 10-3 and phase $\phi 1$ signals on line 12-26 at stages $2_O^8$-$2_O^S$ of O-Register 10-2 the DATA Character byte DC 0 of FIG. 14c is emitted bit-serially from the $2_O^S$ stage of O-Register 10-2 and via NAND Y7002 and line 10-18 is coupled to CI 22 and thence to DS 24.

After DATA Character byte DC 0 has been transferred from Q-Register 10-1 to O-Register 10-2 by a Q→O signal on line 12-24, the next DATA Character DC 1 of FIG. 14a from CTMC 18 is loaded into Q-Register 10-1 by an ENT Q signal on line 12-18. Generator 11-1 determines that the conditions of 5 Level NAND 0312X are not met but that the conditions of 6 Level NAND 0311X are met, and, accordingly, line 11-10 is held Lo while line 11-11 is held Hi. This causes line 11-12 from $\overline{8}$ Level NOR 0313X to couple a Lo signal to Inverter 0314X, Inverter 0316X, NOR 0318X disabling the bits $2^7$, $2^6$, from stages $2_Q^7$, $2_Q^6$ of Q-Register 10-1 on lines 10-20, 10-21 from being coupled to Inverter 0308X, NOR 0307X. However, because 6 Level NAND 0311X via line 11-11 couples a Hi signal to NOR 0318X it enables bit $2^5$ from stage $2_Q^5$ of Q-Register 10-1 on line 10-22 to be coupled to NOR 0306X and thence via line 11-18 to the Set input of stage $2_O^5$ of O-Register 10-2. Additionally 6 Level NAND 0311X via line 11-11 couples a Hi signal to NOR 0307X which, in turn, via line 11-17 couples a Marker bit $2^M=1$ to the Set input of stage $2_O^6$ of O-Register 10-2. Concurrently, line 11-12 from 8 Level NOR 0313X couples a Lo signal to Inverter 0309X and thence via line 11-19 a Hi signal to the Set input of stage $2_O^8$ of O-Register 10-2 coupling a Marker bit $2^M=0$ thereto while it couples a Lo signal to Inverter 2110X and thence via line 11-20 a Hi signal to the Set input of stage $2_Q^S$ of Q-Register 10-1 coupling the Short bit $2^S=0$ thereto. Accordingly, at the next subsequent Q→O signal on line 12-24 the DATA Character byte DC 1 of FIG. 14b is entered into the respective stages of O-Register 10-2. Upon receipt of the next following alternating phase $\phi 2$ signals on line 12-27 at stages $2_S^8$-$2_S^0$ of S-Register 10-3 and phase $\phi 1$ signals on line 12-26 at stages $2_O^8$-$2_O^S$ of O-Register 10-2, DATA Character byte DC 1 of FIG. 14c is emitted bit-serially from stage $2_O^S$ of O-Register 10-2 and via NAND Y7002 and line 10-18 is coupled to CI 22 and thence to DS 24.

After DATA Character DC 1 has been transferred from Q-Register 10-1 to O-Register 10-2 by a Q→O signal on line 12-24 the next DATA Character DC 2 of FIG. 14a from CTMC 18 is loaded into Q-Register 10-1 by an ENT Q signal on line 12-18. Generator 11-1 determines that the conditions of 5 Level NAND 0312X are met and that the conditions of 6 Level NAND 0311X are not met, and, accordingly, line 11-10 is held Hi and line 11-11 is held Lo. This causes line 11-12 from $\overline{8}$ Level NOR 0313X to couple a Lo signal to Inverter 0314X, Inverter 0316X, NOR 0318X disabling the bits $2^7$, $2^6$, $2^5$ from stages $2_Q^7$, $2_Q^6$, $2_Q^5$ of Q-Register 10-1 on lines 10-20, 10-21, 10-22 to be coupled to Inverter 0308X, NOR 0307X, NOR 0306X and thence via lines 11-16, 11-17, 11-18 to the Set inputs of stages $2_O{}^7$, $2_O{}^6$, $2_O{}^5$ of O-Register 10-2. Concurrently, line 11-10 from 5 Level NAND 0312X couples a Hi signal to NOR 0306X and thence via line 11-18 a Lo signal to the Set input of stage $2_O{}^5$ of O-Register 10-2 coupling a Marker bit $2^M = 1$ thereto. Concurrently, line 11-12 from 8 Level NOR 0313X couples a Lo signal to Inverter 0309X and thence via line 11-19 a Hi signal to the Set input of stage $2_O{}^8$ of O-Register 10-2 coupling a Marker bit $2^M = 0$ thereto while it couples a Lo signal to Inverter 2110X and thence via line 11-20 a Hi signal to the Set input of stage $2_Q{}^S$ of Q-Register 10-1 and via line 11-21 a Lo signal to the Clear input of stage $2_Q{}^S$ of Q-Register 10-1 coupling a Short bit $2^S = 0$ thereto. Accordingly, at the next subsequent phase Q→O signal on line 12-24 the DATA Character byte DC 2 of FIG. 14b is entered into the respective stages of O-Register 10-2. Upon receipt of the following alternate phase $\phi 2$ signals on line 12-27 at stages $2_S{}^8 - 2_S{}^0$ of S-Register 10-3 and phase $\phi 1$ signals on line 12-26 at stages $2_O{}^8 - 2_O{}^S$ of O-Register 10-2 the DATA Character byte DC 2 of FIG. 14c is emitted bit-serially from stage $2_O{}^S$ of O-Register 10-2 and via NAND Y7002 and line 10-18 is coupled to CI 22 and thence to DS 24.

This above bit-parallel entry of DATA Characters DC 0, DC 1, DC 2 into the respective stages of Q-Register 10-1 and their subsequent bit-serial transmission from the stage $2_O{}^S$ of O-Register 10-2 and via NAND Y7002 and line 10-18 to CI 22 and thence to DS 24 is schematically illustrated in the timing diagram of FIG. 13. In this timing diagram the Serial Clock Transmit (SCT) signal received from DS 24 via CI 22 on line 12-20 (of FIG. 12) through the associated Single Shots (SS) Y6000 and Y6001 generate the corresponding phase $\phi 1$ and phase $\phi 2$ timing signals utilized by the Serializer of O-Register 10-2, S-Register 10-3 to perform the bit-parallel to bit-serial conversion required to transmit the output DATA Characters received from CP 16 and CTMC 18 for transmission on CLS 14 via CI 22 and DS 24.

Figure 19A:
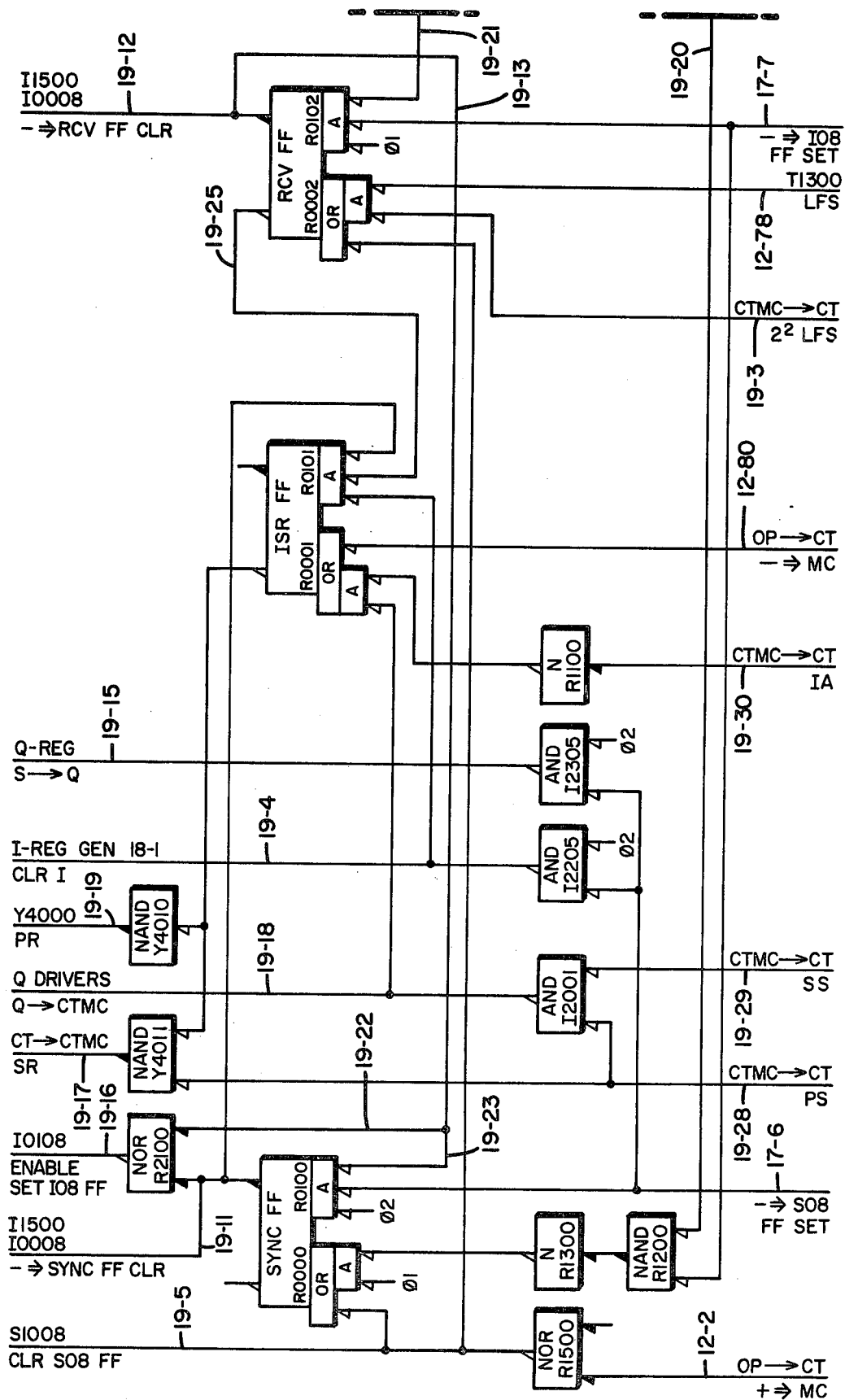
FIG. 19, comprised of FIGS. 19a, 19b, is a logic diagram of the Input Control utilized to control the novel apparatus of FIGS. 17, 18.
Figure 19B:
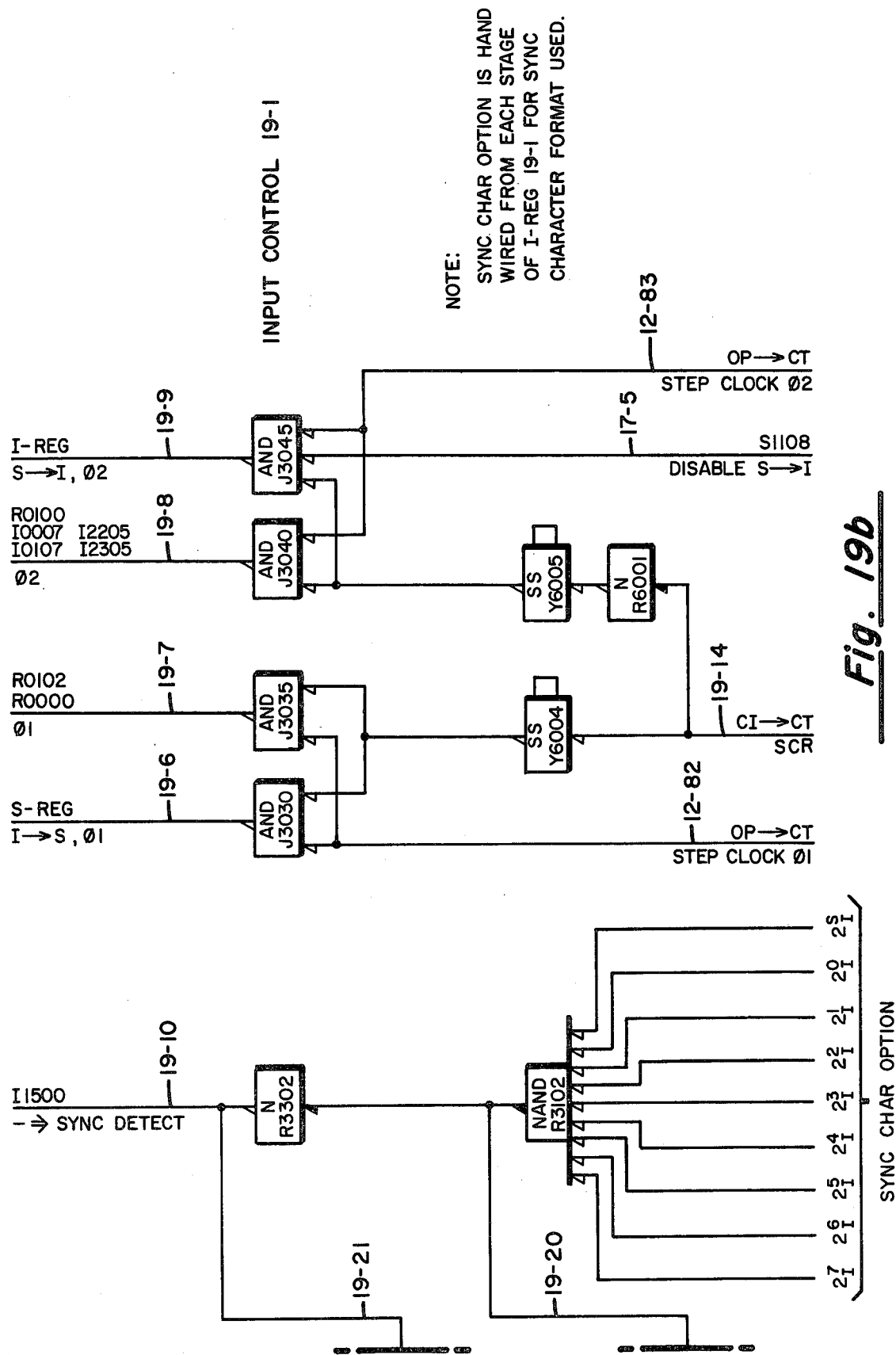
Figure 20:
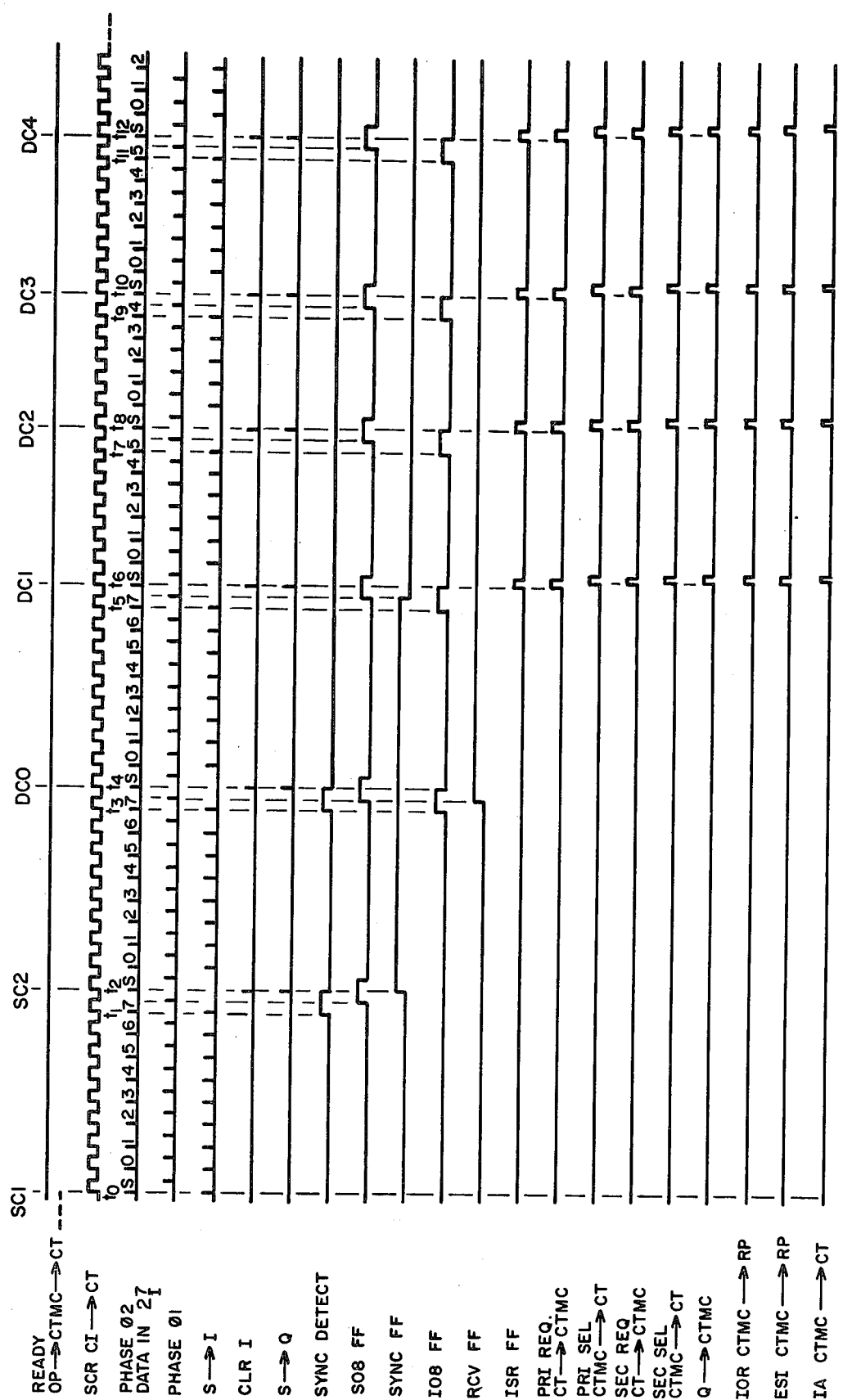
FIG. 20 is a timing diagram of a basic receive or input sequence utilized by the apparatus of FIG. 19, in a multi-level configuration.

With particular reference to FIG. 17, comprised of FIGS. 17a, 17b, 17c, 17d and FIG. 18 there are illustrated the logic diagrams of I-Register 17-1, S-Register 17-2 and Q-Register 17-3 and of the DATA Character Generator 18-1 that substantially disclose the novel implementation of the present invention as incorporated in input CT 43 (23) of FIG. 1. FIG. 19 illustrates the logic diagram of Input Control 19-1 that controls the logic of FIGS. 17, 18. FIG. 20 is an illustration of the basic receive or input sequence timing diagram showing the timing relationship of the signals utilized by input CT 43, CTMC 38 and RP 36 to effect the transfer of the DATA Characters DC 0, DC 1 as received from CI 44, DS 42 and CLS 14 via output CT 21. Note: As discussed above, CTM 20 input CT 23 is similar to CTM 40 input CT 43, and, accordingly, FIG. 1, 2 nomenclature as used above with respect to the output sequence shall be utilized in the following discussion of the input sequence. That is, DATA Characters transmitted by output CT 21 via CLS 14 shall be received by input CT 43; however, using FIG. 2 as an exemplary embodiment of a portion of a typical CTM, input CT 23 of FIG. 2 is understood to be interchangeable with input CT 43.

As stated above, CTMC 38, like CTMC 18, functions as a multiplexer to couple RP 36 to one of, e.g., 16 CTM's. As such, CTMC 38 operates at a relatively high clock rate, e.g., 1 MHZ, compatible with a nanosecond (ns) memory cycle of RP 36 while the 16 CTM's operate at a relatively low clock rate of, e.g., 50 MHZ, determined by the associated Data Set. Accordingly, RP 36 can multiplex input data through the associated 16 CTM's at its MHZ clock rate while simultaneously receiving a continuous bit-parallel stream of DATA Characters on each of the 64 Data Sets at a 50 KHZ clock rate.

To describe the operation of input CT 43 (23), it will be assumed that the communications subsystem of FIG. 1 is ready to operate, CTM 40 having received a Look-For-Sync (LFS) EFW and an EF signal from the receiving RP 36. The LFS EFW—see FIG. 7—3-out-of-7 code signal portion at lines 12-5, 12-6, 12-7 and the EF signal at line 12-8 (of FIG. 12) couple a —→Lo→LFS signal to line 12-78 which LFS signal along with the $2^2$ LFS EFW signal portion at line 19-3 Clears RCV FF (of FIG. 19). This puts the input CT 43 (23) into the Look-For-Sync mode ready to receive the next message block from CI 44 (24) that is preceded by two SYNC Characters—see FIG. 6. Note: The LFS EFW is programmable from the receiving RP 36 to the input CT 43 (23) and functions to inhibit or stop an existing input sequence and to initialize the input CT 43 (23) for receipt of the next message block. CT 43 (23) is now ready to receive the novel multi-level DATA Characters DC of FIG. 21a in a character serial, character bit-serial manner. These multi-level DATA Characters are in Q-Register 17-3 converted to the fixed-level DATA Characters of FIG. 21a having the Short bit $2^S$, which Short bit $2^S$ precedes the lowest ordered bit $2^0$, deleted or stripped off and 0 bits added in the higher-ordered bit positions following the highest-ordered data bit $2^5$ or $2^4$ of the multi-level DATA Character. These multi-level DATA Characters are received in a character serial, character-bit serial manner at stage $2_I{}^7$ of I-Register 17-1, have a Marker bit $2^M$ added preceding the Short bit $2^S$ in the manner of FIG. 21b and are then successively shifted right-wise through I-Register 17-1 and S-Register 17-2 to be transmitted, less the Short bit $2^S$ and the Marker bit $2^M$, from the stages of S-Register 17-2 into the like-ordered stages of Q-Register 17-3 in the fixed-level, character serial, character bit-parallel manner of FIG. 21c. In Q-Register 17-3 the higher-ordered stages $2_Q{}^7$, $2_Q{}^6$ or $2_Q{}^7$, $2_Q{}^6$, $2_Q{}^5$ following the highest-ordered stage $2_Q{}^5$ or $2_Q{}^4$ holding the data bit $2^5$ or $2^4$ of the 6 Level or 5 Level multi-level DATA Characters are forced Set forming the corresponding fixed-level DATA Character which is then transmitted to CTMC 38 in the character serial, character bit-parallel manner of FIG. 21c.

Figures 21A, 21B, 21C:
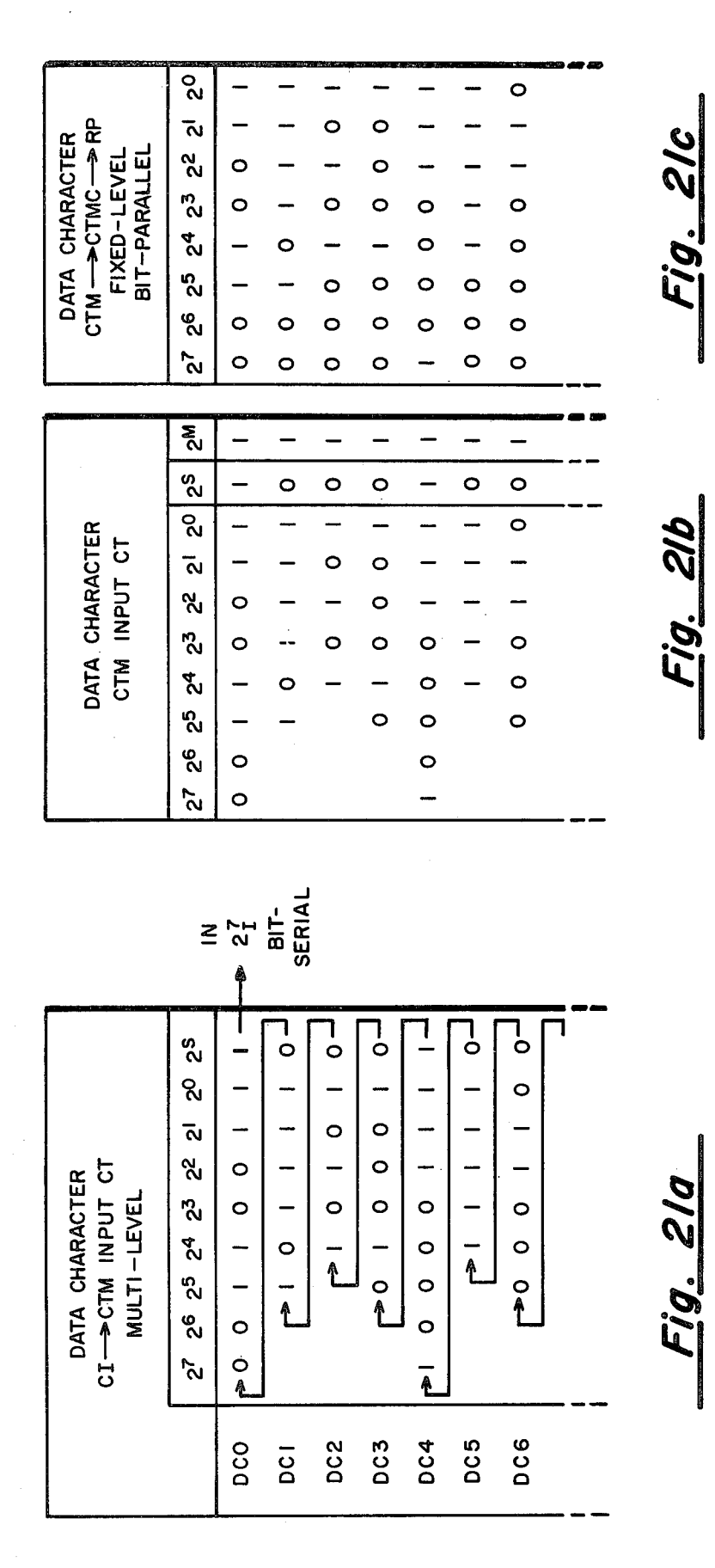

In the prior art operation of an input CT, the fixed-level DATA Character format of FIG. 3 was bit-serially loaded into stage $2_I{}^7$ while a Market bit $2^M$ was loaded into stage $2_I{}^6$ of the I-Register. This fixed-level format of FIG. 3 was then shifted through the Staticizer of the I-Register, S-Register until the lowest-ordered bit $2^0$ of the DATA Character was shifted into the lowest-ordered stage $2_S{}^0$ of the S-Register. An S-Register to Q-Register (S→Q) signal was generated to transfer the DATA Character from the S-Register into the Q-Register after which a Q-Register to CTMC (Q→CTMC) signal transferred the DATA Character from the Q-Register to the receiving processor in the character serial, character bit-parallel manner of FIG. 21c. The Staticization process was then repeated upon the next DATA Character. However, in using the multi-level DATA Character format of the present invention, a plurality of 0 bits must be loaded or forced into the higher-ordered bit positions of the Q-Register following the highest-ordered data bit $2^5$ or $2^4$ of the multi-level DATA Character. This multi-level to fixed-level conversion process, as performed in Q-Register 17-3 under control of DATA Character Generator 18-1, is illustrated in FIGS. 21a, 21b and 21c in which the 0 bits have been loaded in:

stages $2_Q^7$, $2_Q^6$, $2_Q^5$ of Q-Register 17-3 if the input data lower-ordered bits $2^4$–$2^0$ contain an odd number of 1 bits and the Short bit $2^S$ is a 0 bit—see DC 2 of FIG. 21a;

stages $2_Q^7$, $2_Q^6$ of Q-Register 17-3 if the input data lower-ordered bits $2^4$–$2^0$ contain an even number of 1 bits and the Short bit $2^S$ is a 0 bit—see DC 1 of FIG. 21a;

no stages of Q-Register 17-3 if no one of the above two conditions exist, i.e., if the Short bit $2^S$ is a 1 bit—see DC 0 of FIG. 21a.

In the system of FIG. 1, the bit-serial data stream that is received by input CT 43 from CI 44 via DS 42 and CLS 14 is in an inverted form, i.e., a 1 bit→Lo=4 a 0 bit→Hi→4 as compared to the bit-serial data stream received from CLS 14 in which a 1 bit→Hi→4 a 0 bit→Lo→4.

Thus, the input data are treated by input CT 43 in such inverted form such that when the stages and IO8 FF AND SO8 FF of FIG. 17 are Set they are considered to store a 0 bit while, conversely, if they are Cleared they are considered to store a 1 bit. As an example of this treatment of the input data stream, if a 0 bit→Hi is coupled to line 17-4 (at stage $2_I^7$ of I-Register 17-1 of FIG. 17) while concurrently a Lo phase $\phi 2$ signal is coupled to line 19-8, the Lo signal through Inverter I1307 Sets stage $2_I^7$ to store a 0 bit. Conversely, if a 1 bit→Lo had instead been coupled to line 17-4, the Lo signal would have Cleared stage $2_I^7$ to store a 1 bit. Additionally, when a Marker bit $2^M$ is loaded into stage $2_I^6$, $2_I^4$ or $2_I^3$ for an 8 Level, 6 Level or 5 Level multi-level character, such stage is Set to store a 0 bit. When such 0 bit has been shifted into IO8 FF to indicate that the multi-level character has been fully shifted to the right in S-Register 17-2 the Short bit $2^S$ signal from the Set output of stage $2_S^S$ is, via line 17-10, utilized by Generator 18-1 to generate the necessary signals to convert the multi-level character in S-Register 17-2 to the corresponding fixed-level character in Q-Register 17-3—see Table C. However, even though the input data are manipulated in their inverted or complemented form in I-Register 17-1, S-Register 17-2 and Q-Register 17-3 (to be transmitted bit-parallel in their true form by NAND gate amplifiers at the output of Q-Register 17-3) the input data, in discussing the operation of FIG. 17, shall be considered in their true form to maintain consistency in the bit conformation of the multi-level characters. As an example of this, the Clearing stages $2_I^2$–$2_I^0$, $2_I^S$, IO8 FF via line 19-9 actually loads such states with 1 bits (Clear→1) while the Setting of stage $2_I^3$ with a Marker bit $2^M$ via line 18-26 actually loads such stage with a 0 bit (Set→0); however, where possible, the terms to Set or to Clear shall be used rather than to load a 0 bit or to load a 1 bit.

Figure 18:
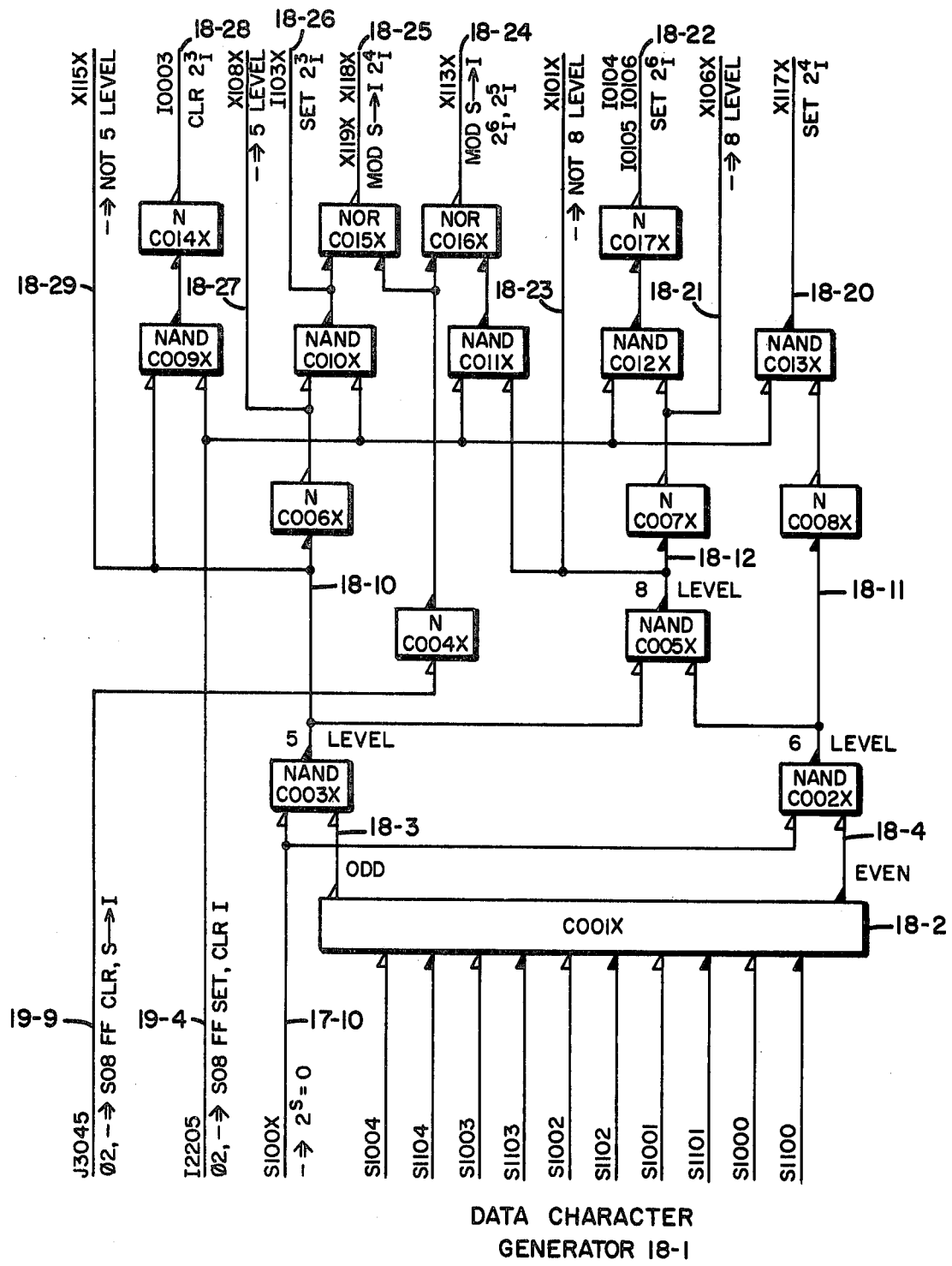
FIG. 18 is a logic diagram of the novel DATA Character Generator of the present invention.

With particular reference to FIG. 18 there is presented a logic block diagram of the DATA Character Generator 18-1 of the present invention. Generator 18-1 performs the function of sampling bits $2^4$–$2^0$, $2^S$ of the preceding multi-level input DATA Character as loaded in the respective stages $2_S^4$–$2_S^0$, $2_S^S$ of S-Register 17-2 of input CT 43 from output CT 21 to determine:

if the input data lower-ordered bits $2^4$–$2^0$ contain an odd number of 1 bits and if the Short bit $2^S$ is a 0 bit then to load the Marker ($2^M$) 1 bit into stage $2_I^3$ of I-Register 17-1 immediately preceding the Short bit $2^S$ of the following multi-level input DATA Character when the Short bit is in stage $2_I^4$ of I-Register 17-1 and to load 0 bits in stages $2_Q^7$, $2_Q^6$, $2_Q^5$ of Q-Register 17-3;

if the input data lower-ordered bits $2^4$–$2^0$ contain an even number of 1 bits and if the Short bit $2^S$ is a 0 bit then to load the Marker 1 bit into stage $2_I^4$ of I-Register 17-1 immediately preceding the Short bit $2^S$ of the following multi-level input DATA Character when the Short bit is in stage $2_I^5$ of I-Register 17-1 and to load 0 bits in stages $2_Q^7$, $2_Q^6$ of Q-Register 17-3;

if neither of the above two conditions exist, i.e., if the Short bit $2^S$ is a 1 bit, then to load the Marker 1 bit into stage $2_I^6$ of I-Register 17-1 immediately preceding the Short bit $2^S$ of the following multi-level input DATA Character when the Short bit is in stage $2_I^7$ of I-Register 17-1

TABLE C

| | Preceding Multi-Level Character | | | Following Multi-Level Character | | |
|---|---|---|---|---|---|---|
| | On Clr I Clear Stages | On S → Q Clear Stages | On S → Q Transfer Bits of Stages $2_S^N \to 2_Q^N$ | When Short Bit $2^S$ is Shifted Into Stage | On Clr I Marker Bit 2M is Loaded Into Stage | On Clr I Shift Bits of Stages $2_S^N \to 2_I^{N-1}$ |
| 5 LEVEL | —(1) | $2_Q^7, 2_Q^6, 2_Q^5$ | —(2) | $2_I^4$ | $2_I^3$ | $2_S^7, 2_S^6, 2_S^5$ |
| 6 LEVEL | $2_I^3$ (1) | $2_Q^7, 2_Q^6$ | $2_S^5$ (2) | $2_I^5$ | $2_I^4$ | $2_S^7, 2_S^6$ |
| 8 LEVEL | $2_I^5, 2_I^4, 2_I^3$ (1) | — | $2_S^7, 2_S^6, 2_S^5$ (2) | $2_I^7$ | $2_I^6$ | — |

(1) ON CLR I, STAGES $2_I^2$–$2_I^0$, $2_I^S$, I03 FF ARE ALWAYS CLEARED INDEPENDENT OF LEVEL OF PRECEDING MULTI-LEVEL, CHARACTER LOADED IN S-REG.
(2) ON S → Q, BITS OF STAGES $2_S^4$–$2_S^0$ ALWAYS LOADED INTO STAGES $2_Q^4$–$2_Q^0$ INDEPENDENT OF LEVEL OF PRECEDING MULTI-LEVEL CHARACTER LOADED IN S-REG.

This above operation of Generator 18-1 of FIG. 18 and of the I-Register 17-1, S-Register 17-2 and Q-Register 17-3 of FIG. 17 is tabulated in Table C.

Referring now to FIGS. 17 and 19 the operation of Generator 18-1 of FIG. 18 for the determination of whether the DATA Character is of a 5 Level, 6 Level or 8 Level will be described by using the DATA Character byte format of FIGS. 21a, 21b, 21c. Firstly, assume that a DATA Character has been bit-serially entered into stage $2_I^7$ of I-Register 17-1, shifted through the stages of I-Register 17-1, S-Register 17-2, until its ordered bits are loaded into the respective like-ordered stages of S-Register 17-2. The Clear outputs of stages $2_S{}^4$–$2_S{}^0$ of S-Register 17-2 via the corresponding output lines couple the Complement of bits $2^4$–$2^0$ to ODD-/EVEN Generator 18-2 while the Set outputs of $2_S{}^4$–$2_S{}^0$ of S-Register 17-2 via the corresponding output lines couple the True of bits $2^4$–$2^0$ to ODD/EVEN Generator 18-2. Additionally, the Set output of stage $2_S{}^S$ of S-Register 17-2 via the corresponding output line 17-10 couples the True of the Short bit $2^S$ to a 5 Level NAND C003X and to a 6 Level NAND C002X. Further, for the proper timing of the operation of the Generator 18-1, an S→I signal on line 19-19 from AND J3045 (of FIG. 19) is coupled to NOR C015X and NOR C016X via Inverter C004X while a CLR I signal on line 19-4 from AND I2205 (of FIG. 19) is coupled in parallel to NAND C009X, NAND C010X, NAND C011X, NAND C012X and NAND C013X. With the ODD output of Generator 18-2 coupled to 5 Level NAND C003X via line 18-3 and the EVEN output of Generator 18-2 coupled to 6 Level NAND C002X via line 18-4:

- if in S-Register 17-2 the lower-ordered bits $2^4$–$2^0$ contain an odd number of 1 bits and the Short bit on line 17-10 is representative of a 0 bit, 5 Level NAND C003X is enabled and couples the Hi→4 signal to line 18-10;
- if in S-Register 17-2 the lower-ordered bits $2^4$–$2^0$ contain an even number of 1 bits and the Short bit on line 17-10 is representative of a 0 bit. 6 Level NAND C002X is enabled and couples the Hi→4 signal to line 18-11;
- if both 5 Level NAND C003X and 6 Level NAND C002X are disabled and couple a Lo→4 signal to 8 Level NAND C005X because the Short bit on line 17-10 is representative of a 1 bit, 8 Level NAND C005X is enabled and a Hi→4 signal to line 18-12.

Referring back now to FIGS. 17, 18, 19 and 20 and to the previous discussion of the basic receive or input sequence and with the communications subsystem and input CT 43 (23) ready to operate, assume that a READY→+→Hi signal from CTMC 38 has been coupled to line 12-3 and thence to line 12-80 (from output CT 41 (21) of FIG. 12), that all Input Control 19-1 FF's are Cleared, and that DS 24 is transmitting a message block preceded by SYNC Characters to DS 42 via CLS 14 per FIG. 6. Input CT 43 (23) upon receiving the message block of FIG. 6 in a character serial, character bit-serial manner from output CT 21 (41) loads the first two SYNC Characters (SYNC Characters SC1 and SC2 of FIG. 20) that precede the first non-SYNC Character (the first DATA Character DC 0 of FIG. 21a) into I-Register 17-1. Such SYNC Characters function to synchronize the input CT 43 (23) with the incoming received message and are not transmitted to CTMC 38. However, the received multi-level DATA Characters of FIG. 21a are staticized in the I-Register 17-1, S-Register 17-2, converted to the fixed-level DATA Characters of FIG. 21c in the Q-Register 17-3 and transmitted to CTMC 38 in a character serial, character bit-parallel manner. An LFS EFW from the receiving CTMC 38 through its $2^2$ bit on line 19-3 of the input CT 43 (23) of FIG. 19 will terminate reception of the incoming presently received message until a new message block and its preceding SYNC Characters through the Staticizer of FIG. 17 initiates reception of the incoming newly received message. With the communications subsystem ready to operate, the following input sequence occurs.

RP 36, prior to time $t_0$, initiates the input sequence by coupling a Look For Sync EFW—see FIG. 7—and an EF signal to CT 43 via CTMC 38. The 3-out-of-7 code signal portion of the Look For Sync EFW is coupled to lines 12-5, 12-6, 12-7 and the EF signal is coupled to line 12-8 (of FIG. 12). These signals, through NAND T1200, Inverter (N) T1300 and Inverter T1600, couple a Look For Synce (LFS)→ - →Lo signal to line 12-78 (of FIG. 12). These signals, the LFS bit ($2^2$) signal on line 19-3 and the LFS signal on line 12-78, clear RCV FF, if not previously cleared, to initialize reception of a message that is to be received from CI 44 via CLS 14.

At this time, prior to time $t_0$, DS 42, via CI 44, is coupling a continuously running Serial Clock Receive (SCR) signal to line 19-14. The SCR signal at Signal Shot (SS) Y6004, generate the phase $\phi 1$ signal. The Step Clock $\phi 1$ signal on line 12-82 (of FIG. 12) and the Step Clock $\phi 2$ signal on line 12-83 (of FIG. 12), which signals are operator controlled from an external Maintenance Panel which may be connected to CTM 40, are at this time "open circuited" and float following the signal level determined by the other input signals a AND J3030, AND J3035, AND J3040 and AND J3045. With SO8 at this time Cleared, the Disable S→I signal on line 17-5 at AND J3045 (from the Clear output of SO8 FF of FIG. 17) is Lo such that the phase $\phi 1$ signal is normally being coupled to lines 19-6 and 19-7 and the phase $\phi 2$ signal is normally being coupled to lines 19-8 and 19-9.

Now at the phase $\phi 2$ signal time as at time $t_0$, the first SYNC Character 1 of the incoming message block via line 17-4 is bit-serially coupled to stage $2_I{}^7$ of I-Register 17-1 in a manner similar to that of FIG. 21a with the Short bit $2^S$ being the leading bit followed by the low to high ordered bits $2^0$–$2^7$. The incoming SYNC Character bits are entered into stage $2_I{}^7$ on a phase $\phi 2$ signal via line 19-8, shifted into the like-ordered stage $2_S{}^7$ of S-Register 17-2 on a next phase $\phi 1$ signal via line 19-6 and are then shifted right-wise through the Staticizer of I-Register 17-1, S-Register 17-2 on successive alternate phase $\phi 1$ (I→S) and phase $\phi 2$ (S→I) signals. When the bits of SYNC Character 1 are loaded into the corresponding like-ordered stages of I-Register 17-1 the pre-wired Set or Clear output lines from stages $2_I{}^7$–$2_I{}^S$ of I-Register 17-1, via the corresponding input lines of NAND R3102 (of FIG. 19), enable NAND R3102 generating a SYNC Detect→+→4→Hi signal on line 19-20 generating a SYNC Detect→ - →4→Lo signal on line 19-10 via Inverter R3302. Note: The SYNC Character bit format utilized in the illustrated embodiment is $2^7\ 2^6\ 2^5\ 2^4\ 2^3\ 2^2\ 2^1\ 2^0\ 2^S$
0 0 1 1 0 1 0 1 1 = $065_8$ and is an optional format that is back-paneled hand-wired from each stage, from either the Set or Clear output side, of I-Register 17-1 to NAND R3102.

At this phase $\phi 2$ signal time $t_0$ when the Short bit $2^S$ of SYNC Character 1 is coupled to stage $2_I{}^7$ of I-Register 17-1, IO8FF and SO8 FF are Cleared. An inspection of FIG. 17 indicates that a parallel shift of bits from stages $2_I{}^7$–$2_I{}^0$ of I-Register 17-1 into the like-ordered stages $2_S{}^7$–$2_S{}^0$ of S-Register 17-2 only requires a Lo phase $\phi 1$ signal on line 19-6. However, such inspection indicates that, along with the Lo S→I signal on line 19-9 from NAND J3045 that achieves a parallel shift of the bits from stages $2_S{}^4$–$2_S{}^S$ to the next lower ordered stages $2_I{}^3$–$2_I{}^0$, $2_I{}^S$, IO8 FF, Generator 18-1 must couple a Lo MOD S→I $2^6$, $2^5$ signal to line 18-24 and a Lo MOD S→I $2^4$ signal to line 18-25 to achieve a parallel shift of the bits from stages $2_S{}^6$, $2_S{}^5$, $2_S{}^4$ to the next lower ordered stages $2_I{}^5$, $2_I{}^4$, $2_I{}^3$. This is accomplished by Generator 18-1, for with SO8 FF Clear and coupling a Lo signal via line 17-5 to NAND J3045 and thence via line 19-9 a Lo signal to C004X of FIG. 18, both NOR C015X and NOR C016X couple their respective Lo signal to line 18-25 and thence to NAND X118X and NAND X114X and of both the Set and Clear inputs of stage $2_I{}^6$. Thus, with SO8 FF Clear, upon each phase $\phi1$ signal the bits in I-Register 17-1 are transferred bit-parallel to the like-ordered stages of S-Register 17-2 and upon each phase $\phi2$ signal the bits in S-Register 17-1 are shifted bit-parallel to the next-lower-ordered stages of I-Register 17-1. This same I→S→I, etc., operation applies to the reception and shifting of all multi-level characters until the Short bit $2^S$ has been shifted into stage $2_S{}^S$, i.e. SO8 FF is Set only during that time that the multi-level character is fully loaded in and shifted into the lowest ordered stages of S-Register 17-2.

After the Short bit $2^S$ and the $2^7$ bit of SYNC Character 1 have been shifted into stage $2_I{}^S$ and stage $2_I{}^7$, respectively, on a phase $\phi2$ signal as at time $t_1$, NAND R3102 generates a SYNC Detect signal, as discussed above, and couples a Lo SYNC Detect signal to line 19-10 via Inverter R3302. The Lo SYNC Detect signal on line 19-10, the Lo SYNC FF CLR signal on line 19-11 and the Lo RCV FF CLR signal on line 19-12 at NAND I1500 via NOR I1501 at the next phase $\phi1$ signal (next after the phase $\phi2$ signal that loaded the Short bit $2^S$ of SYNC Character 1 into stage $2_I{}^8$) Sets SO8 FF. The Setting of SO8 FF couples, via line 17-6 a Lo signal to the Set input of SYNC FF and to AND I2205 and AND I2305. Because IO8 FF is still Cleared, its Set output line 17-7 couples a Hi signal to the Set input of RCV FF. RCV FF remains Cleared enabling the Setting of SYNC FF via line 17-13 and line 17-23.

On the next phase $\phi2$ signal (at time $t_2$ with SO8 FF Set), AND I2205 and AND I2305 are enabled coupling a Lo CLR I signal to line 19-4 Clearing stages $2_I{}^2$-$2_I{}^0$, $2_I{}^S$, IO8 FF and couplig a Lo S→Q signal to line 19-15, respectively. This Lo S→Q signal on line 19-15 transfers the bits $2^4$-$2^0$ of SYNC Character 1 from the like-ordered stages of S-Register 17-2 into the like-ordered stages of Q-Register 17-3. At the same time, on the same phase $\phi2$ signal, the Hi signal on line 17-5, from the Clear output of SO8 FF, disables AND J3045, and, accordingly, it couples a Hi S→I signal to line 21-9 that disables the S→I shift. Additionally, with RCV FF Clear (via line 19-13) and SO8 FF SET (via line 17-6) SYNC FF is now Set. Further, with the Short bit $2^S$ of SYNC Character 2 now loaded into stage $2_I{}^7$, the SYNC Detect signal from NAND R3102 goes Lo coupling a Hi signal to line 19-10 via Inverter R3302 disabling NAND I1500.

The Lo CLR I signal via line 19-4, the Hi Short bit signal via line 17-10 from the Set output of stage $2_S{}^S$ and the Hi S→I signal via line 19-9 set up Generator 18-1 of FIG. 18 at this phase $\phi2$ signal time $t_2$. As SYNC Character 1 is interpreted as an 8 Level Character, per Table C a Marker bit $2^M$ is to be loaded (SET) into stage $2_I{}^6$ (when as at this time the Short bit $2^S$ of the following SYNC Character 2 is loaded into stage $2_I{}^7$), stages $2_I{}^5$--$2_I{}^0$, $2_I{}^S$, IO8 FF of I-Register 17-1 are to be Cleared (CLR) and the contents of stages $2_S{}^7$-$2_S{}^0$ of S-Register 17-2 are to be Transferred (TRN) into the like-ordered stages $2_Q{}^7$-$2_Q{}^0$ of Q-Register 17-3.

At this phase $\phi2$ signal time $t_2$ with the Short bit $2^S$ of the following SYNC Character 2 in stage $2_I{}^7$ and with the following input signals coupled to the noted input lines to Generator 18-1:

Lo CLR I signal on line 19-4;
Hi Short bit signal on line 17-10;
Hi Disables S→I signal on line 19-9;

the following signals are then generated by Generator 18-1 and are coupled to the noted stages of the registers of FIG. 17 via the noted lines:

SET $2_I{}^6$ (Marker bit) via line 18-22 (on CLR I);
CLR $2_I{}^5$, $2_I{}^4$ via line 18-22 (on CLR I);
CLR $2_I{}^3$ via line 18-28 (on CLR I);
TRN $2_S{}^7 \to 2_Q{}^7$, $2_S{}^6 \to 2_Q{}^6$ via line 18-21 (on S→Q);
TRN $2_S{}^5 \to 2_Q{}^5$ via line 18-29 (on S→Q).

It is to be noted here that for all multi-level characters the following signals are generated by Input Control 19-1 and are coupled to the noted states of the registers of FIG. 17 via the noted lines:

CLR $2_I{}^2$-$2_I{}^0$, $2_I{}^S$, IO8 FF via line 19-4 (on CLR I);
TRN $2_S{}^4$-$2_S{}^0 \to 2_Q{}^4$-$2_Q{}^0$ via line 19-15 (on S→Q).

Because RP 36 has not as yet initiated a reception of the fixed-level character held in Q-Register 17-3 by a Q→CTMC signal, the bit-parallel transfer of the character held in Q-Register 17-3 to CTMC 38 is disabled until DATA Character DC 0 is transferred into Q-Register 17-3.

The operation as at time $t_0$ is now repated at time $t_2$ such that SYNC Character 2 is shifted right-wise through the Staticizer of I-Register 17-1, S-Register 17-2 on successively alternate phase $\phi1$ (I→S) and phase $\phi2$ (S→I) signals until its Marker bit $2^M$ is shifted into IO8 FF at time $t_3$.

On the next phase $\phi1$ signal (after Setting SYNC FF, Clearing stages $2_I{}^5$-$2_I{}^0$, $2_I{}^S$, IO8 FF, Setting stage $2_I{}^6$ with a Marker bit $2^M$ and Clearing stage $2_I{}^7$ with the Short bit $2^S$ of SYNC Character 2 on the previous phase $\phi2$ signal at time $t_2$) SO8 FF is Cleared by the Lo signal via line 17-8 from the Clear output of IO8 FF and the Lo signal from the disabled NAND I1500. The Clearing of SO8 FF, via line 17-8, again enables AND J3045 coupling a Lo S→I signal to line 19-9 (on the next phase $\phi2$ signal). The SYNC FF will now remain Set until both IO8 FF and SO8 FF are Set by the Marker bit $2^M$ of DATA Character DC 0 having been shifted through the I-Register 17-1 ito IO8 FF to Set IO8 FF and via line 17-7 to Clear the SYNC FF.

After the Marker bit $2^M$, the Short bit $2^S$ and the $2^7$ bit of SYNC Character 2 have been shifted into IO8 FF, stage $2_I{}^S$ and stage $2_I{}^7$ respectively, on a phase $\phi2$ signal as at time $t_3$, NAND R3102 generates a SYNC Detect signal, as discussed above, and couples a Lo SYNC Detect signal to line 19-10 via Inverter R3302. With the SYNC FF now Set, the following signals are coupled to the Set input of IO8 FF Setting IO8 FF.

Lo Enable Set IO8 FF signal via line 19-16 and NOR R2100;
Lo Set output of stage $2_S{}^S$ via line 17-12;
Lo S→I signal via line 19-9 and AND J3045.

The next phase $\phi1$ signal (next after the phase $\phi2$ signal at time $t_3$ that loaded the Short bit $2^2$ of SYNC Character 1 into stage $2_I{}^S$) the Hi signal from the Clear output of IO8 FF via line 17-8 and NOR I1501, Set SO8 FF. With a Lo Sync Detect signal via line 19-21 and a Lo IO8 FF Set signal via line 17-7 being concurrently coupled to the Set input of RCV FF, RCV FF is now a Set. The Setting of SO8 FF coules, via line 17-6, a Lo signal to the Set input of SYNC FF and to AND I2205 and AND I2305. On the next phase $\phi2$ signal at time $t_4$ (with SYNC FF Set) AND I2205 and AND I2305 are enabled coupling a Lo CLR I signal to line 19-4 Clearing stages $2_I^2$–$2_I^0$, $2_I^S$, IO8 FF and a Lo S→Q signal to line 19-15, respectively. This Lo S→Q signal on line 19-15 transfers the bits $2^4$–$2^0$ of SYNC Character 2 from the like-ordered stages of S-Register 17-2 to the like-ordered stages of Q-Register 17-3. At the same time, on the same phase $\phi 2$ signal, the Hi signal on line 17-5, from the Clear output of SO8 FF, disables AND J3045, and, accordingly, it couples a Hi S→I signal to line 19-9 that disables the S→I shift. Additionally, with the Short bit $2^S$ of DATA Character DC 0 being loaded into stage $2_I^7$, NAND R3102 is disabled coupling a Hi SYNC Detect signal to line 19-10 via Inverter R3302 as previously discussed.

The Lo CLR I signal via line 19-4, the Hi Short bit signal via line 17-10 from the Set ouput of stage $2_S^S$ of S-Register 17-2 and the Hi S→I signal via line 19-9 set up Generator 18-1 of FIG. 18 at this phase $\phi 2$ signal time $t_4$. As SYNC Character 2 is interpreted as an 8 Level Character, per Table C a Marker bit is to be loaded (SET) into stage $2_I^6$ (when as at this time the Short bit $2^S$ of the following DATA Character DC 0 is loaded into stage $2_I^7$), stages $2_I^5$–$2_I^0$, $2_I^S$, IO8 FF of I-Register 17-1 are to be Cleared (CLR) and the contents of stages $2_S^7$–$2_S^0$ of S-Register 17-2 are to be Transferred (TRN) into the like-ordered stages $2_Q^7$–$2_Q^0$ of Q-Register 17-3.

At this phase $\phi 2$ signal time $t_4$ with the Short bit $2^S$ of the following DATA Character DC 0 in stage $2_I^7$ and the following input signals coupled to the noted input lines to Generator 20-1:

Lo CLR I signal on line 19-4;
Hi Short bit signal on line 17-10;
Hi Disable S→I signal on line 19-9; the following signals are then generated by Generator 18-1 and are coupled to the noted stages of the registers of FIG. 17 via the noted lines:
SET $2_I^6$ (Marker bit) via line 18-22 (on CLR I);
CLR $2_I^5$, $2_I^4$ via line 18-22 (on CLR I);
CLR $2_I^3$ via line 18-28 (on CLR I);
TRN $2_S^7$→$2_Q^7$, $2_S^6$→$2_Q^6$ via line 18-21 (on S→Q);
TRN $2_S^5$→$2_Q^5$ via line 18-29 (on S→Q).

It is to be noted here that for all multi-level characters the following signals are generated by Input Control 19-1 and are coupled to the noted stages of the registers of FIG. 17 via the noted lines:

CLR $2_I^2$–$2_I^0$, $2_I^S$, IO8 FF via line 19-4 (on CLR I);

TRN $2_S^4$–$2_S^0$→$2_Q^4$–$2_Q^0$ via line 19-15 (on S→Q).

The operation at time $t_4$ as at time $t_0$ is now repeated such that DATA Character DC 0 is shifted right-wise through the Staticizer of I-Register 17-1, S-Register 17-2 on successively alternate phase $\phi 1$ (I→S) at phase $\phi 2$ (S→I) signals. On the next phase $\phi 1$ signal after $t_4$, SO8 FF is again Cleared via the Lo Clear output of IO8 FF via line 17-8 as explained above.

At time $t_5$ the Marker bit $2^M$, the short bit $2^S$ and the $2^7$ bit the DATA Character DC 0 have been shifted into IO8 FF, stage $2_I^S$ and stage $2_I^7$, respectively, on a phase $\phi 2$ (S→I) signal. Concurrently, IO8 FF is now Set by the Marker bit $2^M$ of DATA Character DC 0 through the Lo signal from the Set output of stage $2_S^S$ via line 17-12 and the Lo Enable Set IO8 FF signal on line 19-16. Additionally, after RCV FF has once been Set, the Hi signal from the Clear output of RCV FF via line 19-13, line 19-22, NOR R2100 and line 19-16 continues to couple a Lo Enable Set IO8 FF signal to the Set input of IO8 FF. This enables the contents of stage $2_S^S$ via line 17-12, at a Lo S→I signal via line 19-9, to Set IO8 FF whenever a Marker (1) bit $2^M$ is shifted therein. Because of this, NAND R3102, and its SYNC Detect signal, no longer has any effect upon the operation of the Staticizer of FIG. 17.

On the next phase $\phi 1$ signal (after the Setting of IO8 FF at time $t_5$), SO8 FF is now Set through the Hi Marker (1) bit signal from the Clear output of IO8 FF via line 17-8 and NOR I1501. Concurrently, SYNC FF is Cleared through the Lo signal from the Set output of IO8 FF via line 17-7 and the Lo SYNC Detect signal via line 19-20 enabling NAMD R1200 to couple a Hi signal to Inverter R1300 and thence a Lo signal to the Clear input of SYNC FF.

On the next phase $\phi 2$ signal (after the Clearing of SYNC FF and the Setting of SO8 FF) at time $t_6$, AND I2205 and AND I2305 are enabled via the Lo signal on line 17-6 from the Set output of SO8 FF. AND I2205 couples a Lo CLR I signal to line 19-4 Clearing stages $2_I^2$–$2_I^0$, $2_I^S$, IO8 FF while AND I2305 couples a Lo S→Q signal to line 19-15. This Lo S→Q signal on line 19-15 transfer the bits $2^4$–$2^0$ of DATA Character DC 0 from the like-ordered stages of S-Register 17-2 into the like-ordered stages of Q-Register 17-3. At the same time, the Hi signal on line 17-5 from the Clear output of SO8 FF disables AND J3045, and, accordingly, it couples a Hi S→I signal on line 19-9 that disables the S→I shift.

The Lo CLR I signal via line 19-4, the Hi Short bit signal via line 17-10 from the Set output of stage $2_S^S$ of S-Register 17-2 and the Hi S→I signal via line 19-9 set up Generator 18-1 of FIG. 18 at this phase $\phi 2$ signal time $t_6$. As DATA Character DC 0 is interpreted as an 8 Level Character, per Table C a Marker bit is to be loaded (SET) into stage $2_I^6$ (when as at this time the Short bit $2^S$ of the following DATA Character DC 1 is loaded into stage $2_I^7$), stages $2_I^5$–$2_I^0$, $2_I^S$, IO8 FF of I-Register 17-1 are to be Cleared (CLR) and the contents of stages $2_S^7$–$2_S^0$ of S-Register 17-2 are to be Transferred (TRN) into the like-ordered stages $2_Q^7$–$2_Q^0$ of Q-Register 17-3.

At this phase $\phi 2$ signal time $t_6$ with the Short bit $2^S$ of the following DATA Character DC 1 in stage $2_I^7$ and the following input signals coupled to the noted input lines to Generator 18-1:

Lo CLR I signal on line 19-4;
Hi Short bit signal on line 17-10;
Hi Disable S→I signal on line 19-9; the following signal are then generated by Generator 18-1 and are coupled to the noted stages of the registers of FIG. 17 via the noted lines:
SET $2_I^6$ (Marker bit) via line 18-22 (on CLR I);
CLR $2_I^5$, $2_I^4$ via line 18-22 (on CLR I);
CLR $2_I^3$ via line 18-28 (on CLR I);
TRN $2_S^7$→$2_Q^7$, $2_S^6$→$2_Q^6$ via line 18-21 (on S→Q);
TRN $2_S^5$→$2_Q^5$ via line 18-29 (on S→Q).

It is to be noted here that for all multi-level characters the following signals are generated by Input Control 19-1 and are coupled to the noted stages of the registers of FIG. 17 via the noted lines:

CLR $2_I^2$–$2_I^0$, $2_I^S$, IO8 FF via line 19-4 (on CLR I);
TRN $2_S^4$–$2_S^0$→$2_Q^4$–$2_Q^0$ via line 19-14 (on S→Q).

The operation as the time $t_0$ is now repeated at time $t_6$ such that DATA Character DC 1 is shifted right-wise through the Staticizer of I-Register 17-1, S-Register 17-2 on successively alternate phase $\phi 1$ (I→S) and phase $\phi2$ (S→I) signals until its Marker bit $2^M$ is shifted into IO8 FF at time $t_7$.

However, while still at time $t_6$ ISR FF is not Set through the Lo signal from the Clear output of SYNC FF via line 19-24, the Lo signal from the Set output of RCV FF via line 19-25 and the Lo signal from the enabled AND I2205 via line 19-26. The Setting of ISR FF initiates the input sequence through which the reconstructed fixed-level DATA Character DC 0 in Q-Register 17-3 is transmitted to RP 36 via CTMC 38. This sequence is as follows.

The Setting of ISR FF couples a Lo ISR FF Set signal to Inverter Y4010 and NAND Y4011 from the Set output of ISR FF via line 19-27. Inverter Y4010 coupled a Lo Primary Request signal via line 19-19 to CTMC 38. CTMC 38 responds with a Lo Primary Select signal via line 19-28 which enables AND I2001 and AND Y4011. AND Y4011 now couples a Lo Secondary Request signal via line 19-27 to CTMC 38 which responds with a Lo Secondary Select signal via line 19-29 at AND I2001. After the Lo Secondary Select signal has been coupled to input CT 43 by the CTMC 38 via line 19-29, CTMC 38 couples an Input Data Request (IDR) word and an Externally Specified Index (ESI) word to RP 36. As AND I2001 is now enabled it couples a Lo Q→CTMC signal via line 19-18 to the NAND gates coupled to the Clear outputs of stages $2_Q^7$-$2_Q^0$ of Q-Register 17-3 coupled the complement of bits $2^7$-$2^0$ of DATA Character DC 0 in Q-Register 17-3 in a bit-parallel manner to RP 36 via CTMC 38. Note that as the input data stream received in a bit-serial manner on line 17-4 at stage $2_I^7$ of I-Register 17-1 from CLS 14 via DS 42 and CI 44 was in the inverted or complemented from as regards the output data stream transmitted from output CT 21, the bits $2^7$-$2^0$ of DATA Character DC 0 was transmitted to CTMC 38 and RP 36 are now in their true form.

After RP 36 receives the IDR it returns a Hi Input Acknowledge (IA) signal to CT 43 via line 19-30 which signal through Inverter R1100 and the Lo Q→CTMC signal on line 19-31 Clears ISR FF. The Clearing of ISR FF via line 19-27 removes the Lo Primary Request signal on line 19-19 and the Lo Secondary Request signal on line 19-17 which causes RP 36 to respond by removing the Lo Primary Select signal on line 19-28 and the Lo Secondary Select signal on line 19-29 via CTMC 38.

At time $t_7$ the Marker bit $2^M$, the Short bit $2^S$ and the $2^5$ bit of DATA Character DC 1 have been shifted into IO8 FF, stage $2_I^S$ and stage $2_I^5$, respectively, and the Short bit $2^S$ and the $2^0$ bit of DATA Character DC 2 have been shifted into stage $2_I^6$ and stage $2_I^7$, respectively, on a phase $\phi2$ (S→I) signal. Concurrently, IO8 FF is now Set by the Marker bit $2^M$ of DATA Character DC 1 through the Lo signal from the Set output of stage $2_S^S$ via line 17-12 and the Lo Enable Set IO8 FF signal on line 19-16.

On the next phase $\phi1$ signal (after the Setting of IO8 FF at time $t_7$), SO8 FF is now Set through the Hi Marker (1) bit signal from the Clear output of IO8 FF via line 17-8 and NOR I1501.

On the next phase $\phi2$ signal at time $t_8$, AND I2205 and AND I2305 are enabled via the Lo signal on line 17-6 from the Set output of SO8 FF. AND I2205 couples a Lo CLR I signal to line 19-4 Clearing stages $2_I^2$-$2_I^0$, $2_I^S$, IO8 FF while AND I2305 couples a Lo S→Q signal to line 19-15. This Lo S→Q signal on line 19-15 transfers the bit $2^4$-$2^0$ of DATA Character DC 1 from the like-ordered stages of S-Register 17-2 into the like-ordered stages of Q-Register 17-3. At the same time, the Hi signal on line 17-5 from the Clear output of SO8 FF disables AND J3045 and, accordingly, it couples a Hi S-I signal on line 19-9 that disables the S→I shift.

The Lo CLR I signal via line 19-4, the Lo Short (0) bit signal via line 17-10 from the Set output of stage $2_S^S$ of S-Register 17-2 and the Hi S→I signal via line 17-9 set up Generator 18-1 of FIG. 18 at this phase $\phi2$ signal time $t_8$. The DATA Character DC 1 is interpreted as a 6 Level Character, per Table C a Marker bit is to be loaded (SET) into stage $2_I^4$ (when as at this time the Short bit $2^S$ of the following DATA Character DC 2 is loaded into stage $2_I^5$), stages $2_I^3$-$2_I^0$, $2_I^S$, IO8 FF of I-Register 17-1 are to be Cleared (CLR), stages $2_Q^7$, $2_Q^6$ of Q-Register 17-3 are to be Cleared, the contents of stages $2_S^7$, $2_S^6$ of S-Register 17-2 are to be shifted down into stages $2_I^7$, $2_I^5$ of I-Register 17-1 and the contents of stages $2_S^5$-$2_S^0$ of S-Register 17-2 are to be Transferred (TRN) into the like-ordered stages $2_Q^5$-$2_Q^0$ of Q-Register 17-3.

At this phase $\phi2$ signal time $t_8$ with the Short bit $2^S$ of the following DATA Character DC 2 in stage $2_I^5$ and with the following input signals coupled to the noted input lines to Generator 18-1:

Lo CLR I signal on line 19-4;
Lo Short bit signal on line 17-10;
Hi Disables S→I signal on line 19-9;

the following signals are then generated by Generator 18-1 and are coupled to the noted stages of the registers of FIG. 17 via the noted lines:

SET $2_I^4$ (Marker bit) via line 18-20 (on CLR I);
CLR $2_I^3$ via line 18-28 (on CLR I);
CLR $2_Q^7$, $2_Q^6$ via line 18-23 (on S→Q);
TRN $2_S^5$→$2_Q^5$ via line 18-29 (on S→Q);
SHIFT $2_S^7$, $2_S^6$→$2_I^6$, $2_I^5$ via line 18-24 (on CLR I).

It is to be noted here that for all multi-level characters the following signals are generated by Input Control 19-1 and are coupled to the noted stages of the registers of FIG. 17 via the noted lines:

CLR $2_I^2$-$2_I^0$, $2_I^S$, IO8 FF via line 19-4 (on CLR I);
TRN $2_S^4$-$2_S^0$→$2_Q^4$-$2_Q^0$ via line 19-15 (on S→Q).

The operation as at time $t_0$ is now repeated at time $t_8$ such that DATA Character DC 2 is shifted right-wise through the Staticizer of I-Register 17-1, S-Register 17-2 on successively alternate phase $\phi1$ (I→S) and phase (S→I) signals until its Marker bit $2^M$ is shifted into IO8 FF at time $t_9$.

However, while still at time $t_8$ ISR FF is now Set through the Lo signal from the Clear output of SYNC FF via line 19-24, the Lo signal from the Set output of RCV FF via line 19-25 and the Lo signal from the enabled AND I2205 via line 19-26. The Setting of ISR FF initiates the input sequence through which the reconstructed fixed-level DATA Character DC 1 in Q-Register 17-3 is transmitted to RP 36 via CTMC 38. This input sequence is similar to that discussed above at time $t_6$.

At time $t_9$ the Marker bit $2^M$, the Short bit $2^S$ and the $2^4$ bit of DATA Character DC 2 have been shifted into IO8 FF, stage $2_I^S$ and stage $2_I^4$, respectively, and the Short bit $2^S$ and the $2^0$, $2^1$ bits of DATA Character DC 3 have been shifted into stage $2_I^5$ and stages $2_I^6$, $2_I^7$, respectively, on a phase $\phi2$ (S→I) signal. Concurrently, IO8 FF is now Set by the Marker bit $2^M$ of DATA Character DC 1 through the Lo signal from the Set output of stage $2_S{}^S$ via line 17-22 and the Lo Enable Set IO8 FF signal on line 19-16.

On the next phase $\phi 1$ signal (after the Setting of IO8 FF at time $t_9$), SO8 FF is now Set through the Hi Marker (1) bit signal from the Clear output of IO8 FF via line 17-8 and NOR I1501.

On the next phase $\phi 2$ signal at time $t_{10}$, AND I2205 and AND I2305 are enabled via the Lo signal on line 17-6 from the Set output of SO8 FF. AND I2205 couples a Lo CLR I signal to line 19-4 Clearing stages $2_I{}^2-2_I{}^0$, $2_I{}^S$, IO8 FF while AND I2305 couples a Lo S→Q signal to line 19-15. This Lo S→Q signal on line 19-15 transfers the bits $2^4-2^0$ of DATA Character DC 2 from the like-ordered stages of S-Register 17-2 into the like-ordered stages of Q-Register 17-3. At the same time, the Hi signal on line 17-5 from the Clear output of SO8 FF disables AND J3045, and, accordingly, it couples a Hi S→I signal on line 19-9 that disables the S→I shift.

The Lo CLR I signal via line 19-4, the Lo Short (0) bit signal via line 17-10 from the Set output of stage $2_S{}^S$ of S-Register 17-2 and the Hi S→I signal via line 19-9 set up Generator 18-1 of FIG. 18 at this phase $\phi 2$ signal time $t_{10}$. As DATA Character DC 2 is interpreted as a 5 Level Character, per Table C a Marker bit is to be loaded (SET) into stage $2_I{}^3$ (when as at this time the Short bit $2^S$ of the following DATA Character DC 3 is loaded into stage $2_I{}^4$), stages $2_I{}^2-2_I{}^0$, $2_I{}^S$, IO8 FF of I-Register 17-1 are to be Cleared (CLR) stages $2_Q{}^7$, $2_Q{}^6$, $2_Q{}^5$ of Q-Register 17-3 are to be Cleared, the contents of stages $2_S{}^7$, $2_S{}^6$, $2_S{}^5$ are to be shifted down into stages $2_I{}^6$, $2_I{}^5$, $2_I{}^4$, respectively, and the contents of stages $2_S{}^4-2_S{}^0$ of S-Register 17-2 are to be Transferred (TRN) into the like-ordered stages $2_Q{}^4-2_Q{}^0$ of Q-Register 17-3.

At this phase $\phi 2$ signal time $t_{10}$ with the Short bit $2^S$ of the following DATA Character DC 3 in stage $2_I{}^4$ and the following input signals coupled to the noted input lines to Generator 18-1:

Lo CLR I signal on line 19-4;
Lo Short bit signal on line 17-10;
Hi Disable S→I signal on line 19-9;
the following signals are then generated by Generator 18-1 and are coupled to the noted stages of the registers of FIG. 17 via the noted lines:

SET $2_I{}^3$ (Marker bit) via line 18-20 (on CLR I);
CLR $2_Q{}^7$, $2_Q{}^6$ via line 18-23 (on CLR I);
CLR $2_Q{}^5$ via line 18-27 (on CLR I);
SHIFT $2_S{}^7$, $2_S{}^6 \rightarrow 2_I{}^6$, $2_I{}^5$ via line 18-24 (on S→I);
SHIFT $2_S{}^5 \rightarrow 2_I{}^4$ via line 18-25 (on S→I).

It is to be noted here that for all multi-level characters the following signals are generated by Input Control 19-1 and are coupled to the noted stages of the registers of FIG. 17 via the noted lines:

CLR $2_I{}^2-2_I{}^0$, $2_I{}^S$, IO8 FF via line 19-4 (on CLR I);
TRN $2_S{}^4-2_S{}^0 \rightarrow 2_Q{}^4-2_Q{}^0$ via line 19-15 (on S→Q).

The operation as at time $t_0$ is now repeated at time $t_{10}$ such that DATA Character DC 1 is shifted right-wise through the Staticizer of I-Register 17-1, S-Register 17-2 on successively alternate phase $\phi 1$ (I→S) and phase $\phi 2$ (S→I) signals until its Marker bit $2^M$ is shifted into IO8 FF at time $t_{11}$.

However, while still at time $t_{10}$ ISR FF is now Set through the Lo signal from the Clear output of SYNC FF via line 19-24, the Lo signal from the Set output of RCV FF via line 19-25 and the Lo signal from the enabled AND I2205 via line 19-26. The Setting of ISR FF initiates the input sequence through which the reconstructed fixed-level DATA Character DC 2 in Q-Register 17-3 is transmitted to RP 36 via CTMC 38. This input sequence is similar to that discussed above at time $t_6$.

At time $t_{11}$ the Market bit $2^M$, the Short bit $2^S$ and the $2^5$ bit of DATA Character DC 3 have been shifted into IO8 FF, stage $2_I{}^S$ and stage $2_I{}^5$, respectively, and the Short bit $2^S$ and the $2^0$ bit of DATA Character DC 4 have been shifted into stage $2_I{}^6$ and stage $2_I{}^7$, respectively, on a phase $\phi 2$ (S→I) signal. Concurrently IO8 FF is now Set by the Marker bit $2^M$ of DATA Character DC 3 through the Lo signal from the Set output of stage $2_S{}^S$ via line 17-12 and the Lo Enable Set IO8 FF signal on line 19-16.

On the next phase $\phi 1$ signal (after the Setting of IO8 FF at time $t_{11}$), SO8 FF is now Set through the Hi Marker (1) bit signal from the Clear output of IO8 FF via line 17-8 and NOR I1501.

On the next phase $\phi 2$ signal at time $t_{12}$, AND I2205 and AND I2305 are enabled via the Lo signal on line 17-6 from the Set output of SO8 FF. AND I2205 couples a Lo CLR I signal to line 19-4 Clearing stages $2_I{}^2-2_I{}^0$, $2_I{}^S$, IO8 FF while AND I2305 couples Lo S→Q signal to line 19-15. This Lo S→Q signal on line 19-15 transfers the bits $2^4-2^0$ of DATA Character DC 3 from the like-ordered stages of S-Register 17-2 into the like-ordered stages of Q-Register 17-3. At the same time, the Hi signal on line 19-5 from the Clear output of SO8 FF disables AND J3045, and, accordingly, it couples a Hi S→I signal on line 19-9 that disables the S→I shift.

The Lo CLR I signal via line 19-4, the Lo Short (0) bit signal via line 17-10 from the Set output of stage $2_S{}^S$ of S-Register 17-2 and the Hi S→I signal via line 19-9 set up Generator 18-1 of FIG. 18 at this phase $\phi 2$ signal time $t_{12}$. As DATA Character DC 3 is interpreted as a 6 Level Character, per Table C, a Marker bit is to be loaded (SET) into stage $2_I{}^4$ (when as at this time the Short bit $2^S$ of the following DATA Character DC 4 is loaded into stage $2_I{}^5$), stages $2_I{}^3-2_I{}^0$, $2_I{}^S$, IO8 FF of I-Register 17-1 are to be Cleared (CLR), stages $2_Q{}^7$, $2_Q{}^6$ of Q-Register 17-3 are to be Cleared, the contents of stages $2_S{}^7$, $2_S{}^6$ of S-Register 17-2 are to be shifted down into stages $2_I{}^6$, $2_I{}^5$ of I-Register 17-1 and the contents of stages $2_S{}^5-2_S{}^0$ of S-Register 17-2 are to be Transferred (TRN) into the like-ordered stages $2_Q{}^5-2_Q{}^0$ of Q-Register 17-3.

At this phase $\phi 2$ signal time $t_{12}$ with the Short bit $2^S$ of the following DATA Character DC 4 in stage $2_I{}^5$ and the following input signals coupled to the noted input lines to Generator 18-1:

Lo CLR I signal on line 19-4;
Lo Short bit signal on line 17-10;
Hi Disable S→I signal on line 19-9;
the following signals are then generated by Generator 18-1 and are coupled to the noted stages of the registers of FIG. 17 via the noted lines:

SET $2_I{}^4$ (Marker bit) via line 18-20 (on CLR I);
CLR $2_I{}^3$ via line 18-28 (on CLR I);
CLR $2_Q{}^7$, $2_Q{}^6$ via line 18-23 (on S→Q);
TRN $2_S{}^5 \rightarrow 2_Q{}^5$ via line 18-29 (on S→Q);
SHIFT $2_S{}^7$, $2_S{}^6 \rightarrow 2_I{}^6$, $2_I{}^5$ via line 18-24 (on CLR I).

It is to be noted here that for all multi-level characters the following signals are generated by Input Control 19-1 and are coupled to the noted stages of the registers of FIG. 17 via the noted lines:

CLR $2_I{}^2-2_I{}^0$, $2_I{}^S$, IO8 FF via line 19-4 (on CLR I);

TRN $2_S{}^4-2_S{}^0 \rightarrow 2_Q{}^4-2_Q{}^0$ via line 19-15 (on S→Q).

The operation as at time $t_0$ is now repeated at time $t_{12}$ such that DATA Character DC 4 is shifted right-wise through the Staticizer of I-Register 17-1, S-Register 17-2 on successively alternate phase $\phi1$ (I→S) and phase $\phi2$ (S→I) signals until its Marker bit $2^M$ is shifted into IO8 FF at time $t_{13}$.

However, while still at time $t_{12}$ ISR FF is now Set through the Lo signal from the Clear output of SYNC FF via line 19-24, the Lo signal from the Set output of RCV FF via line 19-25 and the Lo signal from the enabled AND I2205 via line 19-26. The Setting of ISR FF initiates the input sequence through which the reconstructed fixed-level DATA Character DC 3 in Q-Register 17-3 is transmitted to RP 36 via CTMC 38. This sequence is similar to that discussed above at time $t_6$.

What is claimed is:

1. In a data compacter in which the ordered bits in an expanded fixed-level multi-bit data character format are received by and stored in a shift register that is comprised of a plurality of ordered stages and a Short bit stage and in which a Marker bit is to be stored in a selected variable one of its higher ordered stages, a Short bit is to be stored in its Short bit stage and in which the compacted variable-level of the data bits is to be stored in the ordered stages between and bounded by said Marker bit and said Short bit, a Marker/Short bit generator comprising:

odd-even generator means responsively coupled to only a certain number of the lower ordered stages of said shift register for generator an odd output signal if the number of 1 bits in said certain number of the lower ordered stages of said shift register is an odd number, or, alternatively, generating an even output signal if the number of 1 bits in said certain number of the lower ordered stages of said shift register is an even number;

a plurality of level detector means;

said plurality of level detector means responsively coupled to the odd and the even output signals of said odd-even generator means and to only the higher ordered stages of said shift register above said certain number of the lower ordered stages of said shift register for loading a Marker bit in a selected one of the higher ordered stages of said shift register and a Short bit in said Short bit stage of said shift register for compacting the expanded fixed-level multi-bit data character format as received by said shift register into said compacted variable-level multibit data character format.

2. In a data compacter in which the ordered bits in an expanded fixed-level multi-bit data character format are received in a bit-parallel manner by and stored in a shift register that is comprised of a plurality of ordered stages and a Short bit stage and in which a Marker bit is to be stored in a selected variable one of its higher ordered stages, a Short bit is to be stored in its Short bit stage and in which the compacted variable-level of the data bits is to be stored in the ordered stages between and bounded by said Marker bit and said Short bit and from which said compacted variable-level of the data bits and the Short bit is to be transmitted in a bit-serial manner, a Marker/Short bit generator comprising:

odd-even generator means responsively coupled to only a certain number of the lower ordered stages of said shift register for generating an odd output signal if the number of 1 bits in said certain number of the lower ordered stages of said shift register is an odd number, or, alternatively, generating an even output signal if the number of 1 bits in said certain number of the lower ordered stages of said shift register is an even number;

first level detector means;

second level detector means;

third level detector means;

said first level detector means, said second level detector means and said third level detector means responsively coupled to the odd and the even output signals of said odd-even generator means and to only the higher ordered stages of said shift register above said certain number of the lower ordered stages of said shift register for loading a Marker bit in a selected variable one of the higher ordered stages of said shift register and a Short bit in said Short bit stage of said shift register for compacting the expanded fixed-level multi-bit data character as received by said shift register into said compacted variable-level multi-bit data character format.

3. In a data expander in which the order bits in a compacted variable-level multi-bit data character format are received by and stored in a shift register that is comprised of a plurality of ordered stages and a Short bit stage and in which a Marker bit is to be stored in its highest ordered stage, a Short bit is to be stored in its Short bit stage and in which the fixed-level of the expanded fixed-level of data bits is to be stored in the ordered stages between and bounded by said Marker bit and said Short bit, a data character generator comprising:

odd-even generator means responsively coupled to only a certain number of the lower ordered stages of said shift register for generating an odd output signal if the number of 1 bits in said certain number of lower ordered stages of said shift register is an odd number, or, alternatively, generating an even output signal if the number of 1 bits in said certain number of the lower ordered stages of said shift register is an even number;

a plurality of level detector means;

said plurality of level detector means responsively coupled to the odd and the even output signals of said odd-even generator means and to only said Short bit stage of said shift register for expanding the compacted variable-level multi-bit data character format as received by said shift register and into said expanded fixed-level multi-bit data character format.

4. In a data expander in which the ordered bits in a compacted variable-level multi-bit data character format are received in a bit-serial manner by and stored in a shift register that is comprised of a plurality of ordered stages and a Short bit stage and in which a Marker bit is to be stored in its highest ordered stage, a Short bit is to be stored in its Short bit stage and in which the fixed-level of the expanded fixed-level of data bits is to be stored in the ordered stages between and bounded by said Marker bit and said Short bit and from which said expanded fixed-level of the data bits and the Short bit is to be transmitted in a bit-parallel manner, a data character generator comprising:

odd-even generator means responsively coupled to only a certain number of the lower ordered stages of said shift register for generating an odd output signal if the number of 1 bits in said certain number of lower ordered stages of said shift register is an odd number, or, alternatively, generating an even output signal if the number of 1 bits in said certain number of the lower ordered stages of said shift register is an even number;
first level detector means;
second level detector means;
third level detector means;
said first level detector means, said second level detector means and said third level detector means responsively coupled to the odd and the even output signals of said odd-even generator means and to only said Short bit stage of said shift register for expanding the compacted multi-level multi-bit data character format as received by said shift register into said expanded fixed-level multi-bit data character format.

* * * * *